US012482736B2

(12) United States Patent
Verhaverbeke et al.

(10) Patent No.: US 12,482,736 B2
(45) Date of Patent: Nov. 25, 2025

(54) SEMICONDUCTOR DEVICE PACKAGES

(71) Applicant: Applied Materials, Inc., Santa Clara, CA (US)

(72) Inventors: Steven Verhaverbeke, San Francisco, CA (US); Han-Wen Chen, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 395 days.

(21) Appl. No.: 17/973,690

(22) Filed: Oct. 26, 2022

(65) Prior Publication Data

US 2023/0148220 A1 May 11, 2023

Related U.S. Application Data

(60) Provisional application No. 63/278,424, filed on Nov. 11, 2021.

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4853* (2013.01); *H01L 21/4857* (2013.01);
(Continued)

(58) Field of Classification Search
CPC ........... H01L 23/49838; H01L 21/4853; H01L 21/4857; H01L 21/486; H01L 23/3675; H01L 23/49816; H01L 23/49822; H01L 23/49833; H01L 23/49894; H01L 23/5385; H01L 23/5386; H01L 23/562; H01L 24/08; H01L 24/16; H01L 2224/08235; H01L 2224/16235; H01L 2924/1436; H01L 2924/3511; H01L 23/3128; H01L 25/0655;
(Continued)

(56) References Cited

U.S. PATENT DOCUMENTS

2005/0230841 A1 10/2005 Walk et al.
2016/0020194 A1 1/2016 Gottwald et al.
(Continued)

OTHER PUBLICATIONS

PCT International Search Report and Written Opinion dated Feb. 20, 2023, for International Application No. PCT/US2022/047799.
(Continued)

*Primary Examiner* — Evan G Clinton
(74) *Attorney, Agent, or Firm* — Patterson + Sheridan, LLP

(57) ABSTRACT

The present disclosure relates to methods and apparatus for forming a thin-form-factor semiconductor device package. In certain embodiments, a glass or silicon substrate is patterned by laser ablation to form structures for subsequent formation of interconnections therethrough. The substrate is thereafter utilized as a frame for forming a semiconductor device package, which may have one or more embedded double-sided dies therein. In certain embodiments, an insulating layer is formed over the substrate by laminating a pre-structured insulating film thereon. The insulating film may be pre-structured by laser ablation to form structures therein, followed by selective curing of sidewalls of the formed structures.

19 Claims, 41 Drawing Sheets

(51) Int. Cl.

| | |
|---|---|
| ***H01L 23/00*** | (2006.01) |
| ***H01L 23/367*** | (2006.01) |
| ***H01L 23/538*** | (2006.01) |
| ***H10B 80/00*** | (2023.01) |

(52) U.S. Cl.
CPC ........ *H01L 21/486* (2013.01); *H01L 23/3675* (2013.01); *H01L 23/49816* (2013.01); *H01L 23/49822* (2013.01); *H01L 23/49833* (2013.01); *H01L 23/49894* (2013.01); *H01L 23/5385* (2013.01); *H01L 23/5386* (2013.01); *H01L 23/562* (2013.01); *H01L 24/08* (2013.01); *H10B 80/00* (2023.02); *H01L 24/16* (2013.01); *H01L 2224/08235* (2013.01); *H01L 2224/16235* (2013.01); *H01L 2924/1436* (2013.01); *H01L 2924/3511* (2013.01)

(58) Field of Classification Search
CPC ... H01L 21/6835; H01L 23/16; H01L 21/568; H01L 25/0652; H01L 2221/68345; H01L 2225/1058; H01L 2225/1094; H01L 23/36; H01L 24/94; H01L 25/105; H01L 23/13; H01L 23/147; H01L 23/15; H01L 23/49827; H01L 23/5389; H10B 80/00
See application file for complete search history.

(56) References Cited

U.S. PATENT DOCUMENTS

| | | | | |
|---|---|---|---|---|
| 2018/0269146 | A1 | 9/2018 | Palm | |
| 2018/0352658 | A1* | 12/2018 | Yang | H01L 24/25 |
| 2018/0358298 | A1* | 12/2018 | Zhai | H01L 21/4853 |
| 2020/0091128 | A1 | 3/2020 | Elsherbini et al. | |
| 2020/0358163 | A1* | 11/2020 | See | H01L 24/96 |
| 2021/0098421 | A1 | 4/2021 | Wu et al. | |
| 2021/0257289 | A1 | 8/2021 | Chen et al. | |
| 2022/0020735 | A1* | 1/2022 | Song | H01L 24/80 |
| 2023/0063295 | A1* | 3/2023 | Yang | H01L 23/36 |

OTHER PUBLICATIONS

Search Report in related application EP 22893462 dated Oct. 6, 2025.

* cited by examiner

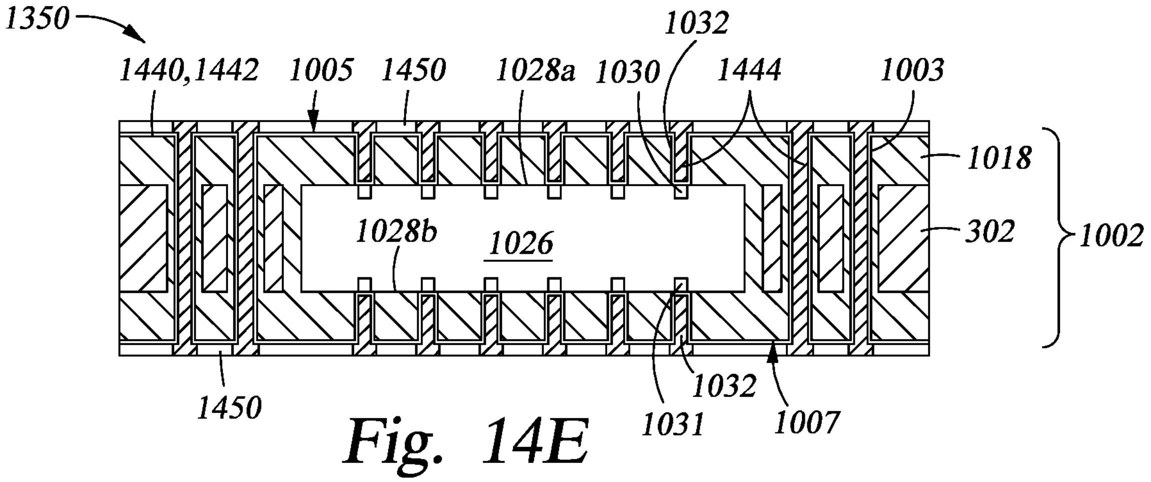
*Fig. 14E*
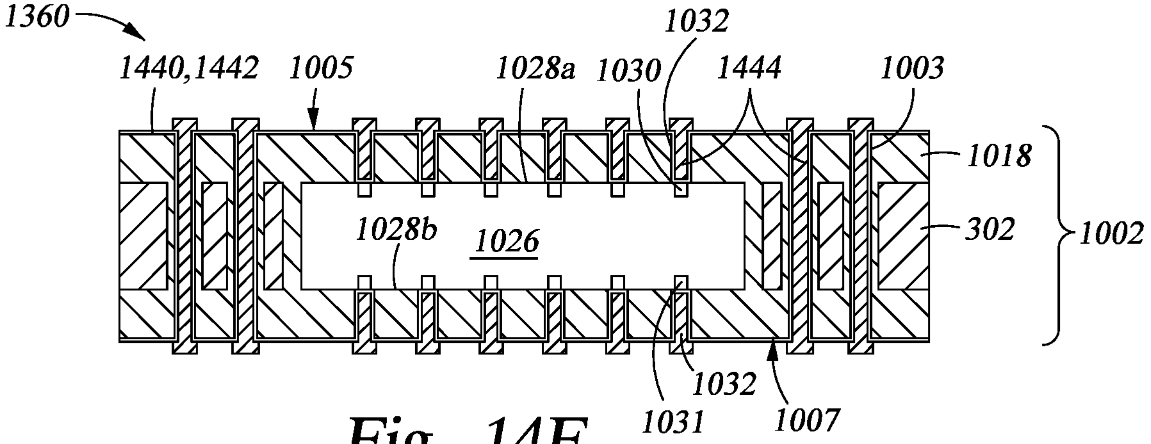
*Fig. 14F*
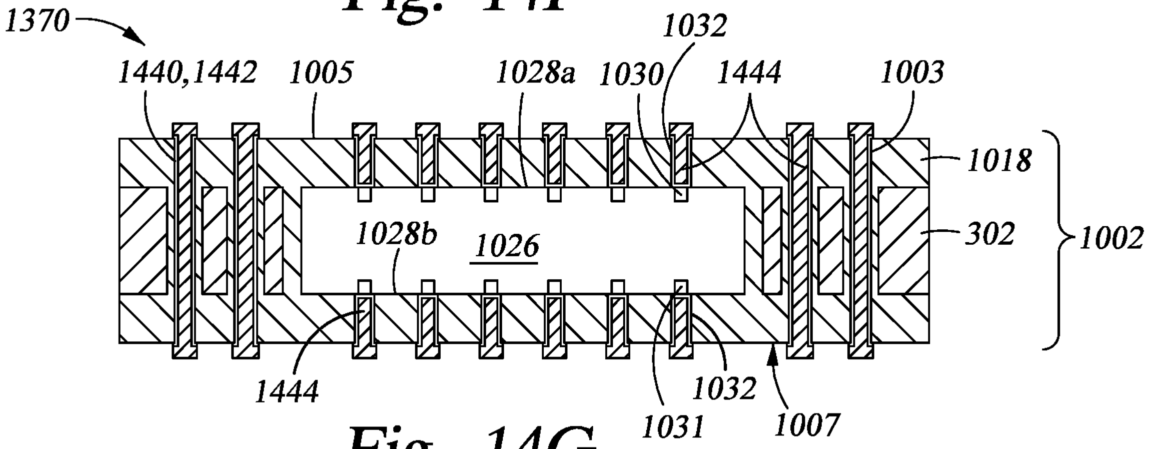
*Fig. 14G*
*Fig. 14H*
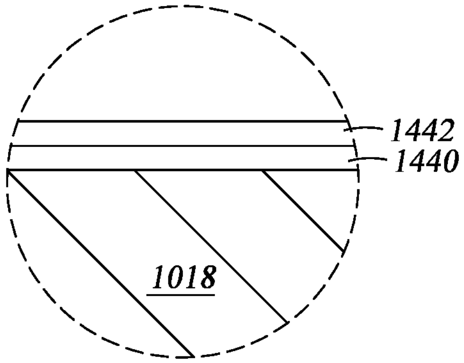

SEMICONDUCTOR DEVICE PACKAGES

CROSS-REFERENCE TO RELATED APPLICATIONS

This application claims benefit of and priority to U.S. Provisional Patent Application No. 63/278,424, filed Nov. 11, 2021. The aforementioned application is herein incorporated by reference in its entirety.

BACKGROUND

Field

Embodiments of the present disclosure generally relate to semiconductor device packages and methods of forming the same. More specifically, embodiments described herein relate to structures of thin-form-factor semiconductor device packages and methods of forming the same.

Description of the Related Art

Ongoing trends in the development of semiconductor device technology have led to semiconductor components having reduced sizes and increased circuit densities. In accordance with demands for continued scaling of semiconductor devices while improving performance capabilities, these components and circuits are integrated into complex 3D semiconductor device packages that facilitate a significant reduction in device footprint and enable shorter and faster connections between components. Such packages may integrate, for example, semiconductor chips and a plurality of other electronic components for mounting onto a circuit board of an electronic device.

Conventionally, semiconductor device packages have been fabricated on organic package substrates due to the ease in forming features and connections therein, as well as the relatively low package manufacturing costs associated with organic composites. However, as circuit densities are increased and semiconductor devices are further miniaturized, the utilization of organic package substrates becomes impractical due to limitations with material structuring resolution to sustain device scaling and associated performance requirements.

More recently, 2.5D and/or 3D packages have been fabricated utilizing passive silicon interposers as redistribution layers to compensate for some of the limitations associated with organic package substrates. Silicon interposer utilization is driven by the potential for high-bandwidth density, lower-power chip-to-chip communication, and heterogeneous integration requirements in advanced packaging applications. Yet, the formation of features in silicon interposers, such as through-silicon vias (TSVs), is still difficult and costly. In particular, high costs are imposed by high-aspect-ratio silicon via etching, chemical mechanical planarization, and semiconductor back end of line (BEOL) interconnection.

Therefore, what is needed in the art are improved semiconductor device package structures for advanced packaging applications and methods of forming the same.

SUMMARY

Embodiments of the present disclosure relate to structures for thin-form-factor semiconductor device packages and methods of forming the same.

In certain embodiments, a package assembly is provided. The package assembly includes a core frame having a first surface opposite a second surface, the core frame formed of a core frame material that comprises silicon. The core frame further includes at least one cavity with a semiconductor die disposed therein, the semiconductor die having electrical contacts disposed on two opposing sides thereof, and a via comprising a via surface that defines an opening extending through the core frame from the first surface to the second surface. An insulating layer is disposed over the first surface and the second surface, the insulating layer contacting at least a portion of each side of the semiconductor die, and an electrical interconnection disposed within the via, wherein the insulating layer is disposed between the via surface and the electrical interconnection.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 14A-14H schematically illustrate cross-sectional views of the embedded die assembly at different stages of the interconnection formation process depicted in FIG. 13, according to embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to methods and apparatus for forming a thin-form-factor semiconductor device package. In certain embodiments, a substrate is structured, or shaped, by micro-blasting to enable formation of interconnections therethrough. In another embodiment, a substrate is structured by direct laser patterning. The substrate is thereafter utilized as a package or core frame for forming one or more semiconductor device packages with dies disposed therein. In still other embodiments, the substrate is utilized as a core frame for a semiconductor device stack, such as a dynamic random-access memory (DRAM) stack.

The methods and apparatus disclosed herein further include novel thin-form-factor semiconductor device packages intended to replace more conventional package structures utilizing glass fiber-filled epoxy frames and silicon interposers as redistribution layers. Generally, the scalability of current packages is limited by the rigidity and planarity of the materials utilized to form the various package structures (e.g., epoxy molding compound, FR-4 and FR-5 grade woven fiberglass cloth with epoxy resin binders, and the like). The intrinsic properties of these materials cause difficulty in patterning fine (e.g., less than 50 μm) features therein. Furthermore, as a result of the thermal properties of current package materials, coefficient of thermal expansion (CTE) mismatch may occur between the packaging substrate, the molding compound, and any semiconductor dies integrated therein and thus, current package structures necessitate larger solder bumps with greater spacing to mitigate any warpage caused by the CTE mismatch. Accordingly, conventional packages are characterized by low die-to-package area ratios and low through-package bandwidths, resulting in decreased overall power efficiency. The methods and apparatus disclosed herein provide semiconductor device packages that overcome many of the disadvantages associated with conventional package architectures described above.

Figure 1:
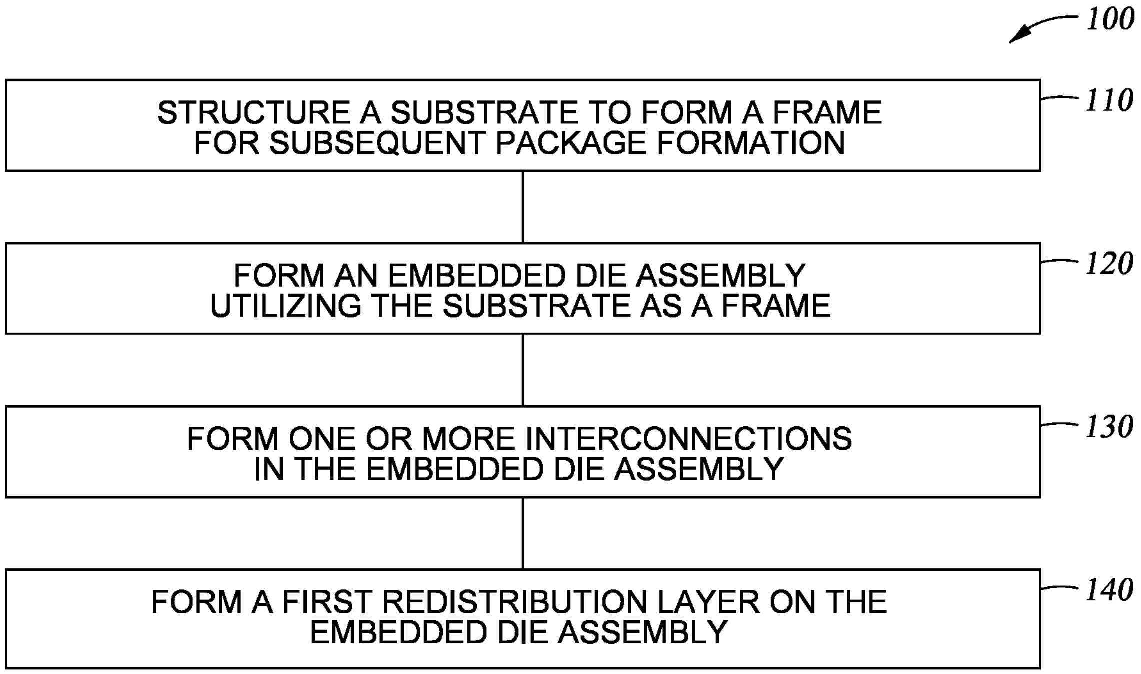
FIG. 1 illustrates a flow diagram of a process for forming a semiconductor device package, according to embodiments described herein.

FIG. 1 illustrates a flow diagram of a representative method 100 of forming a thin-form-factor semiconductor device package. The method 100 has multiple operations 110, 120, 130, and 140. Each operation is described in greater detail with reference to FIGS. 2-16L. The method may include one or more additional operations which are carried out before any of the defined operations, between two of the defined operations, or after all of the defined operations (except where the context excludes the possibility).

In general, the method 100 includes structuring a substrate to be used as a core frame at operation 110, further described in greater detail with reference to FIGS. 2, 3A-3D, 4A-4F, 5A-5F, 6A-6E, 7A-7D, and 8. At operation 120, an embedded die assembly having one or more embedded dies and an insulating layer is formed, which is described in greater detail with reference to FIGS. 9 and 10A-10M, and FIGS. 11 and 12A-12H. At operation 130, one or more interconnections are formed in and/or through the embedded die assembly for interconnection of embedded die-frame sets, which is described in greater detail with reference to FIGS. 13 and 14A-14H. At operation 140, a first redistribution layer is formed on the embedded die assembly to relocate contact points of the interconnections to desired lateral locations on the embedded die assembly surface. In some embodiments, one or more additional redistribution layers may be formed in addition to the first redistribution layer before individual packages are singulated from the embedded die assembly, which is described in greater detail with reference to FIGS. 15 and 16A-16L.

Figure 2:
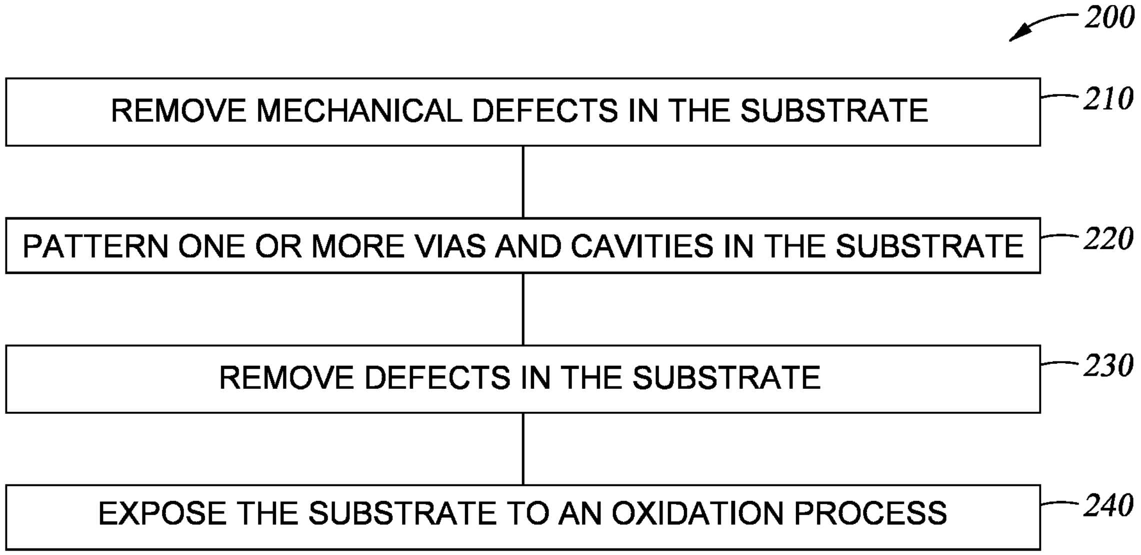
FIG. 2 illustrates a flow diagram of a process for substrate structuring for forming a semiconductor device package, according to embodiments described herein.

FIG. 2 illustrates a flow diagram of a representative method 200 for structuring a substrate to be utilized as a core frame during the formation of a semiconductor device package. FIGS. 3A-3D schematically illustrate cross-sectional views of a substrate 302 at different stages of the substrate structuring process 200 represented in FIG. 2. Therefore, FIG. 2 and FIGS. 3A-3D are herein described together for clarity.

Figure 3A:
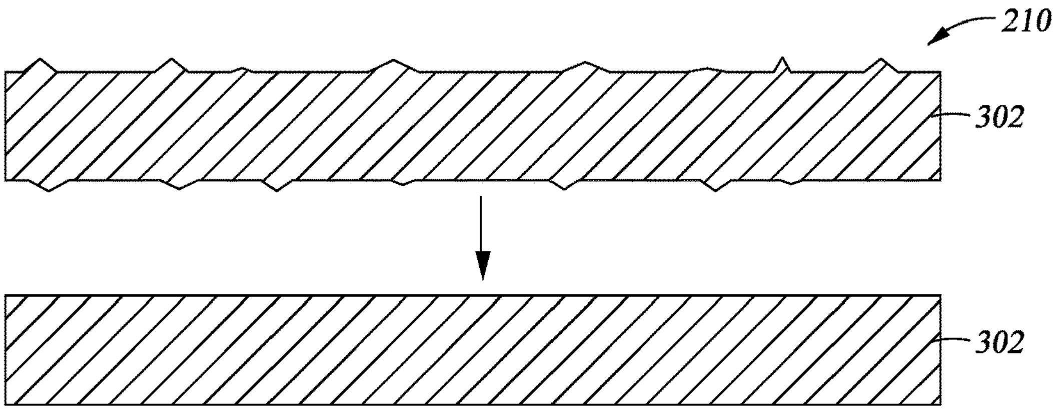
FIGS. 3A-3D schematically illustrate cross-sectional views of a substrate at different stages of the substrate structuring process depicted in FIG. 2, according to embodiments described herein.

The method 200 begins at operation 210 and corresponding FIG. 3A. The substrate 302 is formed of any suitable frame material including but not limited to a III-V compound semiconductor material, silicon, crystalline silicon (e.g., Si<100> or Si<111>), silicon oxide, silicon germanium, doped or undoped silicon, doped or undoped polysilicon, silicon nitride, quartz, borosilicate glass, glass, sapphire, alumina, and ceramic. In certain embodiments, the substrate 302 is a monocrystalline p-type or n-type silicon substrate. In certain embodiments, the substrate 302 is a polycrystalline p-type or n-type silicon substrate. In another embodiment, the substrate 302 is a p-type or n-type silicon solar substrate. The substrate 302 may further have a polygonal or circular shape. For example, the substrate 302 may include a substantially square silicon substrate having lateral dimensions between about 120 mm and about 180 mm, with or without chamfered edges. In another example, the substrate 302 may include a circular silicon-containing wafer having a diameter between about 20 mm and about 700 mm, such as between about 100 mm and about 500 mm, for example about 300 mm.

Unless otherwise noted, embodiments and examples described herein are conducted on substrates having a thickness between about 50 μm and about 1000 μm, such as between about 90 μm and about 780 μm. For example, the substrate 302 has a thickness between about 100 μm and about 300 μm, such as a thickness between about 110 μm and about 200 μm. In another example, the substrate 302 has a thickness between about 60 μm and about 160 μm, such as a thickness between about 80 μm and about 120 μm.

Prior to operation 210, the substrate 302 may be sliced and separated from a bulk material by wire sawing, scribing and breaking, mechanical abrasive sawing, or laser cutting. Slicing typically causes mechanical defects or deformities in substrate surfaces formed therefrom, such as scratches, micro-cracking, chipping, and other mechanical defects. Thus, the substrate 302 is exposed to a first damage removal process at operation 210 to smoothen and planarize surfaces thereof and remove any mechanical defects in preparation for later structuring and packaging operations. In some embodiments, the substrate 302 may further be thinned by adjusting the process parameters of the first damage removal process. For example, a thickness of the substrate 302 may be decreased with increased exposure to the first damage removal process.

The damage removal process at operation 210 includes exposing the substrate 302 to a substrate polishing process and/or an etch process followed by rinsing and drying processes. In some embodiments, operation 210 includes a chemical mechanical polishing (CMP) process. In certain embodiments, the etch process is a wet etch process including a buffered etch process that is selective for the removal of desired materials (e.g., contaminants and other undesirable compounds). In other embodiments, the etch process is a wet etch process utilizing an isotropic aqueous etch process. Any suitable wet etchant or combination of wet etchants may be used for the wet etch process. In certain embodiments, the substrate 302 is immersed in an aqueous HF etching solution for etching. In another embodiment, the substrate 302 is immersed in an aqueous KOH etching solution for etching.

In some embodiments, the etching solution is heated to a temperature between about 30° C. and about 100° C. during the etch process, such as between about 40° C. and about 90° C. For example, the etching solution is heated to a temperature of about 70° C. In still other embodiments, the etch process at operation 210 is a dry etch process. An example of a dry etch process includes a plasma-based dry etch process. The thickness of the substrate 302 is modulated by controlling the time of exposure of the substrate 302 to the etchants (e.g., the etching solution) used during the etch process. For example, a final thickness of the substrate 302 is reduced with increased exposure to the etchants. Alternatively, the substrate 302 may have a greater final thickness with decreased exposure to the etchants.

Figure 3B:
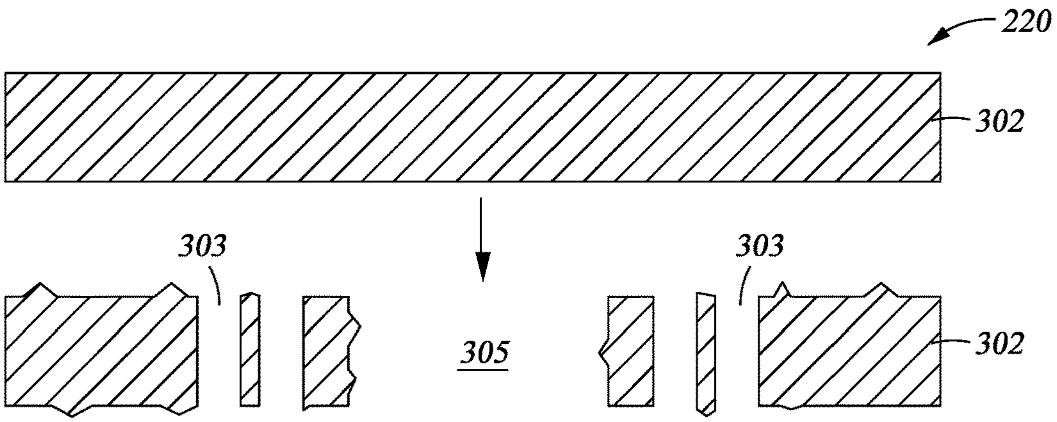
Figure 3C:
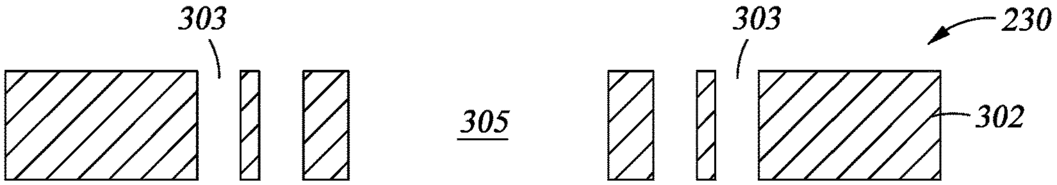
Figure 3D:
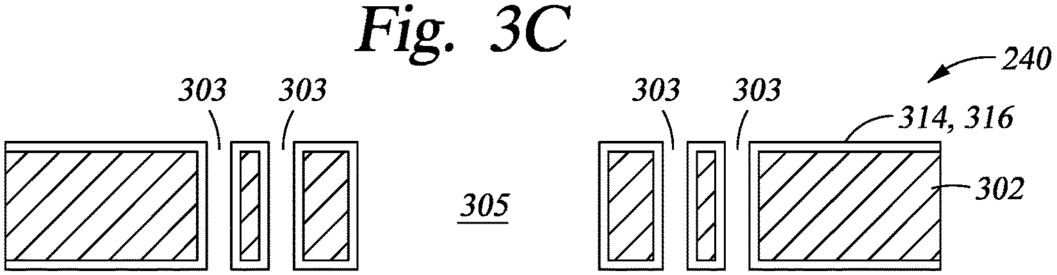

At operations 220 and 230, the now planarized and substantially defect-free substrate 302 has one or more features, such as vias 303 and cavities 305, patterned therein and smoothened (one cavity 305 and four vias 303 are depicted in the lower cross-section of the substrate 302 in FIG. 3B). The vias 303 are utilized to form direct contact electrical interconnections through the substrate 302 and the cavities 305 are utilized to receive and enclose (i.e., embed) one or more semiconductor dies therein. FIGS. 4A-4C, 5A-5C, 6A-6C, and 7A-7B schematically illustrate cross-sectional views of the substrate 302 at different stages of the feature formation and damage or defect removal (e.g., smoothening) processes according to embodiments described herein. Thus, operations 220 and 230 will now be described in greater detail with reference to FIGS. 4A-4C, 5A-5C, 6A-6C, and 7A-7B.

Figure 4A:
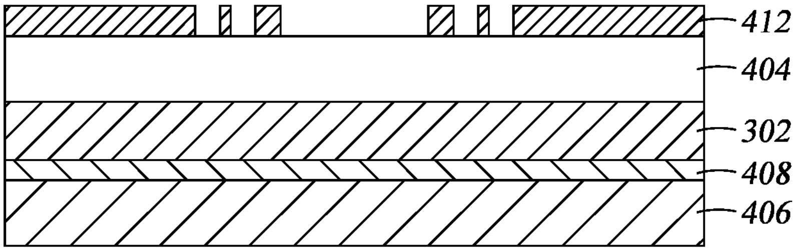
FIGS. 4A-4F schematically illustrate cross-sectional views of a substrate at different stages of feature formation and subsequent damage removal, according to embodiments described herein.
Figure 5A:
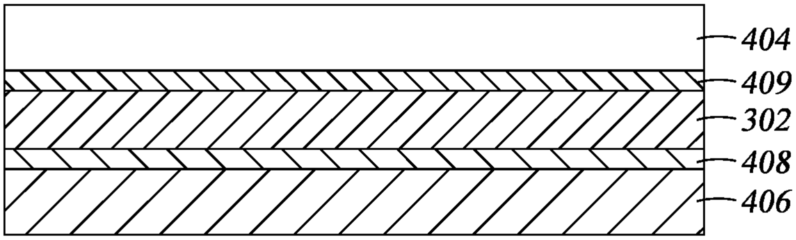
FIGS. 5A-5F schematically illustrate cross-sectional views of a substrate at different stages of feature formation and subsequent damage removal, according to embodiments described herein.

In embodiments where the substrate 302 has a thickness less than about 200 μm, such as a thickness of about 100 μm, or a thickness of about 50 μm, the substrate 302 may first be coupled to an optional carrier plate 406 as depicted in FIGS. 4A and 5A. The carrier plate 406 provides mechanical support for the substrate 302 during the substrate structuring process 200 and prevents the substrate 302 from breaking. The carrier plate 406 is formed of any suitable chemically and thermally stable rigid material including but not limited to glass, ceramic, metal, or the like. The carrier plate 406 has a thickness between about 1 mm and about 10 mm, such as between about 2 mm and about 5 mm. In certain embodiments, the carrier plate 406 has a textured surface. In other embodiments, the carrier plate 406 has a polished or smoothened surface.

The substrate 302 may be coupled to the carrier plate 406 via an adhesive layer 408. The adhesive layer 408 is formed of any suitable temporary bonding material, including but not limited to wax, glue, or similar bonding material. The adhesive layer 408 is applied onto the carrier plate 406 by mechanical rolling, pressing, lamination, spin coating, or doctor-blading. In certain embodiments, the adhesive layer 408 is a water-soluble or solvent-soluble adhesive layer. In other embodiments, the adhesive layer 408 is a UV release adhesive layer. In still other embodiments, the adhesive layer 408 is a thermal release adhesive layer. In such embodiments, the bonding properties of the adhesive layer 408 degrade upon exposure to heat treatment, for example, by exposing the adhesive layer 408 to temperatures above 110° C., such as above 150° C. The adhesive layer 408 may further include one or more layers of additional films (not shown), such as a liner, a base film, a pressure-sensitive film, and other suitable layers.

In some embodiments, after bonding of the substrate 302 to the carrier plate 406, a resist film is applied to the substrate 302 to form a resist layer 404, depicted in FIGS. 4A and 5A. In embodiments where the substrate 302 has a thickness of greater than about 200 μm, such as a thickness of about 250 μm, the resist layer 404 is formed on the substrate 302 without first coupling the substrate 302 to the carrier plate 406. The resist layer 404 is used to transfer a desired pattern to the substrate 302 upon which the resist layer 404 is formed during subsequent processing operations. After being patterned, the resist layer 404 protects selected regions of the underlying substrate 302 during later structuring operations.

The substrate 302 generally has a substantially planar surface upon which the resist layer 404 is formed. In some embodiments, such as those illustrated in FIG. 5A, the resist layer 404 is bonded to the substrate 302 via a resist adhesive layer 409. The resist adhesive layer 409 is formed of any suitable temporary bonding material, including but not limited to polyvinyl alcohol, triester with 2-ethyl-2-(hydroxymethyl)-1,3-propanediol, and other water- or solvent-soluble materials. In certain embodiments, the resist adhesive layer 409 is formed of a different material than the adhesive layer 408. In certain embodiments, the resist adhesive layer 409 is substantially similar in composition to the adhesive layer 408. The resist adhesive layer 409 is applied onto the substrate 302 by mechanical rolling, pressing, lamination, spin coating, or doctor-blading. In other embodiments, the resist layer 404 is formed of a temporary bonding material such as polyvinyl alcohol, thus enabling the resist layer 404 to be directly applied and bonded to the surface of the substrate 302. The resist layer 404 may include one or more layers, for example, a first resist layer and a second resist layer (not shown).

In certain embodiments, such as the embodiment illustrated in FIG. 4A, the resist layer 404 is a photosensitive layer (e.g., photoresist). The resist layer 404 may include a solvent, a photoresist resin, and a photoacid generator. The photoresist resin may be any positive photoresist resin or any negative photoresist resin. Representative photoresist resins include acrylates, novolak resins, poly(methylmethacrylates), and poly(olefin sulfones). Other photoresist resins may also be used. Upon exposure to electromagnetic radiation, the photoacid generator generates charged species, such as acid cations and anions. The photoacid generator may also generate polarized species. The photoacid generator sensitizes the resin to electromagnetic radiation. Representative photoacid generators include sulfonate compounds, such as, for example, sulfonated salts, sulfonated esters, and sulfonyloxy ketones. Other suitable photoacid generators include onium salts, such as aryl-diazonium salts, halonium salts, aromatic sulfonium salts and sulfoxonium salts or selenium salts. Other representative photoacid generators include nitrobenzyl esters, s-triazine derivatives, ionic iodonium sulfonates, perfluoroalkanesulfonates, aryl triflates and derivatives and analogs thereof, pyrogallol derivatives, and alkyl disulfones. Other photoacid generators may also be used. In certain embodiments, such as the embodiment illustrated in FIG. 5A, the resist layer 404 is a laser-sensitive resist.

Figure 4B:
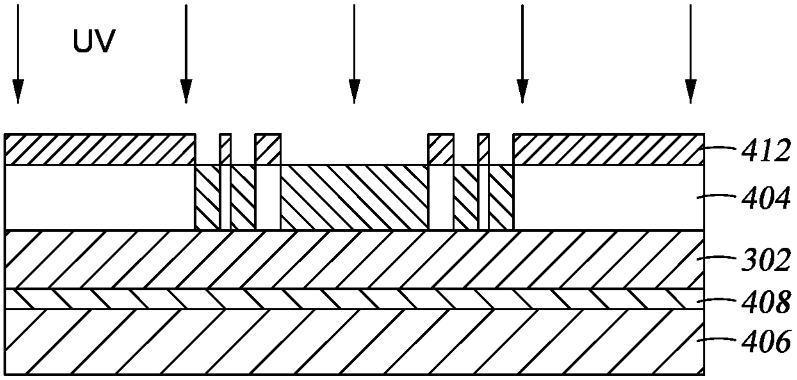
Figure 5B:
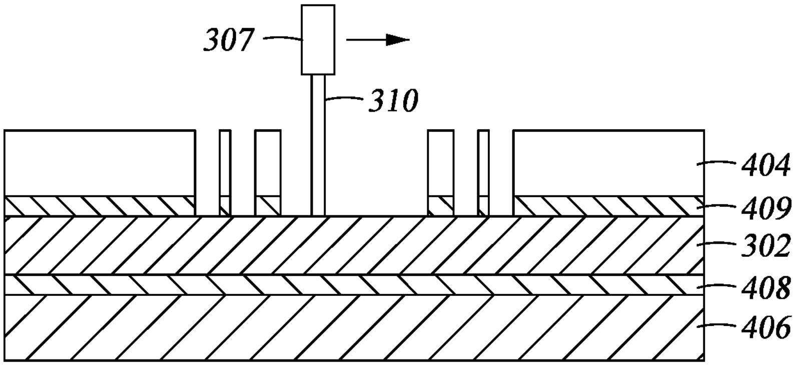

After formation of the resist layer 404, the substrate 302 having the resist layer 404 formed thereon is exposed to electromagnetic radiation to pattern the resist layer 404, depicted in FIGS. 4B and 5B. In the embodiment illustrated by FIG. 4B, the substrate 302 having the resist layer 404 formed thereon is exposed to electromagnetic radiation in the ultraviolet (UV) range. Portions of the resist layer 404 are selectively exposed and portions of the resist layer 404 are selectively unexposed to the UV radiation. Upon exposure to the UV radiation, the selectively exposed portions of the resist layer 404 are structurally weakened (shown with hatching) while the selectively unexposed portions maintain their structural integrity. In certain embodiments, a mask 412 having a desired pattern is formed on or adjacent to the photosensitive resist layer 404 prior to UV radiation exposure. In other embodiments, the mask 412 is a reticle positioned between the resist layer 404 and the UV radiation source. The mask 412 is configured to transfer a desired pattern of UV radiation to the resist layer 404. The mask 412 is formed of any suitable polymeric material, including but not limited to PTFE, PVDF, FEP, polyimide, or the like.

In the embodiment illustrated by FIG. 5B, the substrate 302 having the laser-sensitive resist layer 404 formed thereon is exposed to electromagnetic radiation generated by a laser source 307 instead of a UV radiation source. As such, patterning is accomplished by targeted laser ablation, without the use of a mask. The laser source 307 may be any suitable type of laser for patterning of the resist layer 404. In some examples, the laser source 307 is a femtosecond green laser. In other examples, the laser source 307 is a femtosecond UV laser. The laser source 307 generates a continuous or pulsed laser beam 310 for patterning of the resist layer 404. For example, the laser source 307 may generate a pulsed laser beam 310 having a frequency between 100 kHz and 1200 kHz, such as between about 200 kHz and about 1000 kHz. The laser source 307 is generally configured to form any desired pattern in the resist layer 404. It is further contemplated that the electromagnetic radiation at operation may alternatively include an electron beam or an ion beam instead of a laser beam.

The resist layer 404 may be formed of any material having a suitable hardness after the resist layer 404 has been patterned, such as, for example, after exposing a negative photoresist to electromagnetic radiation to cause cross-linking of the material in the resist. In general, the resist layer 404 needs to have one or more desirable mechanical properties after the resist layer 404 has been patterned (e.g., deposited, exposed and developed). In certain embodiments, the resist layer 404 is formed of a material having a Shore A scale hardness value of between 40 and 90, such as between 60 and 70 after patterning. For example, the resist layer 404 is formed of a material having a Shore A scale hardness value of about 65 after patterning. In certain embodiments, the resist layer 404 is formed of a material having a tensile strength of between about 0.5 MPa and about 10 MPa, such as between about 1 MPa and about 8 MPa after patterning. For example, the resist layer 404 may be formed of a material having a tensile strength of about 7 MPa after patterning. In certain embodiments, the resist layer 404 is formed of a polydimethylsiloxane material. In other embodiments, the resist layer 404 is formed of polyvinyl alcohol, triester with 2-ethyl-2-(hydroxymethyl)-1,3-propanediol, or the like.

Figure 4C:
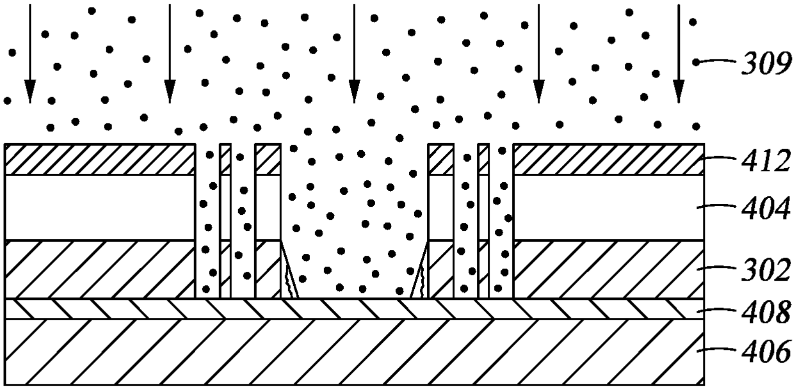
Figure 5C:
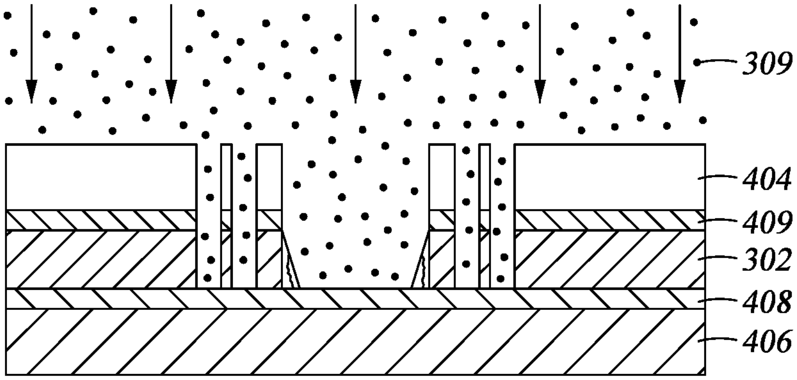

Following patterning of the resist layer 404, the substrate 302 having the resist layer 404 formed thereon is micro-blasted to form a desired pattern in the substrate 302 as depicted in FIGS. 4C and 5C. During the micro-blasting process, a stream of powder particles 309 is propelled toward the substrate 302 by use of a high-pressure carrier gas to dislodge exposed portions of the substrate 302 and/or layers formed thereon. The micro-blasting process is performed using any suitable substrate abrading system.

The micro-blasting process is determined by the material properties of the powder particles 309, the momentum of the powder particles that strike the exposed surface of the substrate 302 and the material properties of the substrate 302 along with, when applicable, the selectively-exposed portions of the resist layer 404. To achieve desired substrate patterning characteristics, adjustments are made to the type and size of the powder particles 309, the size and distance of the abrading system's applicator nozzle to the substrate 302, the pressure, which correlates to the velocity and flow rate, of the carrier gas utilized to propel the powder particles 309, and the density of the powder particles 309 in the fluid stream. For example, a desired fluid pressure of the carrier gas used for propelling the powder particles 309 toward the substrate 302 for a desired fixed micro-blasting device nozzle orifice size is determined based on the materials of the substrate 302 and the powder particles 309. In certain embodiments, the fluid pressure utilized to micro-blast the substrate 302 ranges from between about 50 psi and about 150 psi, such as between about 75 psi and about 125 psi, to achieve a carrier gas and particle velocity of between about 300 and about 1000 meters per second (m/s) and/or a flow rate of between about 0.001 and about 0.002 cubic meters per second ($m^3/s$). For example, the fluid pressure of an inert gas (e.g., nitrogen ($N_2$), CDA, argon) that is utilized to propel the powder particles 309 during micro-blasting is about 95 psi to achieve a carrier gas and particle velocity of about 2350 m/s. In certain embodiments, the applicator nozzle utilized to micro-blast the substrate 302 has an inner diameter of between about 0.1 and about 2.5 millimeters (mm) that is disposed at a distance between about 1 mm and about 5 mm from the substrate 302, such as between about 2 mm and about 4 mm. For example, the applicator nozzle is disposed at a distance of about 3 mm from the substrate 302 during micro-blasting.

Generally, the micro-blasting process is performed with powder particles 309 having a sufficient hardness and high melting point to prevent particle adhesion upon contact with the substrate 302 and/or any layers formed thereon. For example, the micro-blasting process is performed utilizing powder particles 309 formed of a ceramic material. In certain embodiments, the powder particles 309 utilized in the micro-blasting process are formed of aluminum oxide ($Al_2O_3$). In another embodiment, the powder particles 309 are formed of silicon carbide (SiC). Other suitable materials for the powder particles 309 are also contemplated. The powder particles 309 generally range in size between about 15 μm and about 60 μm in diameter, such as between about 20 μm and about 40 μm in diameter. For example, the powder particles 309 are an average particle size of about 27.5 μm in diameter. In another example, the powder particles 309 have an average particle size of about 23 μm in diameter.

The effectiveness of the micro-blasting process at operation 220 and depicted in FIGS. 4C and 5C further depends on the material characteristics of the resist layer 404. Utilizing a material having too high of a Shore A Scale hardness may cause unwanted ricocheting of the powder particles 309 between sidewalls of the resist layer 404, thus reducing the velocity upon which the powder particles 309 bombard the substrate 302, and ultimately reducing the effectiveness of the powder particles 309 in eroding or dislodging exposed regions of the substrate 302. Conversely, utilizing a material having too low of a Shore A Scale hardness may cause unwanted adhesion of the powder particles 309 to the resist layer 404. It is contemplated that a Shore A Scale hardness value of between about 40 and about 90 is utilized for the resist layer 404 material, as described above.

In embodiments where the resist layer 404 is a photoresist, such as the embodiment depicted in FIG. 4C, the substrate 302 remains unexposed at the start of the micro-blasting process. Thus, the powder particles 309 first bombard a surface of the photoresist, causing material from the UV-exposed and structurally weakened portions of the photoresist to be dislodged and removed. The powder particles 309 eventually penetrate through and remove the brittle UV-exposed portions to form voids in the resist layer 404, thus exposing desired regions of the substrate 302 while other regions remain shielded by the UV-unexposed portions of the photoresist. Micro-blasting is then continued until the powder particles 309 dislodge and remove a desired amount or depth of material from the exposed regions of the substrate 302, thus forming a desired pattern in the substrate 302. In embodiments where the resist layer 404 is patterned by laser ablation, such as the embodiment depicted in FIG. 5C, desired regions of the substrate 302 are already exposed through voids in the resist layer 404 prior to the micro-blasting process. Thus, minimal to no removal of the resist layer 404 is contemplated during micro-blasting.

The processes described above for forming features in the substrate 302 at operation 220 may cause unwanted mechanical defects on the surfaces of the substrate 302, such as chipping and cracking. Therefore, after performing operation 220 to form desired features in the substrate 302, the substrate 302 is exposed to a second damage removal and cleaning process at operation 230 to smoothen the surfaces of the substrate 302 and remove unwanted debris, followed by a stripping of the resist layer 404 and optional debonding of the substrate 302 from the carrier plate 406. FIGS. 4D-4F and 5D-5F schematically illustrate cross-sectional views of the substrate 302 at different stages of the second damage removal, cleaning, resist stripping, and substrate debonding processes according to embodiments described herein. Thus, operation 230 will now be described in greater detail with reference to FIGS. 4D-4F and 5D-5F.

Figure 4D:
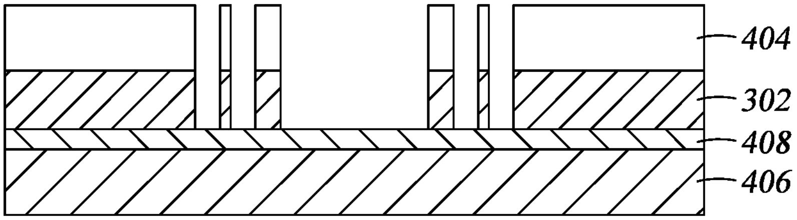
Figure 5D:
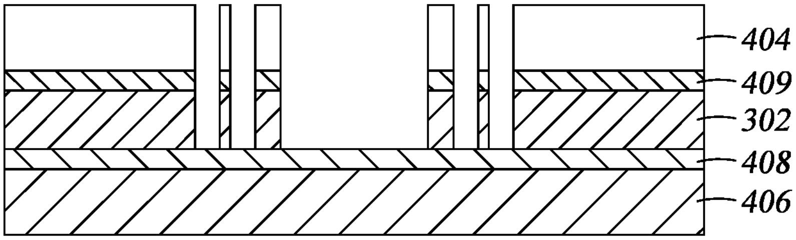

The second damage removal process at operation 230 is substantially similar to the first damage removal process at operation 210 and includes exposing the substrate 302 to an etch process, followed by rinsing and drying. The etch process proceeds for a predetermined duration to smoothen the surfaces of the substrate 302, and in particular, the surfaces exposed to the micro-blasting process. In another aspect, the etch process is utilized to remove undesired debris remaining from the micro-blasting process. Leftover powder particles adhering to the substrate 302 may be removed during the etch process. FIGS. 4D and 5D schematically illustrate the substrate 302 after removal of debris and surface smoothening.

In certain embodiments, the etch process is a wet etch process utilizing a buffered etch process preferentially etching the substrate surface versus the resist layer 404 material. For example, the buffered etch process is selective for polyvinyl alcohol. In other embodiments, the etch process is a wet etch process utilizing an aqueous etch process. Any suitable wet etchant or combination of wet etchants may be used for the wet etch process. In certain embodiments, the substrate 302 is immersed in an aqueous HF etching solution for etching. In another embodiment, the substrate 302 is immersed in an aqueous KOH etching solution for etching. The etching solution may further be heated to a temperature between about 40° C. and about 80° C. during the etch process, such as between about 50° C. and about 70° C. For example, the etching solution is heated to a temperature of about 60° C. The etch process may be isotropic or anisotropic. In still other embodiments, the etch process at operation 230 is a dry etch process. An example of a dry etch process includes a plasma-based dry etch process.

Figure 4E:
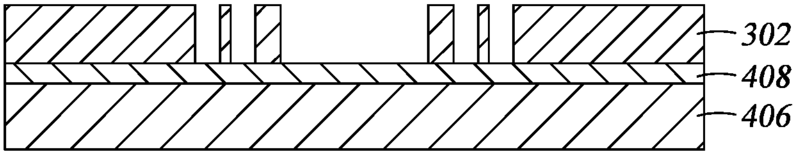
Figure 5E:
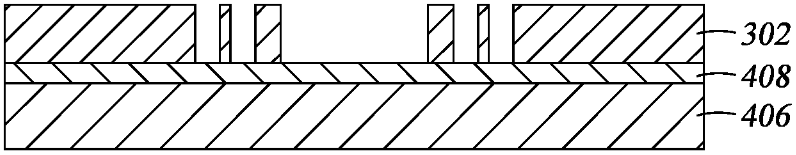

After debris has been removed and the substrate surfaces have been smoothed, the substrate 302 is exposed to a resist stripping process. The stripping process is utilized to de-bond the resist layer 404 from the substrate 302, as depicted in FIGS. 4E and 5E. In certain embodiments, a wet process is used to de-bond the resist layer 404 from the substrate 302 by dissolving/solubilizing the resist adhesive layer 409. Other types of etch process are also contemplated for releasing the resist adhesive layer 409. In certain embodiments, a mechanical rolling process is used to physically peel off the resist layer 404 or the resist adhesive layer 409 from the substrate 302. In certain embodiments, an ashing process is used to remove the resist layer 404 from the substrate 302 by use of, for example, an oxygen plasma assisted process.

Figure 4F:
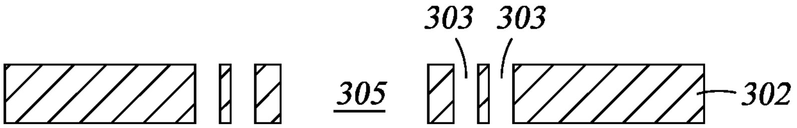
Figure 5F:
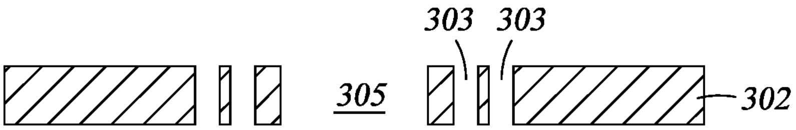

After the resist stripping process, the substrate 302 is exposed to an optional carrier de-bonding process as depicted in FIGS. 4F and 5F. The utilization of the carrier de-bonding process is dependent on whether the substrate 302 is coupled to the carrier plate 406 and the type of bonding material utilized to couple the substrate 302 and the carrier plate 406. As described above and depicted in FIGS. 4A-4F and 5A-5F, in embodiments where the substrate 302 has a thickness of less than about 200 μm, the substrate 302 is coupled to the carrier plate 406 for mechanical support during the formation of features at operation 220. The substrate 302 is coupled to the carrier plate 406 via the adhesive layer 408. Thus, after micro-blasting and subsequent substrate etch and resist stripping, the substrate 302 coupled to the carrier plate 406 is exposed to the carrier de-bonding process to de-bond the substrate 302 from the carrier plate 406 by releasing the adhesive layer 408.

In certain embodiments, the adhesive layer 408 is released by exposing the substrate 302 to a bake process. The substrate 302 is exposed to temperatures of between about 50° C. and about 300° C., such as temperatures between about 100° C. and about 250° C. For example, the substrate 302 is exposed to a temperature of between about 150° C. and about 200° C., such as about 160° C. for a desired period of time in order to release the adhesive layer 408. In other embodiments, the adhesive layer 408 is released by exposing the substrate 302 to UV radiation.

Figure 8:
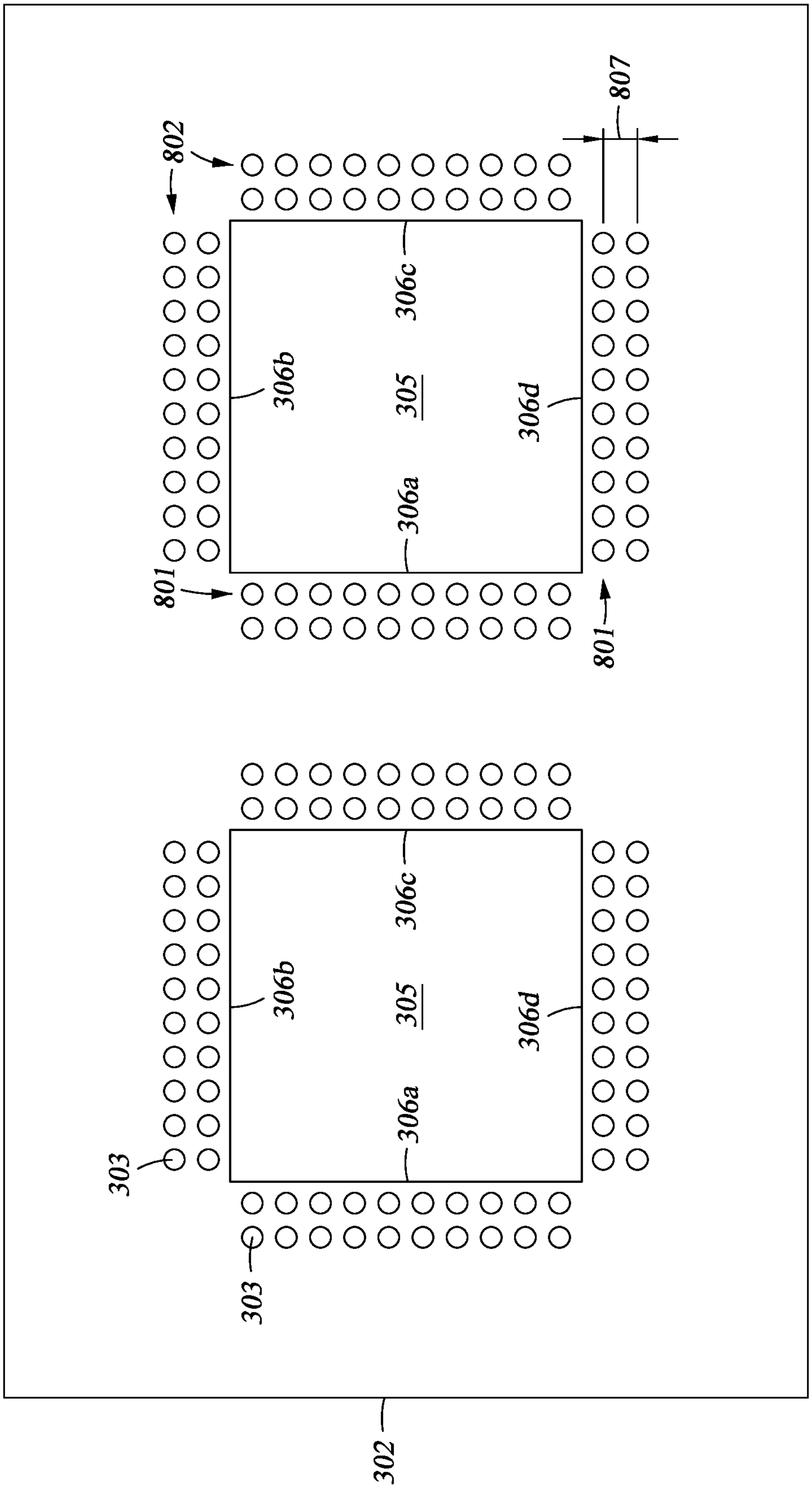
FIG. 8 illustrates a schematic top view of a substrate structured with the processes depicted in FIGS. 2, 3A-3D, 4A-4F, 5A-5F, 6A-6E, and 7A-7D according to embodiments described herein.

FIGS. 4F and 5F schematically illustrate the substrate 302 after completion of operations 210-230. The cross-sections of the substrate 302 in FIGS. 4F and 5F depict a single cavity 305 formed therethrough and surrounded on either lateral side by two vias 303. A schematic top view of the substrate 302 upon completion of the operations described with reference to FIGS. 4A-4F and 5A-5F is depicted in FIG. 8, described in further detail below.

FIGS. 6A-6E illustrate schematic, cross-sectional views of a substrate 302 during an alternative sequence for operations 220 and 230 similar to those described above. The alternative sequence depicted for operations 220 and 230 involves patterning the substrate 302 on two major opposing surfaces as compared to only one surface, thus enabling increased efficiency during structuring of the substrate 302. The embodiment depicted in FIGS. 6A-6E includes substantially all of the processes as described with reference to FIGS. 4A-4F and 5A-5F. For example, FIG. 6A corresponds with FIGS. 4A and 5A, FIG. 6B corresponds with FIGS. 4B and 5B, FIG. 6C corresponds with FIGS. 4C and 5C, FIG. 6D corresponds with FIGS. 4D and 5D, and FIG. 6E corresponds with FIGS. 4F and 5F. However, unlike the previous embodiments, the embodiment of operation 220 depicted in FIGS. 6A-6E includes a substrate 302 having two resist layers 404 formed on major opposing surfaces 606, 608 thereof, as opposed to one resist layer 404 formed on a single surface. Therefore, the processes performed during operations 210-230 will need to be performed at the same time (i.e., simultaneously) or one after the other (i.e., sequentially) on both sides of the substrate during each operation. While FIGS. 6A-6E only illustrate the formation of vias 303, the processes described herein can also be used to form cavities 305, or cavities 305 and vias 303.

Figure 6A:
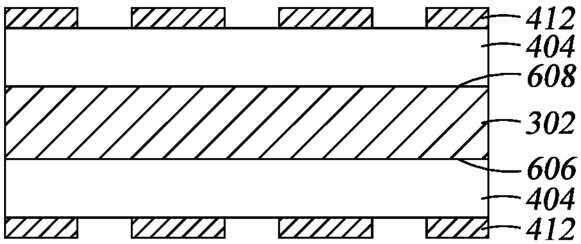
FIGS. 6A-6E schematically illustrate cross-sectional views of a substrate at different stages of feature formation and subsequent damage removal, according to embodiments described herein.
Figure 6B:
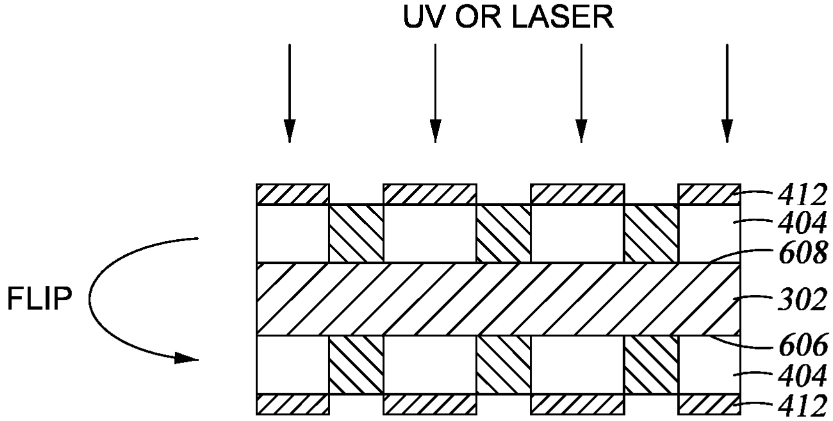
Figure 6C:
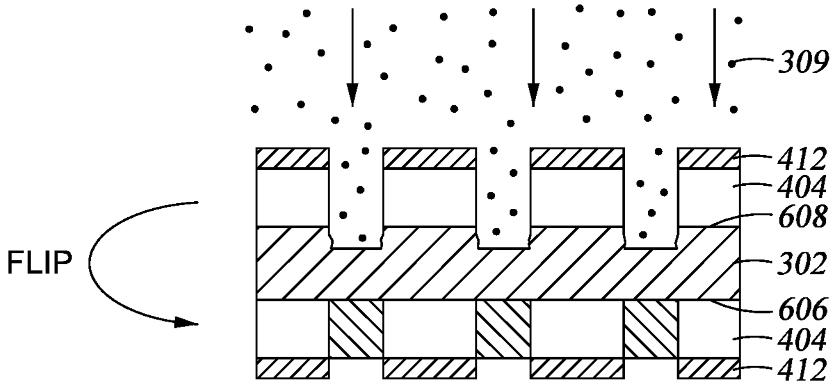
Figure 6D:
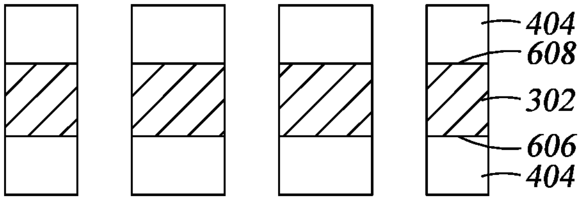
Figure 6E:
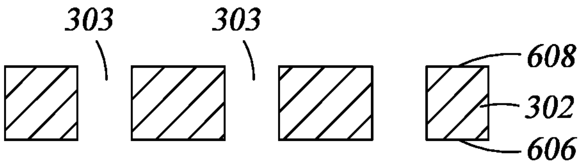

Accordingly, after exposing the resist layer 404 on one side of the substrate 302 to electromagnetic radiation for patterning, such as the side including the surface 608, the substrate 302 may be optionally flipped so that the resist layer 404 on the opposing surface 606 is also exposed to the electromagnetic radiation for patterning, as depicted in FIG. 6B. Similarly, after performing the micro-blasting process on the surface 608 of the substrate 302, the substrate 302 may be optionally flipped so that micro-blasting may be performed against the opposing surface 606 as depicted in FIG. 6C. Thereafter, the substrate 302 is exposed to a second damage removal and cleaning process and a resist stripping process, depicted in FIGS. 6D-6E. By utilizing two resist layers 404 on major opposing surfaces 606, 608 of the substrate 302 and performing the micro-blasting process against both surfaces 606 and 608, potential tapering of the features formed therein by the micro-blasting process may be reduced or eliminated and efficiency of the process used to structure the substrate 302 can be increased.

Figure 7A:
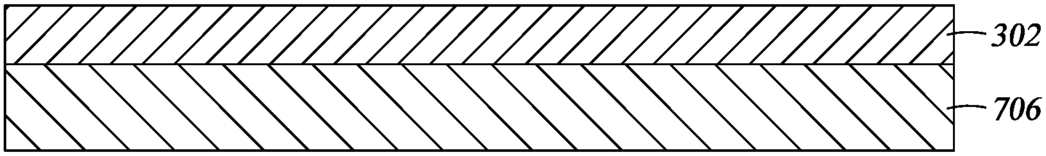
FIGS. 7A-7D schematically illustrate cross-sectional views of a substrate at different stages of feature formation and subsequent damage removal, according to embodiments described herein.
Figure 7B:
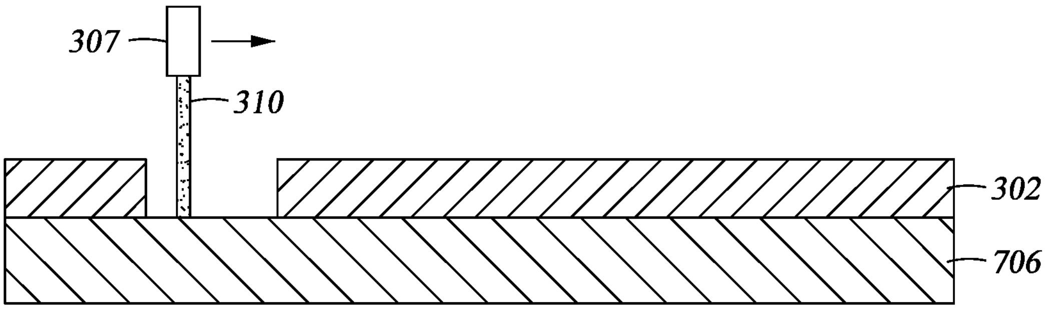

FIGS. 7A-7D illustrate schematic, cross-sectional views of a substrate 302 during another alternative sequence for operations 220 and 230, wherein a desired pattern is formed in the substrate 302 by direct laser ablation. As depicted in FIG. 7A, the substrate 302, such as a solar substrate or even a semiconductor wafer, is placed on a stand 706 of a laser ablation system (not shown). The stand 706 may be any suitable rigid and planar or textured (e.g., structured) surface for providing mechanical support for the substrate 302 during laser ablation. In some embodiments, the stand 706 includes an electrostatic chuck for electrostatic chucking of the substrate 302 to the stand 706. In some embodiments, the stand 706 includes a vacuum chuck for vacuum chucking of the substrate 302 to the stand 706. After placing the substrate 302 on the stand 706, a desired pattern is formed in the substrate 302 by laser ablation, depicted in FIG. 7B.

The laser ablation system may include any suitable type of laser source 307 for patterning the substrate 302. In some examples, the laser source 307 is an infrared (IR) laser. In some examples the laser source 307 is a picosecond UV laser. In other examples, the laser source 307 is a femtosecond UV laser. In yet other examples, the laser source 307 is a femtosecond green laser. The laser source 307 generates a continuous or pulsed laser beam 310 for patterning of the substrate 302. For example, the laser source 307 may generate a pulsed laser beam 310 having a frequency between 5 kHz and 500 kHz, such as between 10 kHz and about 200 kHz. In one example, the laser source 307 is configured to deliver a pulsed laser beam at a wavelength of between about 200 nm and about 1200 nm and at a pulse duration between about 10 ns and about 5000 ns with an output power of between about 10 Watts and about 100 Watts. The laser source 307 is configured to form any desired pattern and features in the substrate 302, including the cavities 305 and the vias 303.

Figure 7C:
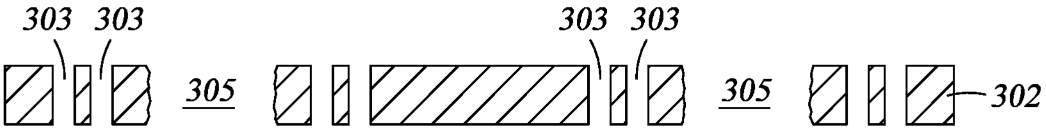
Figure 7D:
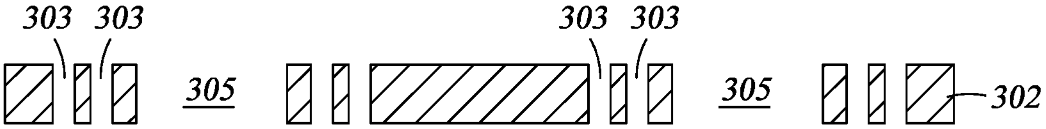

Similar to micro-blasting, the process of direct laser patterning of the substrate 302 may cause unwanted mechanical defects on the surfaces of the substrate 302, including chipping and cracking. Thus, after forming desired features in the substrate 302 by direct laser patterning, the substrate 302 is exposed to a second damage removal and cleaning process substantially similar to embodiments described above. FIGS. 7C-7D illustrate the structured substrate 302 before and after performing the second damage removal and cleaning process, resulting in a smoothened substrate 302 having a cavity 305 and four vias 303 formed therein.

Referring back now to FIG. 2 and FIG. 3D, after removal of mechanical defects in the substrate 302 at operation 230, in certain embodiments, the substrate 302 may be exposed to an oxidation process at operation 240 to grow or deposit an insulating oxide film (i.e. layer) 314 on desired surfaces thereof. For example, the oxide film 314 may be formed on all surfaces of the substrate 302 such that it surrounds the substrate 302. The insulating oxide film 314 acts as a passivating layer on the substrate 302 and provides a protective outer barrier against corrosion and other forms of damage. In certain embodiments, the oxidation process is a thermal oxidation process. The thermal oxidation process is performed at a temperature of between about 800° C. and about 1200° C., such as between about 850° C. and about 1150° C. For example, the thermal oxidation process is performed at a temperature of between about 900° C. and about 1100° C., such as a temperature of between about 950° C. and about 1050° C. In certain embodiments, the thermal oxidation process is a wet oxidation process utilizing water vapor as an oxidant. In certain embodiments, the thermal oxidation process is a dry process utilizing molecular oxygen as the oxidant. It is contemplated that the substrate 302 may be exposed to any suitable oxidation process at operation 240 to form the oxide film 314 thereon. The oxide film 314 generally has a thickness between about 100 nm and about 3 μm, such as between about 200 nm and about 2.5 μm. For example, the oxide film 314 has a thickness between about 300 nm and about 2 μm, such as about 1.5 μm.

In certain embodiments, the substrate 302 is exposed to a metallization process at operation 240 to form a metal cladding layer 316 on one or more surfaces thereof. In certain embodiments, the metal cladding layer 316 is formed on substantially all exterior surfaces of the substrate 302 such that the metal cladding layer 114 substantially surrounds the substrate 302. The metal cladding layer 316 acts as a reference layer (e.g., grounding layer or a voltage supply layer) and is disposed on the substrate 302 to protect subsequently formed interconnections from electromagnetic interference and also shield electric signals from the semiconductor material (Si) that is used to form the substrate 302. In certain embodiments, the metal cladding layer 316 includes a conductive metal layer that includes nickel, aluminum, gold, cobalt, silver, palladium, tin, or the like. In certain embodiments, the metal cladding layer 316 includes a metal layer that includes an alloy or pure metal that includes nickel, aluminum, gold, cobalt, silver, palladium, tin, or the like. The metal cladding layer 316 generally has thickness between about 50 nm and about 10 μm such as between about 100 nm and about 5 μm.

In certain examples, at least a portion of the metal cladding layer 316 includes a deposited nickel (Ni) layer formed by direct displacement or displacement plating on the surfaces of the substrate 302 (e.g., n-Si substrate or p-Si substrate). For example, the substrate 302 is exposed to a nickel displacement plating bath having a composition including 0.5 M $NiSO_4$ and $NH_4OH$ at a temperature between about 60° C. and about 95° C. and a pH of about 11, for a period of between about 2 and about 4 minutes. The exposure of the silicon substrate 302 to a nickel ion-loaded aqueous electrolyte in the absence of reducing agent causes a localized oxidation/reduction reaction at the surface of the substrate 302, thus leading to plating of metallic nickel thereon. Accordingly, nickel displacement plating enables selective formation of thin and pure nickel layers on the silicon material of substrate 400 utilizing stable solutions. Furthermore, the process is self-limiting and thus, once all surfaces of the substrate 302 are plated (e.g., there is no remaining silicon upon which nickel can form), the reaction stops. In certain embodiments, the nickel metal cladding layer 316 may be utilized as a seed layer for plating of additional metal layers, such as for plating of nickel or copper by electroless and/or electrolytic plating methods. In further embodiments, the substrate 302 is exposed to an SC-1 pre-cleaning solution and a HF oxide etching solution prior to a nickel displacement plating bath to promote adhesion of the nickel metal cladding layer 316 thereto.

In subsequent packaging operations, the metal cladding layer 316 may be coupled to one or more connection points, e.g., interconnections, formed within the resulting semiconductor device package for connecting the metal cladding layer 316 to a common ground. For example, interconnections may be formed on one side or opposing sides of the resulting semiconductor device package to connect the metal cladding layer 316 to ground. Alternatively, the metal cladding layer 316 may be connected to a reference voltage, such as a power voltage.

FIG. 8 illustrates a schematic top view of an exemplary structured substrate 302 according to one embodiment. The substrate 302 may be structured during operations 210-240 as described above with reference to FIGS. 2, 3A-3D, 4A-4F, 5A-5F, 6A-6E, and 7A-7D. The substrate 302 is illustrated as having two quadrilateral cavities 305, and each cavity 305 is surrounded by a plurality of vias 303. In certain embodiments, each cavity 305 is surrounded by two rows 801, 802 of vias 303 arranged along each edge 306*a*-*d* of the quadrilateral cavity 305. Although ten vias 303 are depicted in each row 801, 802, it is contemplated that any desired number of vias 303 may be formed in a row. Further, any desired number and arrangement of cavities 305 and vias 303 may be formed in the substrate 302 during operation 220. For example, the substrate 302 may have more or less than two cavities 305 formed therein. In another example, the substrate 302 may have more or less than two rows of vias 303 formed along each edge 306*a*-*d* of the cavities 305. In another example, the substrate 302 may have two or more rows of vias 303 wherein the vias 303 in each row are staggered and unaligned with vias 303 of another row.

In certain embodiments, the cavities 305 and vias 303 have a depth equal to the thickness of the substrate 302, thus forming holes on opposing surfaces of the substrate 302 (e.g., through the thickness of the substrate 302). For example, the cavities 305 and the vias 303 formed in the substrate 302 may have a depth of between about 50 μm and about 1 mm, such as between about 100 μm and about 200 μm, such as between about 110 μm and about 190 μm, depending on the thickness of the substrate 302. In other embodiments, the cavities 305 and/or the vias 303 may have a depth equal to or less than the thickness of the substrate 302, thus forming a hole in only one surface (e.g., side) of the substrate 302.

In certain embodiments, each cavity 305 has lateral dimensions ranging between about 3 mm and about 50 mm, such as between about 8 mm and about 12 mm, such as between about 9 mm and about 11 mm, depending on the size of one or more semiconductor dies 1026 (shown in FIG. 10B) to be embedded therein during package fabrication (described in greater detail below). Semiconductor dies generally include a plurality of integrated electronic circuits that are formed on and/or within a substrate material, such as a piece of semiconductor material. In certain embodiments, the cavities 305 are sized to have lateral dimensions substantially similar to that of the dies 1026 to be embedded therein. For example, each cavity 305 is formed having lateral dimensions exceeding those of the dies 1026 by less than about 150 μm, such as less than about 120 μm, such as less than 100 μm. Having a reduced variance in the size of the cavities 305 and the dies 1026 to be embedded therein reduces the amount of gap-fill material utilized thereafter.

In certain embodiments, each via 303 has a diameter ranging between about 50 μm and about 200 μm, such as between about 60 μm and about 130 μm, such as between about 80 μm and 110 μm. A minimum pitch 807 between the center of a via 303 in row 801 and a center of an adjacent via 303 in row 802 is between about 70 μm and about 200 μm, such as between about 85 μm and about 160 μm, such as between about 100 μm and 140 μm. Although embodiments are described with reference to FIG. 8, the substrate structuring processes described above with reference to operations 210-240 and FIGS. 2, 3A-3B, 4A-4C, 5A-5C, 6A-6C, and 7A-7B may be utilized to form patterned features in the substrate 302 having any desired depth, lateral dimensions, and morphologies.

Figure 9:
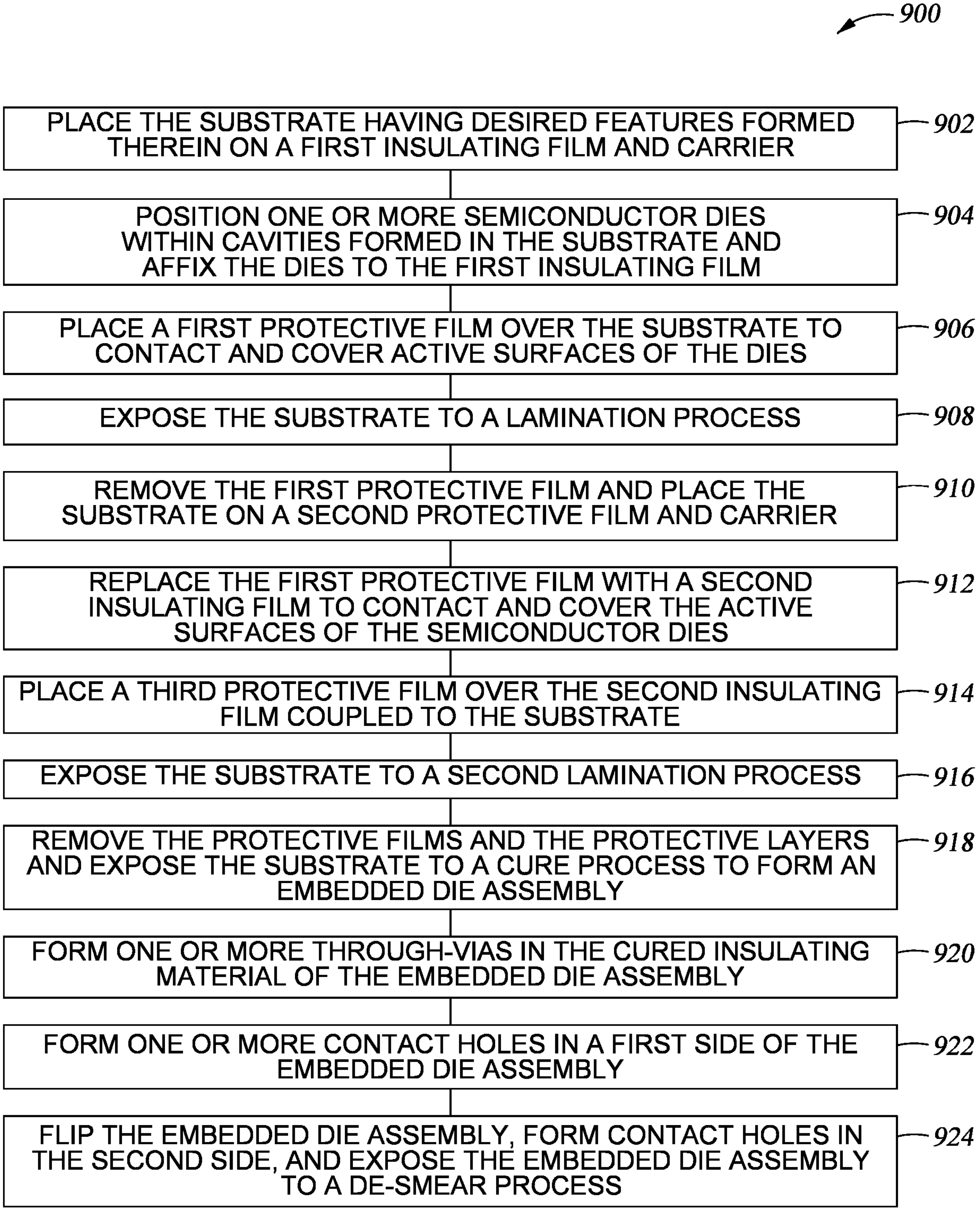
FIG. 9 illustrates a flow diagram of a process for forming an embedded die assembly having through-assembly vias and contact holes, according to embodiments described herein.

After structuring of the substrate 302, one or more packages are formed around the substrate 302 by utilizing the substrate 302 as a core frame. FIGS. 9 and 11 illustrate flow diagrams of representative methods 900 and 1100, respectively, for fabricating an intermediary embedded die assembly 1002 around the substrate 302 prior to final package formation. FIGS. 10A-10M schematically illustrate cross-sectional views of the substrate 302 at different stages of the method 900 depicted in FIG. 9, and FIGS. 12A-12H schematically illustrate cross-sectional views of the substrate 302 at different stages of the method 1100 depicted in FIG. 11. For clarity, FIG. 9 and FIGS. 10A-10M are herein described together, and FIG. 11 and FIGS. 12A-12H are herein described together.

Figure 10A:
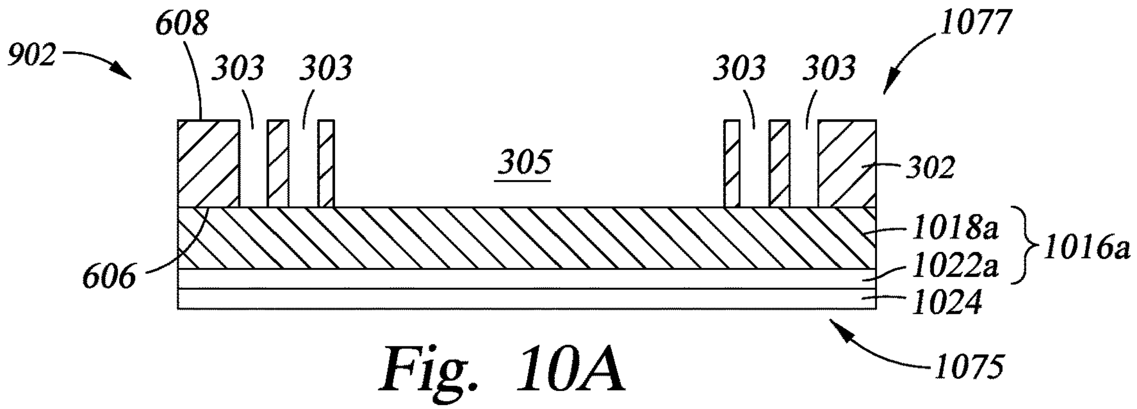
FIGS. 10A-10M schematically illustrate cross-sectional views of the embedded die assembly at different stages of the process depicted in FIG. 9, according to embodiments described herein.
Figure 11:
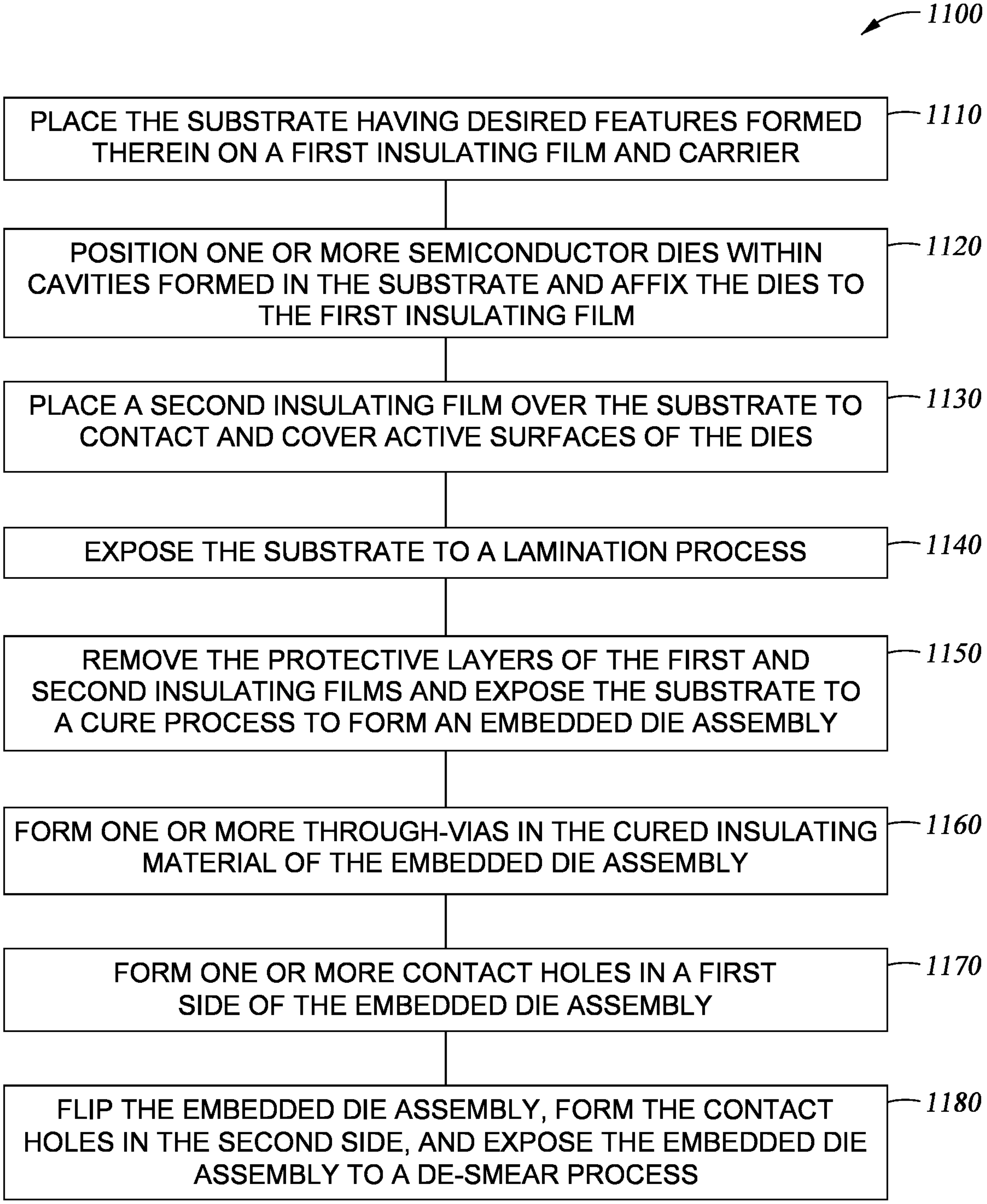
FIG. 11 illustrates a flow diagram of a process for forming an embedded die assembly having through-assembly vias and contact holes, according to embodiments described herein.

Generally, the method 900 begins at operation 902 and FIG. 10A wherein a first side 1075 (e.g., surface 606, which may have an oxide layer or metal cladding layer formed thereon) of the substrate 302, now having desired features formed therein, is placed on a first insulating film 1016*a*. In certain embodiments, the first insulating film 1016*a* includes one or more layers formed of polymer-based dielectric materials. For example, the first insulating film 1016*a* includes one or more layers formed of flowable build-up materials. In the embodiment depicted in FIG. 10A, the first insulating film 1016*a* includes a flowable layer 1018*a*. The flowable layer 1018*a* may be formed of a ceramic-filler-containing epoxy resin, such as an epoxy resin filled with (e.g., containing) silica ($SiO_2$) particles. Other examples of ceramic fillers or particles that may be utilized to form the flowable layer 1018*a* and other layers of the insulating film 1016*a* include aluminum nitride (AlN), aluminum oxide ($Al_2O_3$), silicon carbide (SiC), silicon nitride ($Si_3N_4$), $Sr_2Ce_2Ti_5O_{16}$, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like. In some examples, the ceramic fillers utilized to form the flowable layer 1018*a* have particles ranging in size between about 40 nm and about 1.5 μm, such as between about 80 nm and about 1 μm. For example, the ceramic fillers utilized to form the flowable layer 1018*a* have particles ranging in size between about 200 nm and about 800 nm, such as between about 300 nm and about 600 nm. In some embodiments, the ceramic fillers utilized to form the flowable layer 1018*a* include particles having a size less than about 25% of the desired feature (e.g., via, cavity, or through-assembly via) width or diameter, such as less than about 15% of the desired feature width or diameter.

The flowable layer 1018*a* typically has a thickness less than about 60 μm, such as between about 5 μm and about 50 μm. For example, the flowable layer 1018*a* has a thickness between about 10 μm and about 25 μm. In certain embodiments, the insulating film 1016*a* further includes one or more support layers. For example, the insulating film 1016*a* includes a polyethylene terephthalate (PET) or similar lightweight plastic support layer 1022*a*. However, any suitable combination of layers and insulating materials is contemplated for the insulating film 1016*a*. In some embodiments, the entire insulating film 1016*a* has a thickness less than about 120 μm, such as a thickness less than about 90 μm.

The substrate 302, which is coupled to the insulating film 1016*a* on the first side 1075 thereof, and specifically to the flowable layer 1018*a* of the insulating film 1016*a*, may further be optionally placed on a carrier 1024 for mechanical support during later processing operations. The carrier is formed of any suitable mechanically and thermally stable material. For example, the carrier 1024 is formed of polytetrafluoroethylene (PTFE). In another example, the carrier 1024 is formed of PET.

Figure 10B:
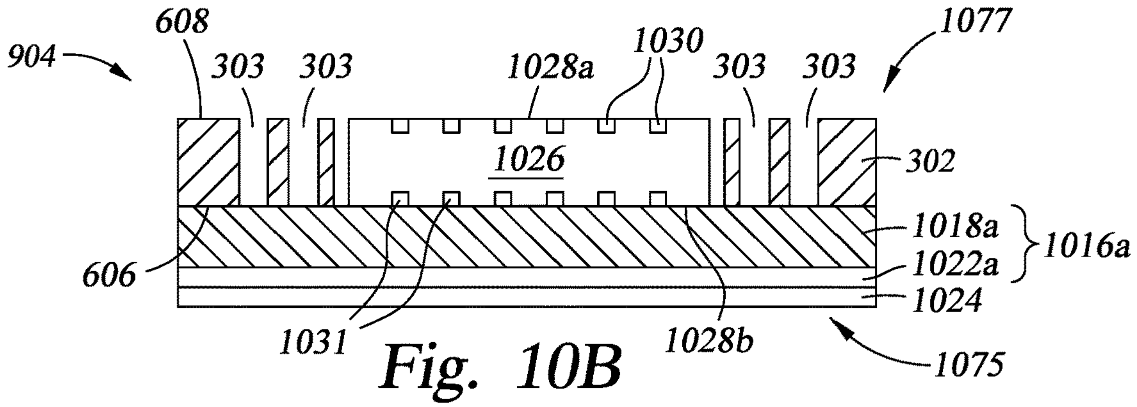

At operation 904 and depicted in FIG. 10B, one or more semiconductor dies 1026 are placed within the cavities 305 formed in the substrate 302 (a single semiconductor die 1026 is depicted in FIG. 10B). The dies 1026 are placed within the cavities 305 using, e.g., a vacuum gripper, and positioned onto a surface of the insulating film 1016*a* exposed through the cavities 305. In certain embodiments, the dies 1026 are placed on an adhesive layer (not shown) disposed or formed on the insulating film 1016*a* to secure the dies 1026 in place. In certain embodiments, during placement of the semiconductor dies 1026, the substrate 302 and/or insulating film 1016*a* are heated to provide additional adhesion between the semiconductor dies 1026 and the insulating film 1016*a*, thus reducing shifting of the semiconductor dies 1026 during placement. For example, in certain embodiments, the carrier 1024 may be heated during placement of the semiconductor dies 1026.

In certain embodiments, the dies 1026 include active multipurpose dies having one or more integrated circuits formed thereon. For example, in such embodiments, the dies 1026 may include one or more signal contacts 1030 for signal-carrying interconnects formed on a front side 1028*a* thereof. In further embodiments, the dies 1026 may also include a back side power delivery network with power contacts 1031 formed on a back side 1028*b* thereof. Such dies may be referred to as “double-sided” dies. An exemplary double-sided die is depicted in FIG. 10M and described below. In still other embodiments, however, dies 1026 may include a passive dies or components, such as capacitors, resistors, inductors, RF components, and the like.

Figure 10C:
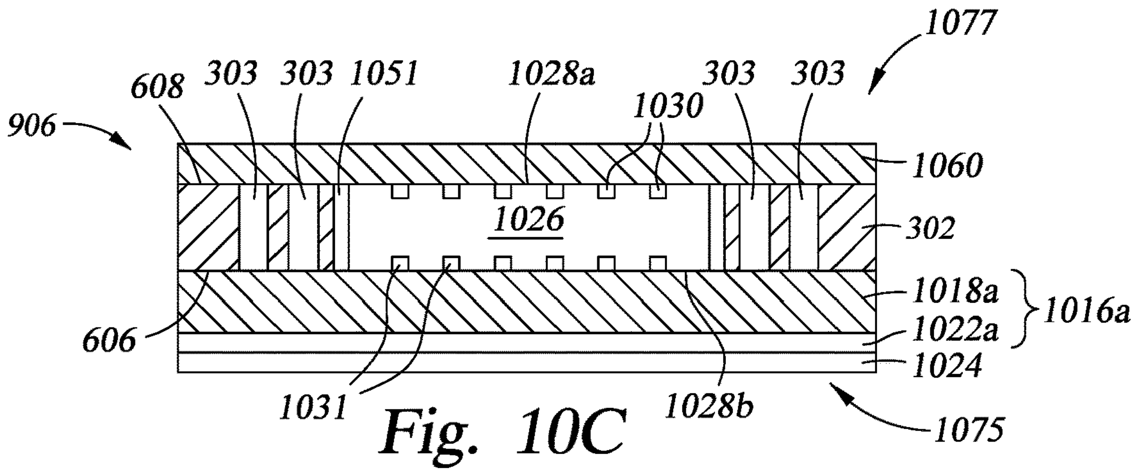

After placement of the dies 1026 within the cavities 305, a first protective film 1060 is placed over a second side 1077 (e.g., surface 608) of the substrate 302 at operation 906 and FIG. 10C. The protective film 1060 is coupled to the second side 1077 of the substrate 302 and opposite of the first insulating film 1016*a* such that it contacts and covers the active surfaces 1028 of the dies 1026 disposed within the cavities 305. In certain embodiments, the protective film 1060 is formed of a similar material to that of the support layer 1022*a*. For example, the protective film 1060 is formed of PET, such as biaxial PET. However, the protective film 1060 may be formed of any suitable protective materials. In some embodiments, the protective film 1060 has a thickness between about 50 μm and about 150 μm.

Figure 10D:
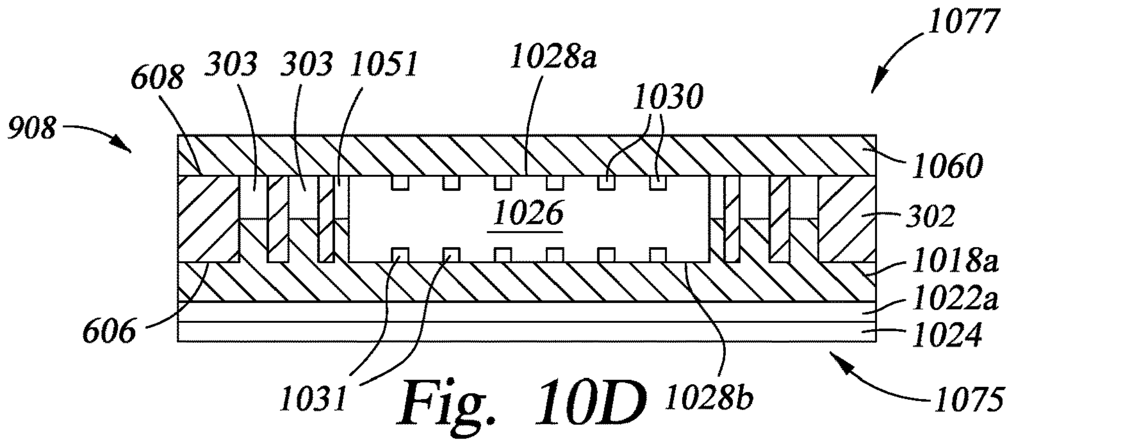

The substrate 302, now affixed to the insulating film 1016*a* on the first side 1075 and the protective film 1060 on the second side 1077 and further having dies 1026 disposed therein, is exposed to a lamination process at operation 908. During the lamination process, the substrate 302 is exposed to elevated temperatures, causing the flowable layer 1018*a* of the insulating film 1016*a* to soften and flow into the open voids or volumes between the insulating film 1016*a* and the protective film 1060, such as into the vias 303 and gaps 1051 between the interior walls of the cavities 305 and the dies 1026. Accordingly, the semiconductor dies 1026 become at least partially embedded within the material of the insulating film 1016*a* and the substrate 302, as depicted in FIG. 10D.

In certain embodiments, the lamination process is a vacuum lamination process that may be performed in an autoclave or other suitable device. In certain embodiments, the lamination process is performed by use of a hot pressing process. In certain embodiments, the lamination process is performed at a temperature of between about 80° C. and about 140° C. and for a period between about 5 seconds and about 1.5 minutes, such as between about 30 seconds and about 1 minute. In some embodiments, the lamination process includes the application of a pressure of between about 1 psig and about 50 psig while a temperature of between about 80° C. and about 140° C. is applied to substrate 302 and insulating film 1016*a* for a period between about 5 seconds and about 1.5 minutes. For example, the lamination process is performed at a pressure of between about 5 psig and about 40 psig, a temperature of between about 100° C. and about 120° C. for a period between about 10 seconds and about 1 minute. For example, the lamination process is performed at a temperature of about 110° C. for a period of about 20 seconds.

Figure 10E:
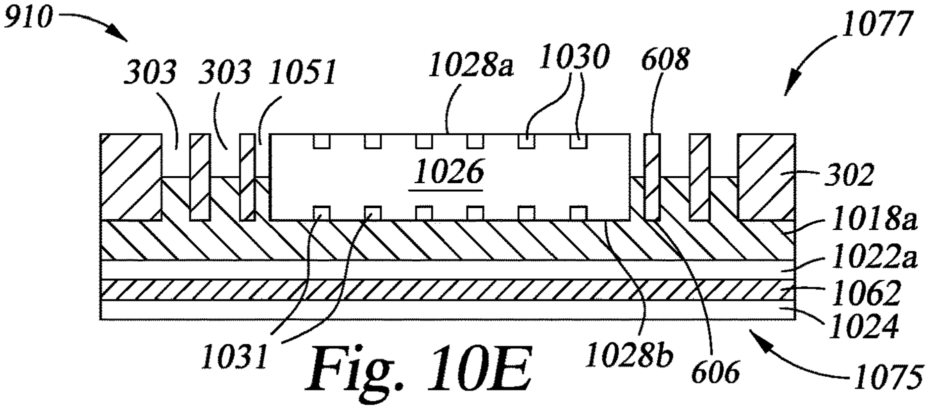

At operation 910, the protective film 1060 is removed and the substrate 302, now having the laminated insulating material of the flowable layer 1018*a* at least partially surrounding the substrate 302 and the one or more dies 1026, is placed on a second protective film 1062. As depicted in FIG. 10E, the second protective film 1062 is coupled to the first side 1075 of the substrate 302 such that the second protective film 1062 is disposed against (e.g., adjacent) the support layer 1022*a* of the insulating film 1016*a*. In some embodiments, the substrate 302, now coupled to the protective film 1062, may be optionally placed on the carrier 1024 for additional mechanical support on the first side 1075. In some embodiments, the protective film 1062 is placed on the carrier 1024 prior to coupling the protective film 1062 with the substrate 302, now laminated with the insulating film 1016*a*. Generally, the protective film 1062 is substantially similar in composition to the protective film 1060. For example, the protective film 1062 may be formed of PET, such as biaxial PET. However, the protective film 1062 may be formed of any suitable protective materials. In some embodiments, the protective film 1062 has a thickness between about 50 μm and about 150 μm.

Figure 10F:
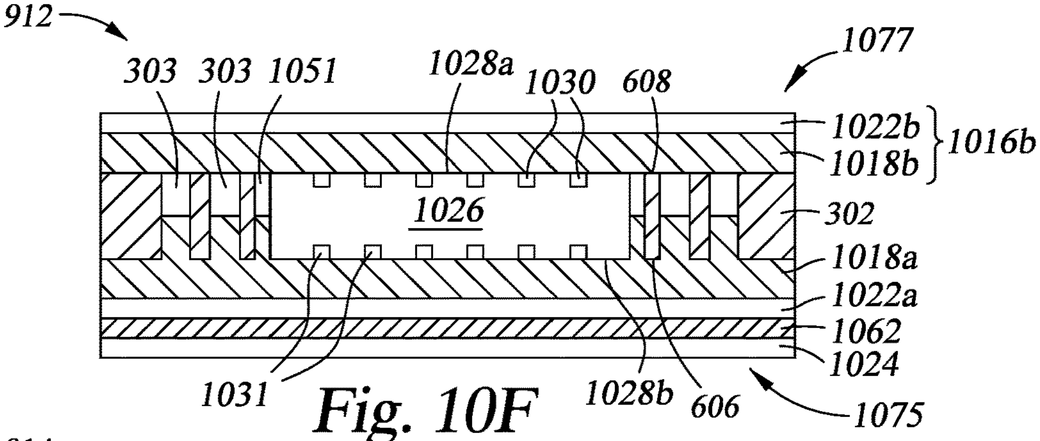

Upon coupling the substrate 302 to the second protective film 1062, a second insulating film 1016*b* substantially similar to the first insulating film 1016*a* is placed on the second side 1077 of the substrate 302 at operation 912 and FIG. 10F, thus replacing the protective film 1060. In certain embodiments, the second insulating film 1016*b* is positioned on the second side 1077 of the substrate 302 such that a flowable layer 1018*b* of the second insulating film 1016*b* contacts and covers the active surface 1028 of the dies 1026 within the cavities 305. In certain embodiments, the placement of the second insulating film 1016*b* on the substrate 302 may form one or more voids between the insulating film 1016*b* and the already-laminated insulating material of the flowable layer 1018*a* partially surrounding the one or more dies 1026. The second insulating film 1016*b* may include one or more layers formed of flowable, polymer-based dielectric materials. As depicted in FIG. 10F, the second insulating film 1016*b* includes a flowable layer 1018*b* which is similar to the flowable layer 1018*a* described above. The second insulating film 1016*b* may further include a support layer 1022*b* formed of similar materials to the support layer 1022*a*, such as PET or other lightweight plastic materials.

Figure 10G:
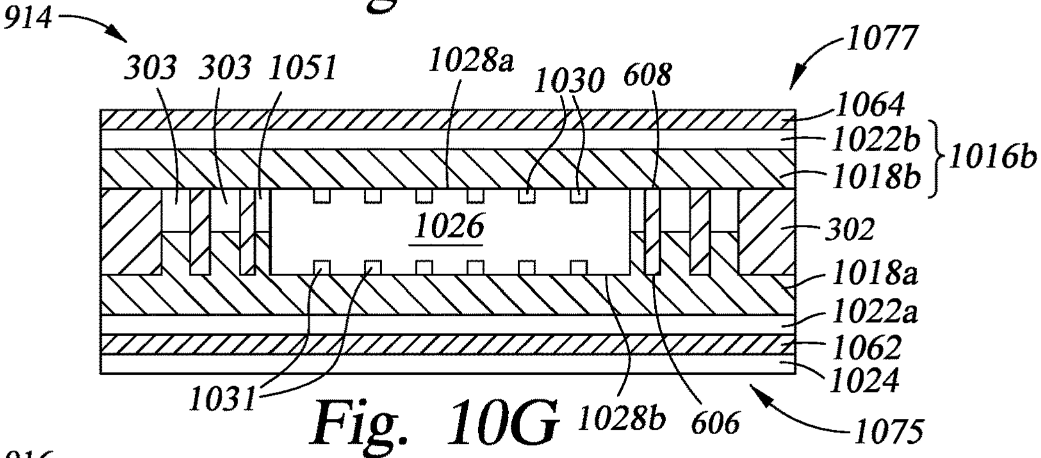

At operation 914, a third protective film 1064 is placed over the second insulating film 1016*b*, as depicted in FIG. 10G. Generally, the protective film 1064 is substantially similar in composition to the protective films 1060, 1062. For example, the protective film 1064 is formed of PET, such as biaxial PET. However, the protective film 1064 may be formed of any suitable protective materials. In some embodiments, the protective film 1064 has a thickness between about 50 μm and about 150 μm.

Figure 10H:
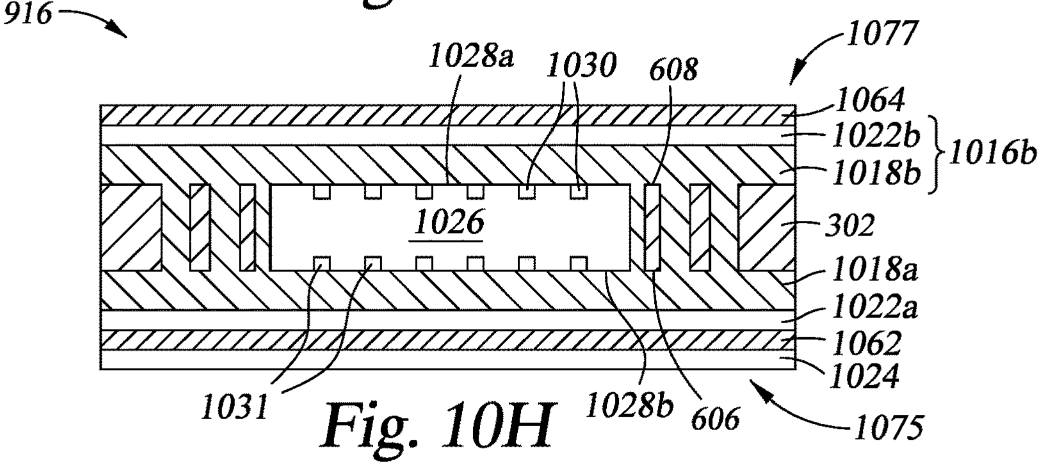

The substrate 302, now affixed to the insulating film 1016*b* and support layer 1064 on the second side 1077 and the protective film 1062 and optional carrier 1024 on the first side 1075, is exposed to a second lamination process at operation 916 and FIG. 10H. Similar to the lamination process at operation 908, the substrate 302 is exposed to elevated temperatures, causing the flowable layer 1018*b* of the insulating film 1016*b* to soften and flow into any open voids or volumes between the insulating film 1016*b* and the already-laminated insulating material of the flowable layer 1018*a*, thus integrating itself with the insulating material of the flowable layer 1018*a*. Accordingly, the cavities 305 and the vias 303 become filled (e.g. packed, sealed) with insulating material, and the semiconductor dies 1026 previously placed within the cavities 305 become entirely embedded within the insulating material of the flowable layers 1018*a*, 1018*b*.

In certain embodiments, the lamination process is a vacuum lamination process that may be performed in an autoclave or other suitable device. In certain embodiments, the lamination process is performed by use of a hot pressing process. In certain embodiments, the lamination process is performed at a temperature of between about 80° C. and about 140° C. and for a period between about 1 minute and about 30 minutes. In some embodiments, the lamination process includes the application of a pressure of between about 10 psig and about 150 psig while a temperature of between about 80° C. and about 140° C. is applied to substrate 302 and insulting film 1016*b* for a period between about 1 minute and about 30 minutes. For example, the lamination process is performed at a pressure of between about 20 psig and about 100 psig, a temperature of between about 100° C. and about 120° C. for a period between about 2 minutes and 10 minutes. For example, the lamination process is performed at a temperature of about 110° C. for a period of about 5 minutes.

Figure 10I:
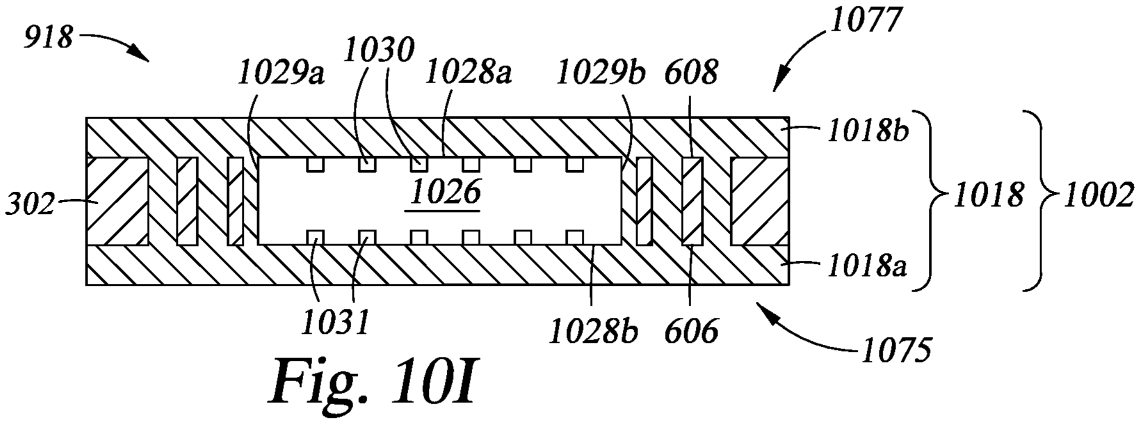
Figure 10J:
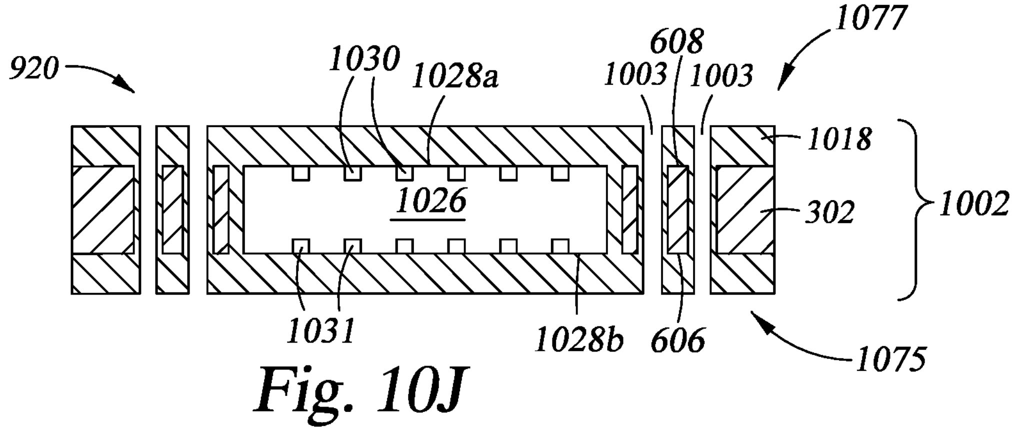

After lamination, the substrate 302 is disengaged from the carrier 1024 and the protective films 1062, 1064 are removed at operation 918, resulting in a laminated embedded die assembly 1002. As depicted in FIG. 10I, the embedded die assembly 1002 includes the substrate 302 having one or more cavities 305 and/or vias 303 formed therein and filled with the insulating dielectric material of the flowable layers 1018*a*, 1018*b*, as well as the embedded dies 1026 within the cavities 305. The insulating dielectric material of the flowable layers 1018*a*, 1018*b* encases the substrate 302 such that the insulating material covers at least two surfaces or sides of the substrate 302, such as the two major surfaces 606, 608, and covers all sides of the embedded semiconductor dies 1026. In some examples, the support layers

1022*a*, 1022*b* are also removed from the embedded die assembly 1002 at operation 918. Generally, the support layers 1022*a* and 1022*b*, the carrier 1024, and the protective films 1062 and 1064 are removed from the embedded die assembly 1002 by any suitable mechanical processes, such as peeling therefrom.

Upon removal of the support layers 1022*a*, 1022*b* and the protective films 1062, 1064, the embedded die assembly 1002 is exposed to a cure process to fully cure (i.e. harden through chemical reactions and cross-linking) the insulating dielectric material of the flowable layers 1018*a*, 1018*b*, thus forming a cured insulating layer 1018. The insulating layer 1018 substantially surrounds the substrate 302 and the semiconductor dies 1026 embedded therein. For example, the insulating layer 1018 contacts or encapsulates at least the sides 1075, 1077 of the substrate 302 (including surfaces 606, 608) and at least six sides or surfaces of each semiconductor die 1026, which has a rectangular prism shape as illustrated in FIG. 10I (i.e., only four surfaces 1028*a*, 10298*b* and 1029*a*, 1029*b* are shown in 2D view).

In certain embodiments, the cure process is performed at high temperatures to fully cure the embedded die assembly 1002. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 918 is performed at or near ambient (e.g. atmospheric) pressure conditions.

After curing, one or more through-assembly vias 1003 are drilled through the embedded die assembly 1002 at operation 920, forming channels through the entire thickness of the embedded die assembly 1002 for subsequent interconnection formation. In some embodiments, the embedded die assembly 1002 may be placed on a carrier, such as the carrier 1024, for mechanical support during the formation of the through-assembly vias 1003 and subsequent contact holes 1032. The through-assembly vias 1003 are drilled through the vias 303 that were formed in the substrate 302 and subsequently filled with the insulating layer 1018. Thus, the through-assembly vias 1003 may be circumferentially surrounded by the insulating layer 1018 filled within the vias 303. By having the ceramic-filler-containing epoxy resin material of the insulating layer 1018 line the walls of the vias 303, capacitive coupling between the conductive silicon-based substrate 302 and interconnections 1444 (described with reference to FIG. 13 and FIGS. 14E-14H), and thus capacitive coupling between adjacently positioned vias 303 and/or redistribution connections 1644 (described with reference to FIG. 15 and FIGS. 16H-16L), in the completed package 1602 (described with reference to FIG. 15 and FIGS. 16K and 16L) is significantly reduced as compared to other conventional interconnecting structures that utilize conventional via insulating liners or films. Furthermore, the flowable nature of the epoxy resin material enables more consistent and reliable encapsulation and insulation, thus enhancing electrical performance by minimizing leakage current of the completed package 1602.

In certain embodiments, the through-assembly vias 1003 have a diameter less than about 100 μm, such as less than about 75 μm. For example, the through-assembly vias 1003 have a diameter less than about 60 μm, such as less than about 50 μm. In certain embodiments, the through-assembly vias 1003 have a diameter of between about 25 μm and about 50 μm, such as a diameter of between about 35 μm and about 40 μm. In certain embodiments, the through assembly vias 1003 are formed using any suitable mechanical process. For example, the through-assembly vias 1003 are formed using a mechanical drilling process. In certain embodiments, through-assembly vias 1003 are formed through the embedded die assembly 1002 by laser ablation. For example, the through-assembly vias 1003 are formed using an ultraviolet laser. In certain embodiments, the laser source utilized for laser ablation has a frequency between about 5 kHz and about 500 kHz. In certain embodiments, the laser source is configured to deliver a pulsed laser beam at a pulse duration between about 10 ns and about 100 ns with a pulse energy of between about 50 microjoules (μJ) and about 500 μJ. Utilizing an epoxy resin material having small ceramic filler particles further promotes more precise and accurate laser patterning of small-diameter vias, such as the vias 1003, as the small ceramic filler particles therein exhibit reduced laser light reflection, scattering, diffraction and transmission of the laser light away from the area in which the via is to be formed during the laser ablation process.

Figure 10K:
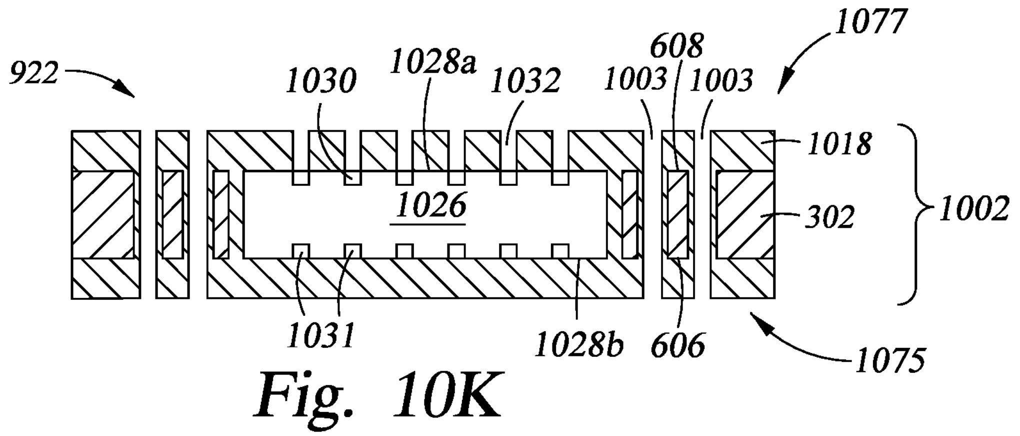

At operation 922 and FIG. 10K, one or more contact holes 1032 are drilled through the insulating layer 1018 on the second side 1077 of the embedded die assembly to expose one or more signal contacts 1030 formed on the front side 1028*a* of each embedded die 1026. The contact holes 1032 are drilled through the insulating layer 1018 by laser ablation, leaving all external surfaces of the semiconductor dies 1026 covered and surrounded by the insulating layer 1018 and the signal contacts 1030 exposed. Thus, the signal contacts 1030 are exposed by the formation of the contact holes 1032 at operation 922. In certain embodiments, the laser source may generate a pulsed laser beam having a frequency between about 100 kHz and about 1000 kHz. In certain embodiments, the laser source is configured to deliver a pulsed laser beam at a wavelength of between about 100 nm and about 2000 nm, at a pulse duration between about 10E-4 ns and about 10E-2 ns, and with a pulse energy of between about 10 μJ and about 300 μJ. In certain embodiments, the contact holes 1032 are drilled using a $CO_2$, green, or UV laser. In certain embodiments, the contact holes 1032 have a diameter of between about 5 μm and about 60 μm, such as a diameter of between about 20 μm and about 50 μm.

Figure 10L:
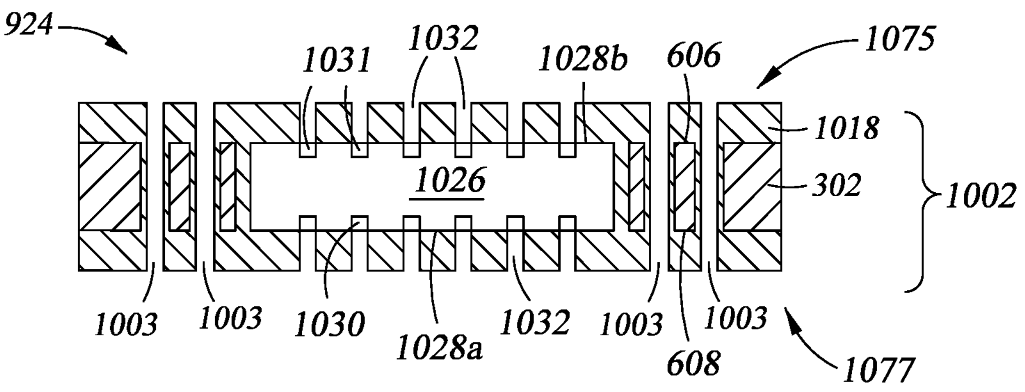
Figure 10M:
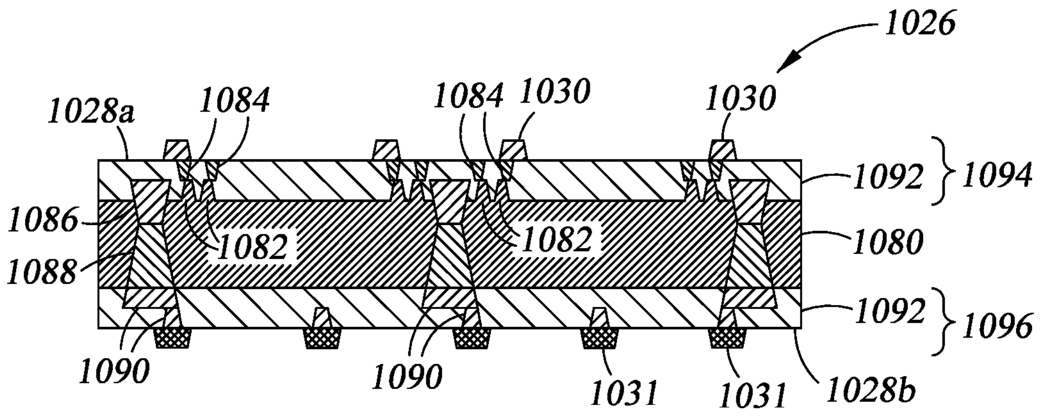

In embodiments where the dies 1026 are double-sided dies, the embedded die assembly 1002 is flipped over at operation 924 and FIG. 10L, and one or more contact holes 1032 are drilled through the insulating layer 1018 on the first side 1075 of the embedded die assembly to expose one or more power contacts 1031 formed on the back side 1028*b* of each embedded die 1026. The contact holes 1032 may be formed via substantially similar methods as described with reference to operation 922, e.g., laser ablation, and may have substantially similar dimensions.

After formation of all desired contact holes 1032, the embedded die assembly 1002 is exposed to a de-smear process to remove any unwanted residues and/or debris caused by laser ablation during the formation of the through-assembly vias 1003 and the contact holes 1032. The de-smear process thus cleans the through-assembly vias 1003 and contact holes 1032 and fully exposes the contacts 1030 on the active surfaces 1028 of the embedded die 1026 for subsequent metallization. In certain embodiments, the de-smear process is a wet de-smear process. Any suitable aqueous etchants, solvents, and/or combinations thereof may be utilized for the wet de-smear process. In one example, potassium permanganate ($KMnO_4$) solution may be utilized as an etchant. Depending on the residue thickness, exposure of the embedded die assembly 1002 to the wet de-smear process at operation 922 may be varied. In another embodiment, the de-smear process is a dry de-smear process. For example, the de-smear process may be a plasma de-smear process with an $O_2$:$CF_4$ mixture gas. The plasma de-smear process may include generating a plasma by applying a power of about 700 W and flowing $O_2$:$CF_4$ at a ratio of about 10:1 (e.g., 100:10 sccm) for a time period between about 60 seconds and about 120 seconds. In further embodiments, the de-smear process is a combination of wet and dry processes.

Following the de-smear process, the embedded die assembly 1002 is ready for formation of interconnection paths therein, described below with reference to FIG. 13 and FIGS. 14A-14H.

FIG. 10M schematically illustrates an exemplary double-sided die 1026 that may be utilized with the semiconductor device package structures and methods described herein. In more conventional semiconductor chips, all interconnections (power and signal) are typically disposed on a single side of a silicon substrate or core, along with the transistors. Thus, as transistors continue to be made smaller, the interconnections that connect them with other devices or device elements must be packed ever closer and made ever finer, especially since they share space with power interconnections. This may lead to increased resistance, RC related limitations and power loss, creating chip design and device packaging issues. By utilizing a double-sided chip like the example in FIG. 10M, interconnects for power distribution and signal relay may be segregated to separate sides of the chip, thus enabling more lateral space for larger power connections to facilitate delivery of more power to the transistors, while simultaneously enabling more space for signal interconnections.

As shown in FIG. 10M, the double-sided die 1026 includes a core 1080 having a signal portion 1094 formed on a first side of the core 1080 and a power delivery portion 1096 formed on a second, opposing side thereof. The core 1080 may generally be formed of any suitable silicon-containing materials, including materials described with reference to 302 such as silicon, crystalline silicon (e.g., Si<100> or Si<111>), silicon oxide, silicon germanium, doped or undoped silicon, doped or undoped polysilicon, silicon nitride, monocrystalline p-type or n-type silicon, polycrystalline p-type or n-type silicon, and the like. The core 1080 may alternately be formed of any suitable silicon containing glass material.

The signal portion 1096 comprises one or more integrated circuits having transistors (represented by fins 1082) and signal interconnections 1084, which are conductively coupled to signal contacts 1030 on the first surface 1028_a_ of die 1026. In certain embodiments, transistors 1082 and signal interconnections 1084 are disposed within a dielectric insulating layer 1092 formed over the core 1080, such as a silicon dioxide or other oxide insulator. The signal interconnections 1084 may be formed of any suitable conductive materials, including copper, cobalt, ruthenium, nickel, aluminum, gold, silver, palladium, tin, molybdenum or the like.

The power delivery portion 1096 comprises a network (e.g., a power delivery network, or "PDN") of one or more power interconnections 1090, which extend from the second side of the core 1080 to the power contacts 1031 on the second surface 1028_b_ of die 1026. Similar to the signal interconnections, the power interconnections 1090 may be formed of any suitable conductive materials, including copper, cobalt, ruthenium, nickel, aluminum, gold, silver, palladium, tin, molybdenum or the like, and may be disposed within a dielectric insulating layer 1092 formed of an oxide insulator.

To electrically couple the transistors 1082 and/or signal interconnections 1084 to the power delivery portion 1096 (e.g., power interconnections 1090), one or more buried power rails 1086 may be formed through at least a portion of the core 1080 and connected to transistors 1082 and/or signal interconnections 1084. The buried power rails 1086 provide power connections that extend below the transistors and through the core 1080, towards the power delivery portion 1096, thus enabling more space on the first side of the core 1080 for integration of circuits. In particular, the buried power rails 1086 facilitate more space for signal-carrying interconnects above the transistors, thus enabling increased circuit densities and improved performance capability of the die 1027.

In certain embodiments, the buried power rails 1086 extend from the signal portion 1096 and across an entire thickness of the core 1080 to couple with power interconnections 1090. In certain other embodiments, as shown in FIG. 10M, the buried power rails 1086 extend across a portion of the thickness of the core 1080. In such embodiments, the buried power rails may be electrically coupled to through-silicon interconnects 1088, which may be further coupled to power interconnections 1090 and extend from the power delivery portion 1096 into the core 1088.

As discussed above, FIG. 9 and FIGS. 10A-10M illustrate a representative method 900 for forming the intermediary embedded die assembly 1002. FIG. 11 and FIGS. 12A-12H illustrate an alternative method 1100 substantially similar to the method 900 but with fewer operations. The method 1100 generally includes seven operations 1110-1180. However, operations 1110, 1120, 1160, 1170, and 1180 of the method 1100 are substantially similar to the operations 902, 904, 920, 922, and 924 of the method 900, respectively. Thus, only operations 1130, 1140, and 1150, depicted in FIGS. 12C, 12D, and 12E, respectively, are herein described for clarity.

Figure 12A:
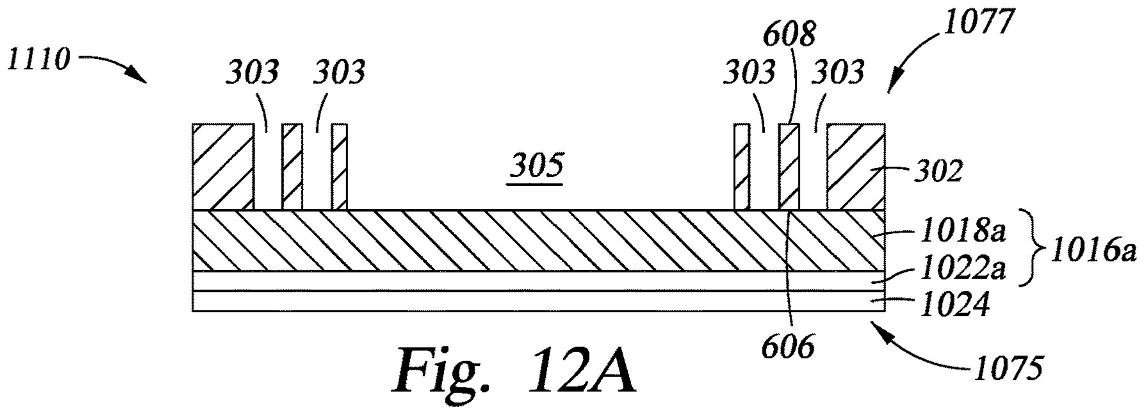
FIGS. 12A-12H schematically illustrate cross-sectional views of the embedded die assembly at different stages of the process depicted in FIG. 11, according to embodiments described herein.
Figure 12B:
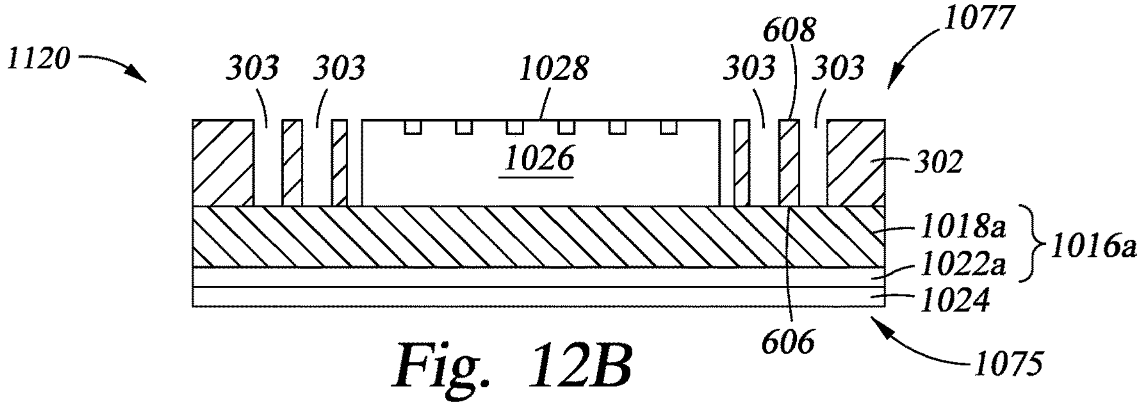
Figure 12C:
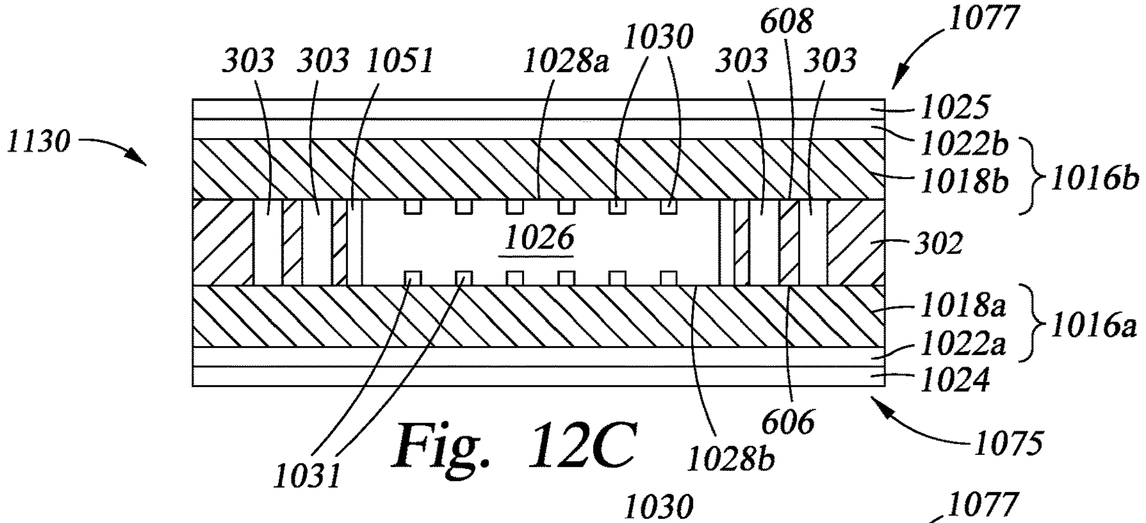

After placement of the one or more semiconductor dies 1026 onto a surface of the insulating film 1016_a_ exposed through the cavities 305, the second insulating film 1016_b_ is positioned over the second side 1077 (e.g., surface 608) of the substrate 302 at operation 1130 and FIG. 12C, prior to lamination. In some embodiments, the second insulating film 1016_b_ is positioned on the second side 1077 of the substrate 302 such that the flowable layer 1018_b_ of the second insulating film 1016_b_ contacts and covers the active surface 1028 of the dies 1026 within the cavities 305. In some embodiments, a second carrier 1025 is affixed to the support layer 1022_b_ of the second insulating film 1016_b_ for additional mechanical support during later processing operations. As depicted in FIG. 12C, one or more voids 1050 are formed between the insulating films 1016_a_ and 1016_b_ through the vias 303 and gaps 1051 between the semiconductor dies 1026 and interior walls of the cavities 305.

Figure 12D:
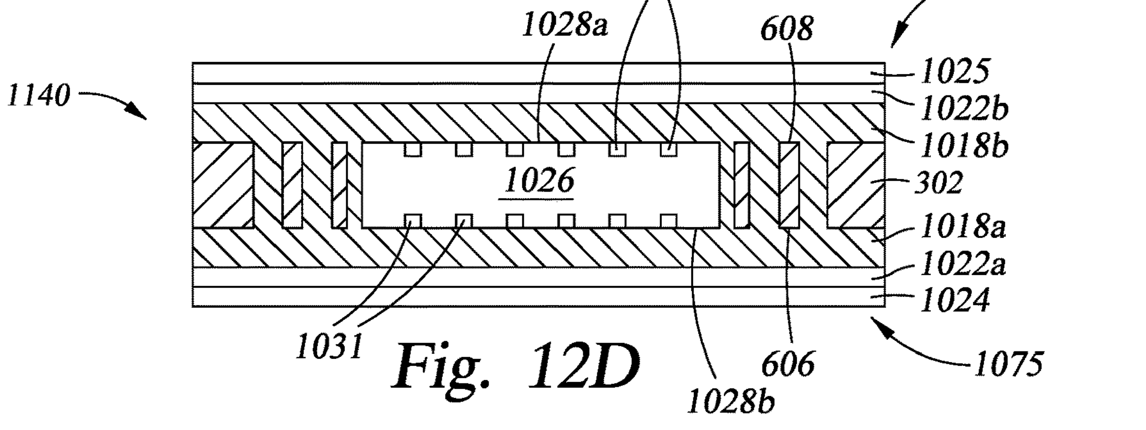

At operation 1140 and FIG. 12D, the substrate 302, now affixed to the insulating films 1016_a_ and 1016_b_ and having dies 1026 disposed therein, is exposed to a single lamination process. During the single lamination process, the substrate 302 is exposed to elevated temperatures, causing the flowable layers 1018_a_ and 1018_b_ of both insulating films 1016_a_, 1016_b_ to soften and flow into the open voids or volumes between the insulating films 1016_a_, 1016_b_, such as into the vias 303 and gaps 1051 between the interior walls of the cavities 305 and the dies 1026. Accordingly, the semiconductor dies 1026 become embedded within the material of the insulating films 1016*a*, 1016*b* and the vias 303 filled therewith.

Similar to the lamination processes described with reference to FIG. 9 and FIGS. 10A-10K, the lamination process at operation 1140 may be a vacuum lamination process that may be performed in an autoclave or other suitable device. In another embodiment, the lamination process is performed by use of a hot pressing process. In certain embodiments, the lamination process is performed at a temperature of between about 80° C. and about 140° C. and for a period between about 1 minute and about 30 minutes. In some embodiments, the lamination process includes the application of a pressure of between about 1 psig and about 150 psig while a temperature of between about 80° C. and about 140° C. is applied to substrate 302 and insulating film 1016*a*, 1016*b* layers for a period between about 1 minute and about 30 minutes. For example, the lamination process is performed at a pressure of between about 10 psig and about 100 psig, a temperature of between about 100° C. and about 120° C. for a period between about 2 minutes and 10 minutes. For example, the lamination process is performed at a temperature of about 110° C. for a period of about 5 minutes.

Figure 12E:
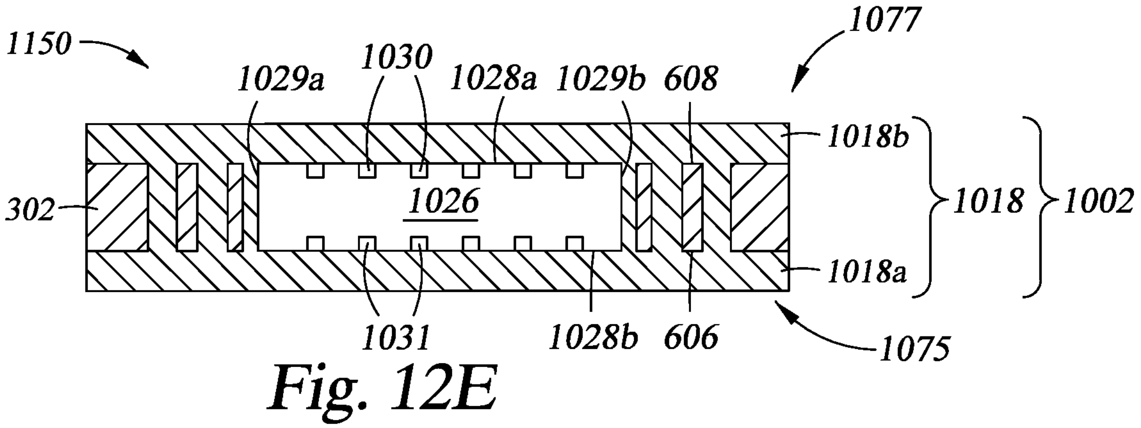
Figure 12F:
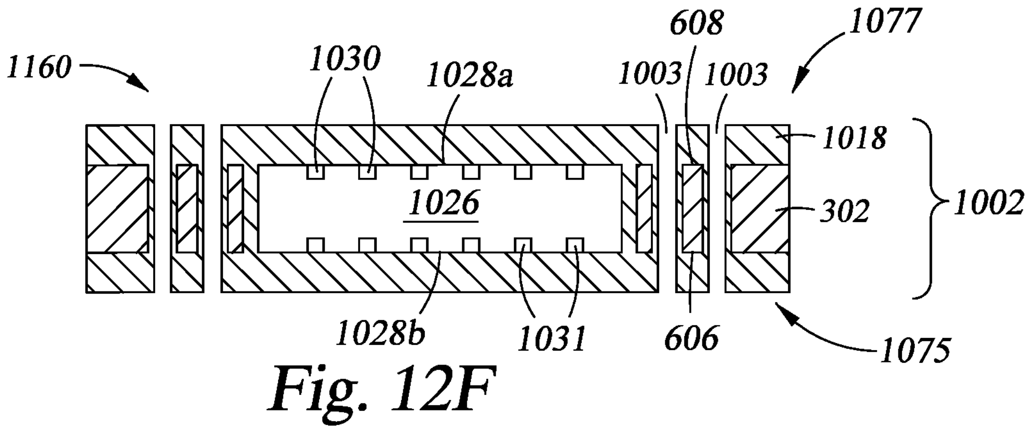
Figure 12G:
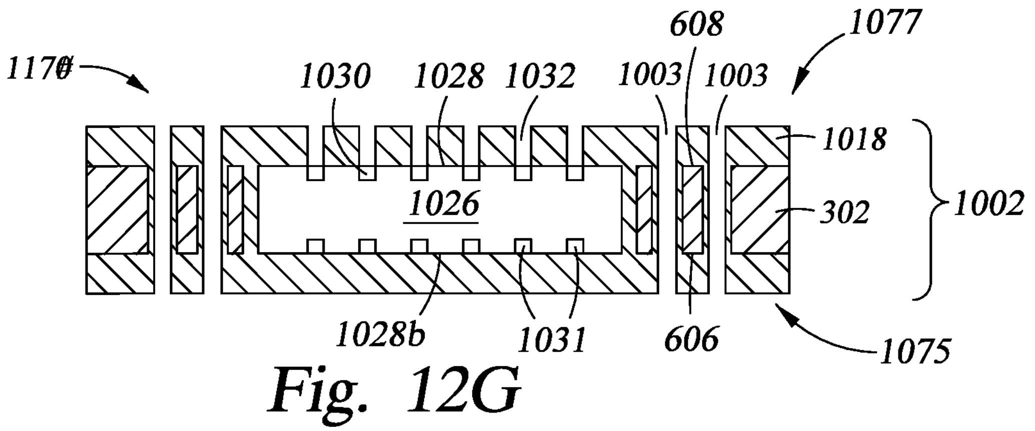
Figure 12H:
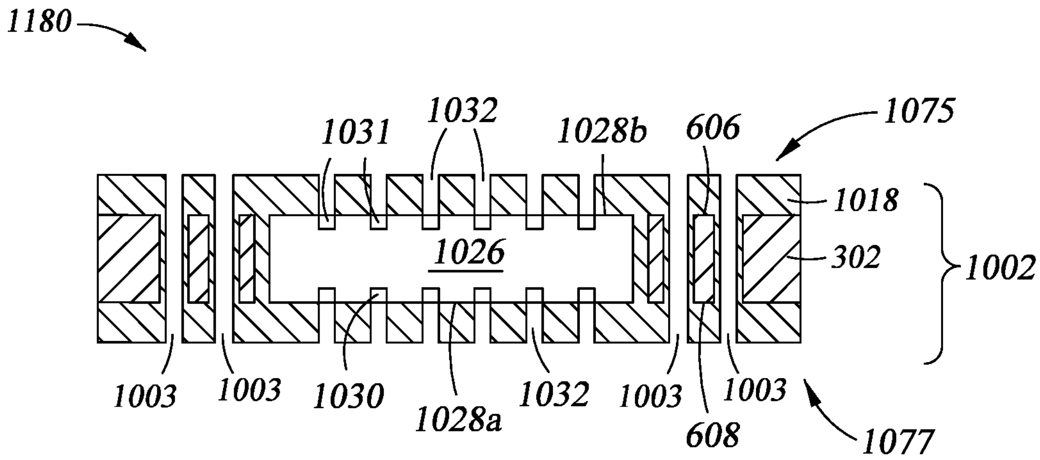

At operation 1150, the one or more support layers of the insulating films 1016*a* and 1016*b* are removed from the substrate 302, resulting in the laminated embedded die assembly 1002. As depicted in FIG. 12E, the embedded die assembly 1002 includes the substrate 302 having one or more cavities 305 and/or vias 303 formed therein and filled with the insulating dielectric material of the flowable layers 1018*a*, 1018*b*, as well as the embedded dies 1026 within the cavities 305. The insulating material encases the substrate 302 such that the insulating material covers at least two surfaces or sides of the substrate 302, for example surfaces 606, 608. In one example, the support layers 1022*a*, 1022*b* are removed from the embedded die assembly 1002, and thus the embedded die assembly 1002 is disengaged from the carriers 1024, 1025. Generally, the support layers 1022*a*, 1022*b* and the carriers 1024, 1025 are removed by any suitable mechanical processes, such as peeling therefrom.

Upon removal of the support layers 1022*a*, 1022*b*, the embedded die assembly 1002 is exposed to a cure process to fully cure the insulating dielectric material of the flowable layers 1018*a*, 1018*b*. Curing of the insulating material results in the formation of the cured insulating layer 1018. As depicted in FIG. 12E and similar to operation 918 corresponding with FIG. 10I, the insulating layer 1018 substantially surrounds the substrate 302 and the semiconductor dies 1026 embedded therein.

In certain embodiments, the cure process is performed at high temperatures to fully cure the embedded die assembly 1002. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 1150 is performed at or near ambient (e.g. atmospheric) pressure conditions.

After curing at operation 1150, the method 1100 is substantially similar to operations 920-924 of the method 900. For example, the embedded die assembly 1002 has one or more through-assembly vias 1003 and one or more contact holes 1032 drilled through the insulating layer 1018. Subsequently, the embedded die assembly 1002 is exposed to a de-smear process, after which the embedded die assembly 1002 is ready for formation of interconnection paths therein, as described below.

Figure 13:
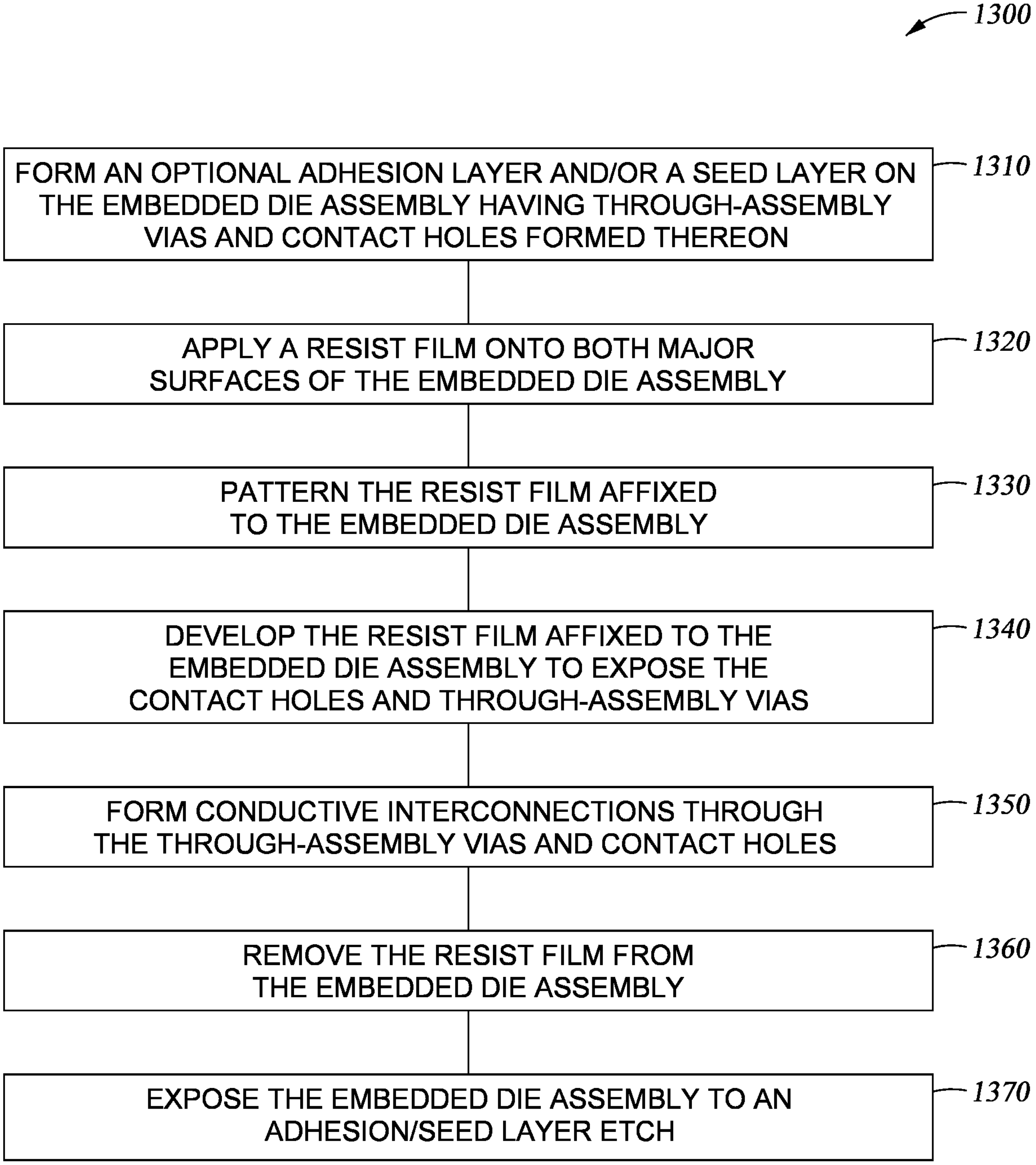
FIG. 13 illustrates a flow diagram of a process for forming interconnections in an embedded die assembly, according to embodiments described herein.

FIG. 13 illustrates a flow diagram of a representative method 1300 of forming electrical interconnections through the embedded die assembly 1002. FIGS. 14A-14H schematically illustrate cross-sectional views of the embedded die assembly 1002 at different stages of the process of the method 1300 depicted in FIG. 13. Thus, FIG. 13 and FIGS. 14A-14H are herein described together for clarity.

Figure 14A:
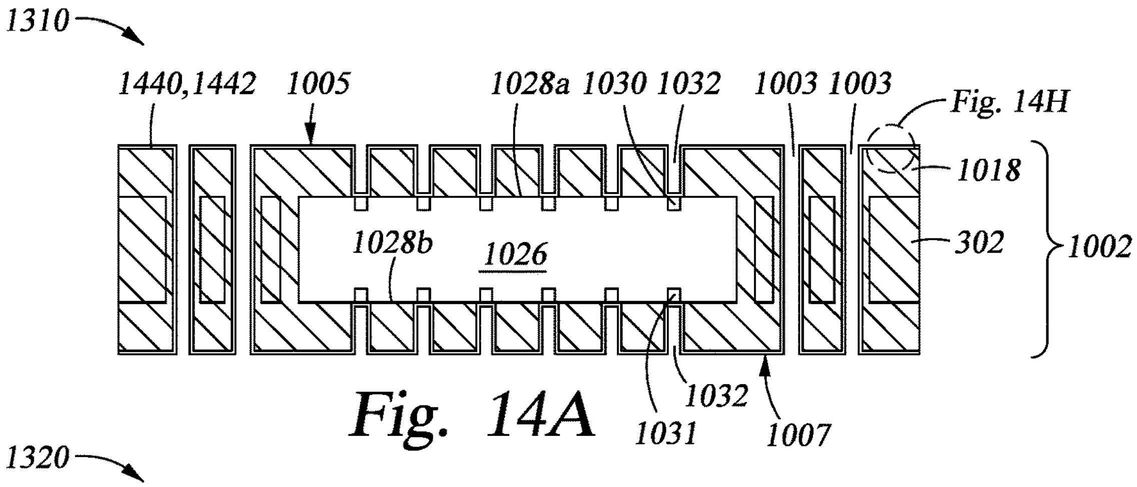

In certain embodiments, the electrical interconnections formed through the embedded die assembly 1002 are formed of copper. Thus, the method 1300 may optionally begin at operation 1310 and FIG. 14A wherein the embedded die assembly 1002, having through-assembly vias 1003 and contact holes 1032 formed therein, has an adhesion layer 1440 and/or a seed layer 1442 formed thereon. An enlarged partial view of the adhesion layer 1440 and the seed layer 1442 formed on the embedded die assembly 1002 is depicted in FIG. 14H for reference. The adhesion layer 1440 may be formed on desired surfaces of the insulating layer 1018, such as major surfaces 1005, 1007 of the embedded die assembly 1002, as well as on the active surfaces 1028 of the contact holes 1032 on each die 1026 and interior walls of the through-assembly vias 1003, to assist in promoting adhesion and blocking diffusion of the subsequently formed seed layer 1442 and copper interconnections 1444. Thus, in certain embodiments, the adhesion layer 1440 acts as an adhesion layer; in another embodiment, the adhesion layer 1440 acts as a barrier layer. In both embodiments, however, the adhesion layer 1440 will be hereinafter described as an "adhesion layer."

In certain embodiments, the optional adhesion layer 1440 is formed of titanium, titanium nitride, tantalum, tantalum nitride, manganese, manganese oxide, molybdenum, cobalt oxide, cobalt nitride, or any other suitable materials or combinations thereof. In certain embodiments, the adhesion layer 1440 has a thickness of between about 10 nm and about 300 nm, such as between about 50 nm and about 150 nm. For example, the adhesion layer 1440 has a thickness between about 75 nm and about 125 nm, such as about 100 nm. The adhesion layer 1440 is formed by any suitable deposition process, including but not limited to chemical vapor deposition (CVD), physical vapor deposition (PVD), plasma enhanced CVD (PECVD), atomic layer deposition (ALD), or the like.

The optional seed layer 1442 may be formed on the adhesion layer 1440 or directly on the insulating layer 1018 (e.g., without the formation of the adhesion layer 1440). The seed layer 1442 is formed of a conductive material such as copper, tungsten, aluminum, silver, gold, or any other suitable materials or combinations thereof. In certain embodiments, the seed layer 1442 has a thickness between about 50 nm and about 500 nm, such as between about 100 nm and about 300 nm. For example, the seed layer 1442 has a thickness between about 150 nm and about 250 nm, such as about 200 nm. In certain embodiments, the seed layer 1442 has a thickness of between about 0.1 μm and about 1.5 μm. Similar to the adhesion layer 1440, the seed layer 1442 is formed by any suitable deposition process, such as CVD, PVD, PECVD, ALD dry processes, wet electroless plating processes, or the like. In certain embodiments, a molybdenum adhesion layer 1440 is formed on the embedded die assembly in combination with a copper seed layer 1442. The Mo—Cu adhesion and seed layer combination enables improved adhesion with the surfaces of the insulating layer 1018 and reduces undercut of conductive interconnect lines during a subsequent seed layer etch process at operation 1370.

Figure 14B:
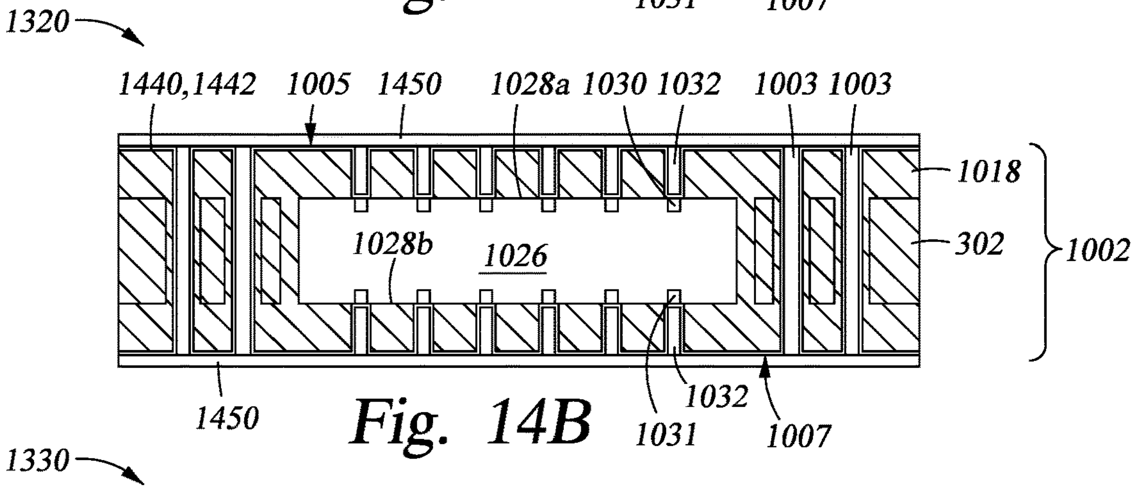
Figure 14C:
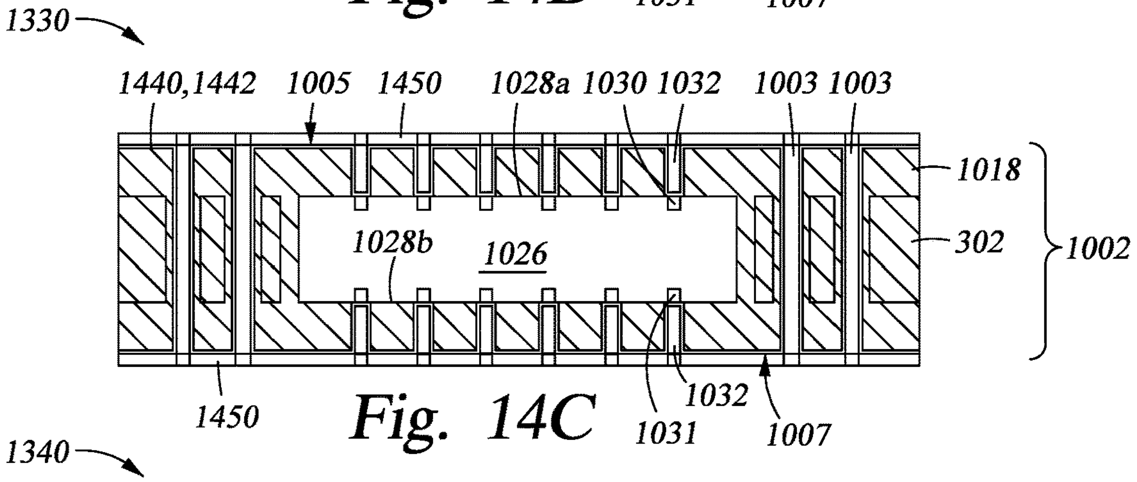

At operations 1320 and 1330, corresponding to FIGS. 14B and 14C, respectively, a spin-on/spray-on or dry resist film 1450, such as a photoresist, is applied on both major surfaces 1005, 1007 of the embedded die assembly 1002 and is subsequently patterned. In certain embodiments, the resist film 1450 is patterned via selective exposure to UV radiation. In certain embodiments, an adhesion promoter (not shown) is applied to the embedded die assembly 1002 prior to formation of the resist film 1450. The adhesion promoter improves adhesion of the resist film 1450 to the embedded die assembly 1002 by producing an interfacial bonding layer for the resist film 1450 and by removing any moisture from the surface of the embedded die assembly 1002. In some embodiments, the adhesion promoter is formed of bis(trimethylsilyl)amine or hexamethyldisilazane (HMDS) and propylene glycol monomethyl ether acetate (PGMEA).

Figure 14D:
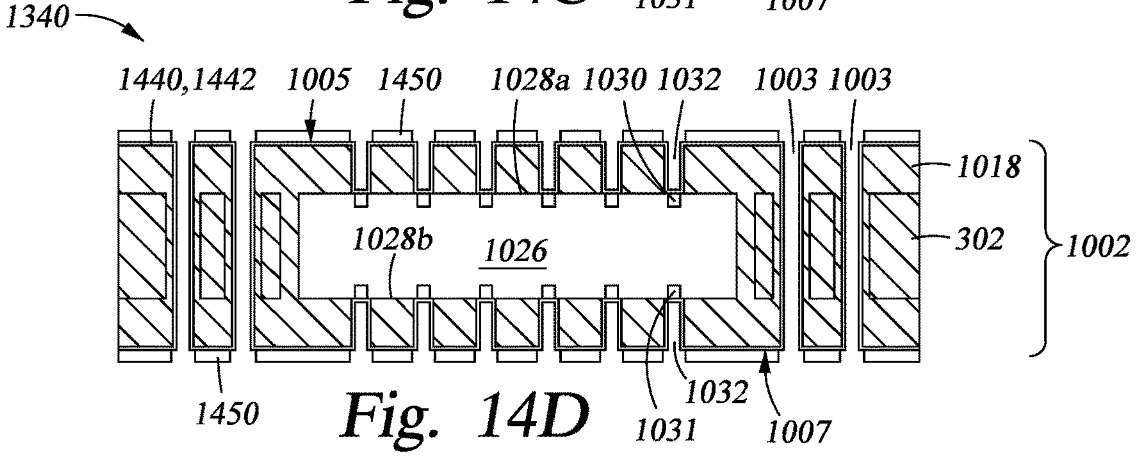

At operation 1340 and FIG. 14D, the embedded die assembly 1002 is exposed to a resist film development process. As depicted in FIG. 14D, development of the resist film 1450 results in exposure of the through-assembly vias 1003 and contact holes 1032, now having an adhesion layer 1440 and a seed layer 1442 formed thereon. In certain embodiments, the film development process is a wet process, such as a wet process that includes exposing the resist to a solvent. In certain embodiments, the film development process is a wet etch process utilizing an aqueous etch process. In other embodiments, the film development process is a wet etch process utilizing a buffered etch process selective for a desired material. Any suitable wet solvents or combination of wet etchants may be used for the resist film development process.

At operations 1350 and 1360, corresponding to FIGS. 14E and 14F respectively, interconnections 1444 are formed through the exposed through-assembly vias 1003 and contact holes 1032 and the resist film 1450 is thereafter removed. The interconnections 1444 are formed by any suitable methods including electroplating and electroless deposition. In certain embodiments, the resist film 1450 is removed via a wet process. As depicted in FIGS. 14E and 14F, the formed interconnections 1444 fill the through-assembly vias 1003 and contact holes 1032 and/or cover inner circumferential walls thereof and protrude from the surfaces 1005, 1007, and 1028 of the embedded die assembly 1002 upon removal of the resist film 1450. In certain embodiments, the interconnections 1444 are formed of copper. In other embodiments, the interconnections 1444 may be formed of any suitable conductive material including but not limited to aluminum, gold, nickel, silver, palladium, tin, or the like.

At operation 1370 and FIG. 14G, the embedded die assembly 1002 having interconnections 1444 formed therein is exposed to an adhesion and/or seed layer etch process to remove the adhesion layer 1440 and the seed layer 1442. In certain embodiments, the seed layer etch is a wet etch process including a rinse and drying of the embedded die assembly 1002. In certain embodiments, the seed layer etch process is a buffered etch process selective for a desired material such as copper, tungsten, aluminum, silver, or gold. In other embodiments, the etch process is an aqueous etch process. Any suitable wet etchant or combination of wet etchants may be used for the seed layer etch process.

Figure 15:
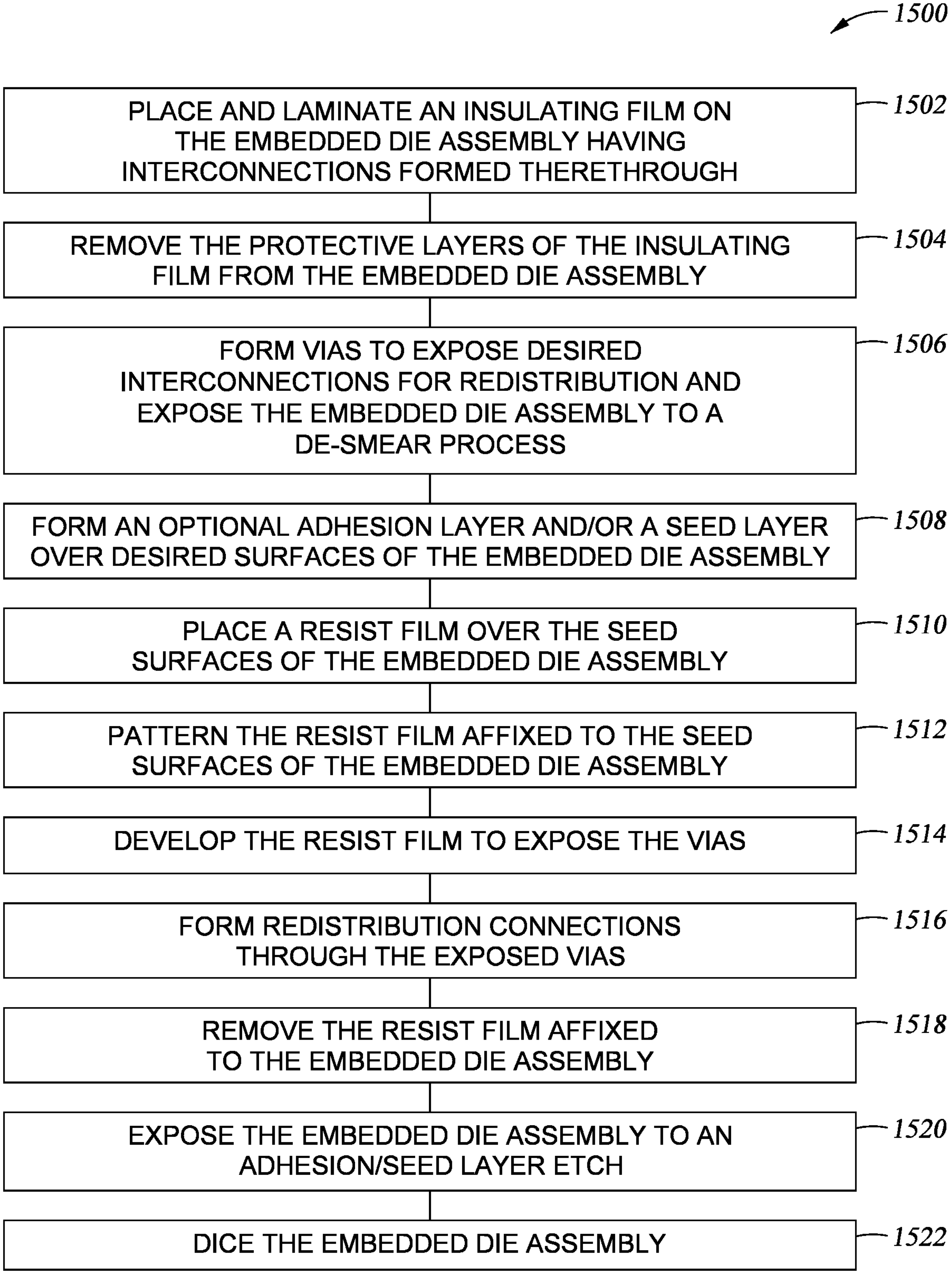
FIG. 15 illustrates a flow diagram of a process for forming a redistribution layer on an embedded die assembly followed by package singulation, according to embodiments described herein.

Following the seed layer etch process at operation 1370, one or more electrically functioning packages may be singulated from the embedded die assembly 1002. Alternatively, the embedded die assembly 1002 may have one or more redistribution layers 1658 and/or 1660 (shown in FIGS. 16K-16L) formed thereon as needed to enable rerouting of contact points of the interconnections 1444 to desired locations on the surfaces of the embedded die assembly 1002. FIG. 15 illustrates a flow diagram of a representative method 1500 of forming a redistribution layer 1658 on the embedded die assembly 1002. FIGS. 16A-16L schematically illustrate cross-sectional views of the embedded die assembly 1002 at different stages of the method 1500 depicted in FIG. 15. Thus, FIG. 15 and FIGS. 16A-16L are herein described together for clarity.

Figures 16A, 16B, 16C:
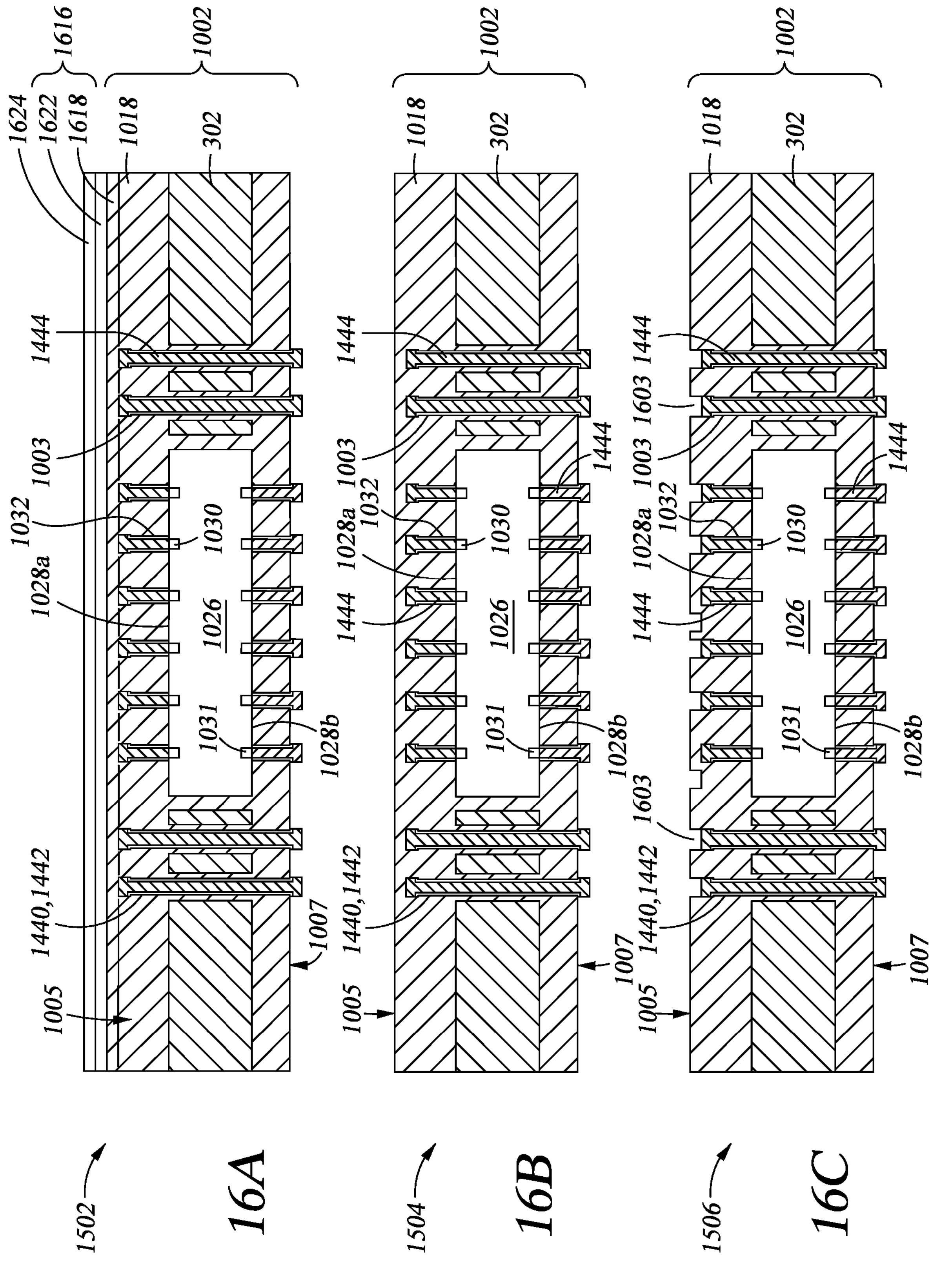
FIGS. 16A-16L schematically illustrate cross-sectional views of an embedded die assembly at different stages of forming a redistribution layer followed by package singulation, as depicted in FIG. 15, according to embodiments described herein.

The method 1500 is substantially similar to the methods 900, 1100, and 1300 described above. Generally, the method 1500 begins at operation 1502 and FIG. 16A, wherein an insulating film 1616 is placed on a desired side of the embedded die assembly 1002 and thereafter laminated. The insulating film 1616 may be substantially similar to the insulating film 1016 and includes one or more layers formed of polymer-based flowable dielectric materials. In certain embodiments, as depicted in FIG. 16A, the insulating film 1616 includes a flowable layer 1618 and one or more support layers 1622. In certain embodiments, the insulating film 1616 may include a ceramic-filler-containing epoxy resin flowable layer 1618 and one or more support layers 1622. In another example, the insulating film 1616 may include a photodefinable polyimide flowable layer 1618 and one or more support layers 1622. The material properties of photodefinable polyimide enable the formation of smaller (e.g., narrower) vias through the resulting interconnect layer formed therefrom. However, any suitable combination of layers and insulating materials is contemplated for the insulating film 1616. For example, the insulating film 1616 may include a non-photosensitive polyimide, polybenzoxazole (PBO), silicon dioxide, and/or silicon nitride flowable layer 1618. Examples of suitable materials for the one or more support layers 1622 include PET and polypropylene (PP).

In some examples, the flowable layer 1618 includes a different polymer-based flowable dielectric material than the flowable layers 1018*a*, 1018*b* described above. For example, the flowable layer 1018 may include a ceramic-filler-containing epoxy resin and the flowable layer 1618 may include a photodefinable polyimide. In another example, the flowable layer 1618 is formed from a different inorganic dielectric material from the flowable layers 1018*a*, 1018*b*. For example, the flowable layers 1018*a*, 1018*b* may include a ceramic-filler-containing epoxy resin and the flowable layer 1618 may include a silicon dioxide layer.

The insulating film 1616 has a thickness of less than about 200 μm, such as a thickness between about 10 μm and about 180 μm. For example, the insulating film 1616 including the flowable layer 1618 and the PET support layer 1622 has a total thickness of between about 50 μm and about 100 μm. In certain embodiments, the flowable layer 1618 has a thickness of less than about 60 μm, such as a thickness between about 5 μm and about 50 μm, such as a thickness of about 20 μm. The insulating film 1616 is placed on a surface of the embedded die assembly 1002 having exposed interconnections 1444 that are coupled to the contacts 1030 on the active surface 1028 of dies 1026 and/or coupled to the metallized through-assembly vias 1003, such as the major surface 1005.

After placement of the insulating film 1616, the embedded die assembly 1002 is exposed to a lamination process substantially similar to the lamination process described with reference to operations 908, 916, and 1140. The embedded die assembly 1002 is exposed to elevated temperatures to soften the flowable layer 1618, which subsequently bonds to the insulating layer 1018 already formed on the embedded die assembly 1002. Thus, in certain embodiments, the flowable layer 1618 becomes integrated with the insulating layer 1018 and forms an extension thereof. The integration of the flowable layer 1618 and the insulating layer 1018 results in an expanded and integrated insulating layer 1018 covering the previously exposed interconnections 1444. Accordingly, the bonded flowable layer 1618 and the insulating layer 1018 will herein be jointly described as the insulating layer 1018. In other embodiments, however, the lamination and subsequent curing of the flowable 1618 forms a second insulating layer (not shown) on the insulating layer 1018. In some examples, the second insulating layer is formed of a different material layer than the insulating layer 1018.

In certain embodiments, the lamination process is a vacuum lamination process that may be performed in an autoclave or other suitable device. In certain embodiments, the lamination process is performed by use of a hot pressing process. In certain embodiments, the lamination process is performed at a temperature of between about 80° C. and about 140° C. and for a period between about 1 minute and about 30 minutes. In some embodiments, the lamination process includes the application of a pressure of between 10 psig and about 100 psig while a temperature of between about 80° C. and about 140° C. is applied to the substrate 302 and insulating film 1616 for a period between about 1 minute and about 30 minutes. For example, the lamination process is performed at a pressure of between about 30 psig and about 80 psig and a temperature of between about 100° C. and about 120° C. for a period between about 2 minutes and about 10 minutes. For example, the lamination process is performed at a temperature of about 110° C. for a period of about 5 minutes. In further examples, the lamination process is performed at a pressure between about 30 psig and about 70 psig, such as about 50 psig.

At operation 1504 and FIG. 16B, the support layer 1622 and the carrier 1624 are removed from the embedded die assembly 1002 by mechanical processes. After removal of the support layer 1622 and carrier 1624, the embedded die assembly 1002 is exposed to a cure process to fully cure the newly expanded insulating layer 1018. In certain embodiments, the cure process is substantially similar to the cure process described with reference to operations 918 and 1150. For example, the cure process is performed at a temperature of between about 140° C. and about 220° C. and for a period between about 15 minutes and about 45 minutes, such as a temperature of between about 160° C. and about 200° C. and for a period between about 25 minutes and about 35 minutes. For example, the cure process is performed at a temperature of about 180° C. for a period of about 30 minutes. In further embodiments, the cure process at operation 1504 is performed at or near ambient pressure conditions.

The embedded die assembly 1002 is then selectively patterned by laser ablation at operation 1506 and FIG. 16C. The laser ablation at operation 1506 forms redistribution vias 1603 through the newly expanded insulating layer 1018 and exposes desired interconnections 1444 for redistribution of contact points thereof. In certain embodiments, the redistribution vias 1603 have a diameter of between about 5 μm and about 60 μm, such as a diameter of between about 10 μm and about 50 μm, such as between about 20 μm and about 45 μm. In certain embodiments, the laser ablation process at operation 1506 is performed utilizing a $CO_2$ laser. In certain embodiments, the laser ablation process at operation 1506 is performed utilizing a UV laser. In certain embodiments, the laser ablation process at operation 1506 is performed utilizing a green laser. For example, the laser source may generate a pulsed laser beam having a frequency between about 100 kHz and about 1000 kHz. In one example, the laser source is configured to deliver a pulsed laser beam at a wavelength of between about 100 nm and about 2000 nm, at a pulse duration between about 10E-4 ns and about 10E-2 ns, and with a pulse energy of between about 10 μJ and about 300 μJ.

Upon patterning of the embedded die assembly 1002, the embedded die assembly 1002 is exposed to a de-smear process substantially similar to the de-smear process at operation 922 and 1170. During the de-smear process at operation 1506, any unwanted residues and debris formed by laser ablation during the formation of the redistribution vias 1603 are removed from the redistribution vias 1603 to clear (e.g., clean) the surfaces thereof for subsequent metallization. In certain embodiments, the de-smear process is a wet process. Any suitable aqueous etchants, solvents, and/or combinations thereof may be utilized for the wet de-smear process. In one example, $KMnO_4$ solution may be utilized as an etchant. In another embodiment, the de-smear process is a dry de-smear process. For example, the de-smear process may be a plasma de-smear process with an $O_2/CF_4$ mixture gas. In further embodiments, the de-smear process is a combination of wet and dry processes.

Figure 16D:
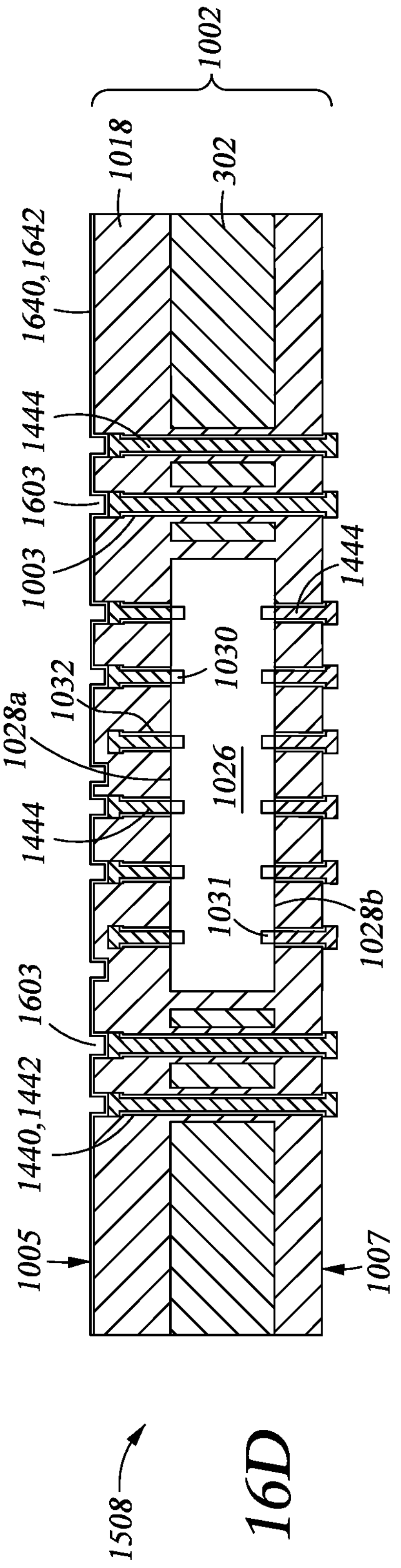

At operation 1508 and FIG. 16D, an optional adhesion layer 1640 and/or seed layer 1642 are formed on the insulating layer 1018. In certain embodiments, the adhesion layer 1640 is formed from titanium, titanium nitride, tantalum, tantalum nitride, manganese, manganese oxide, molybdenum, cobalt oxide, cobalt nitride, or any other suitable materials or combinations thereof. In certain embodiments, the adhesion layer 1640 has a thickness of between about 10 nm and about 300 nm, such as between about 50 nm and about 150 nm. For example, the adhesion layer 1640 has a thickness between about 75 nm and about 125 nm, such as about 100 nm. The adhesion layer 1640 may be formed by any suitable deposition process, including but not limited to CVD, PVD, PECVD, ALD, or the like.

The optional seed layer 1642 is formed from a conductive material such as copper, tungsten, aluminum, silver, gold, or any other suitable materials or combinations thereof. In certain embodiments, the seed layer 1642 has a thickness between about 50 nm and about 500 nm, such as between about 100 nm and about 300 nm. For example, the seed layer 1642 has a thickness between about 150 nm and about 250 nm, such as about 200 nm. In certain embodiments, the seed layer 1642 has a thickness of between about 0.1 μm and about 1.5 μm. Similar to the adhesion layer 1640, the seed layer 1642 may be formed by any suitable deposition process, such as CVD, PVD, PECVD, ALD dry processes, wet electroless plating processes, or the like. In certain embodiments, a molybdenum adhesion layer 1640 and a copper seed layer 1642 are formed on the embedded die assembly 1002 to reduce undercut of conductive interconnect lines during a subsequent seed layer etch process at operation 1520.

Figure 16E:
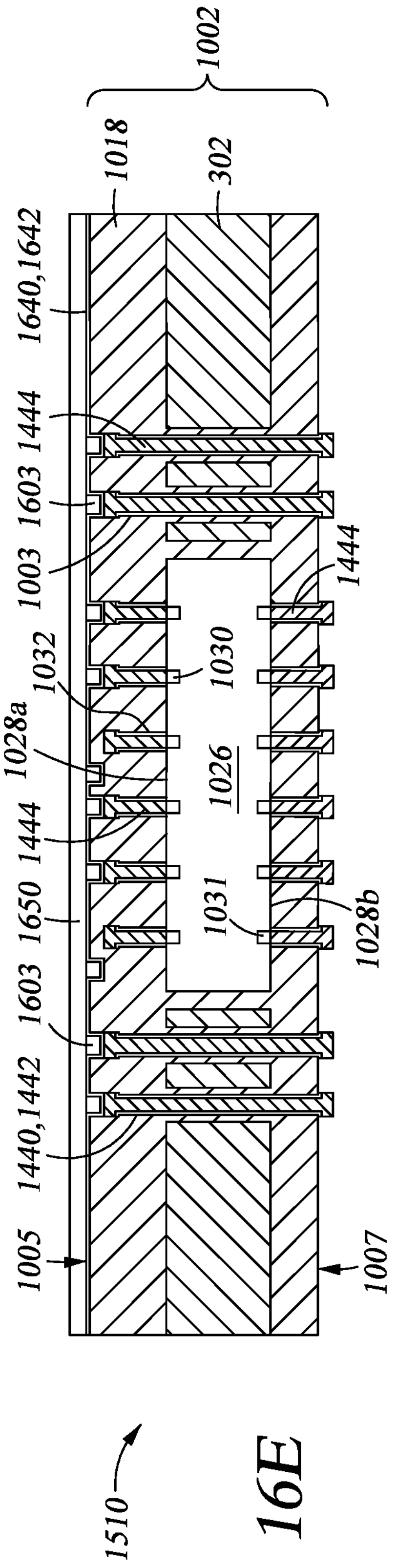
Figure 16F:
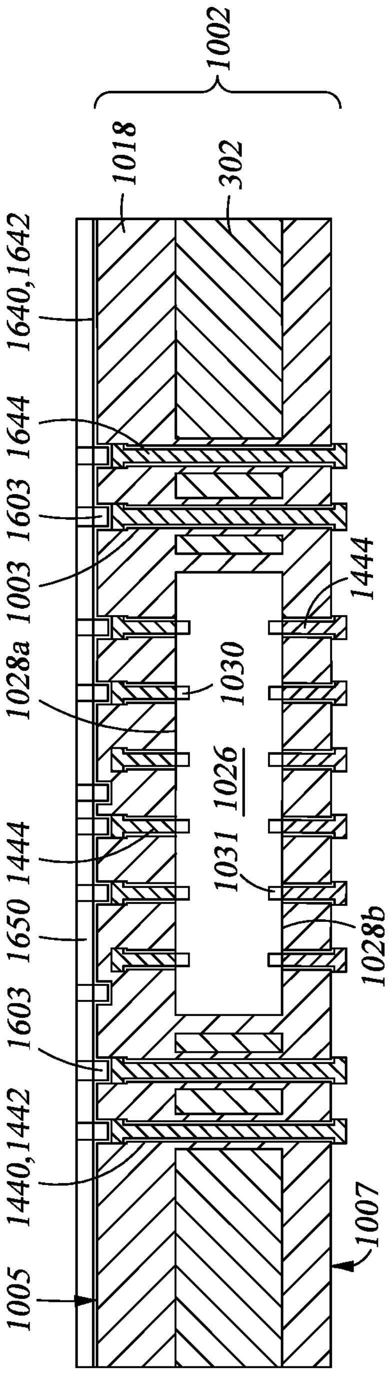
Figure 16G:
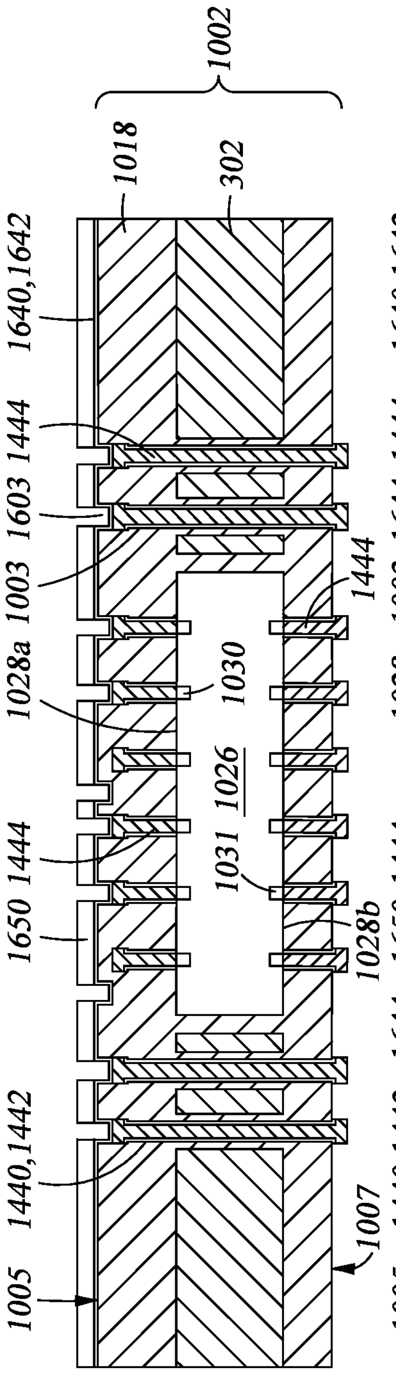

At operations 1510, 1512, and 1514, corresponding to FIGS. 16E, 16F, and 16G respectively, a spin-on/spray-on or dry resist film 1650, such as a photoresist, is applied over the adhesion and/or seed surfaces of the embedded die assembly 1002 and subsequently patterned and developed. In certain embodiments, an adhesion promoter (not shown) is applied to the embedded die assembly 1002 prior to placement of the resist film 1650. The exposure and development of the resist film 1650 results in opening of the redistribution vias 1603. Thus, patterning of the resist film 1650 may be performed by selectively exposing portions of the resist film 1650 to UV radiation, and subsequent development of the resist film 1650 by a wet process, such as a wet etch process. In certain embodiments, the resist film development process is a wet etch process utilizing a buffered etch process selective for a desired material. In other embodiments, the resist film development process is a wet etch process utilizing an aqueous etch process. Any suitable wet etchant or combination of wet etchants may be used for the resist film development process.

Figure 16H:
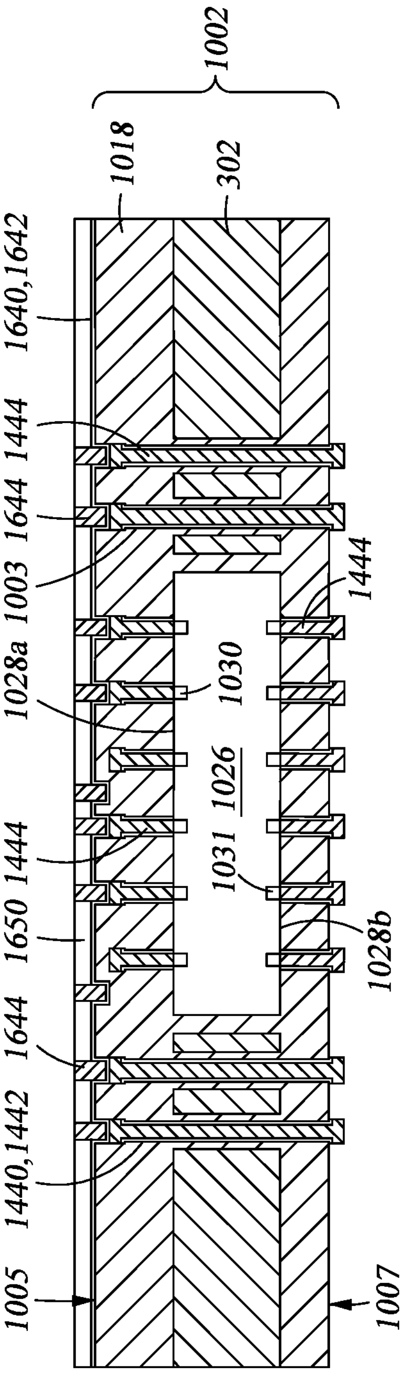
Figure 16I:
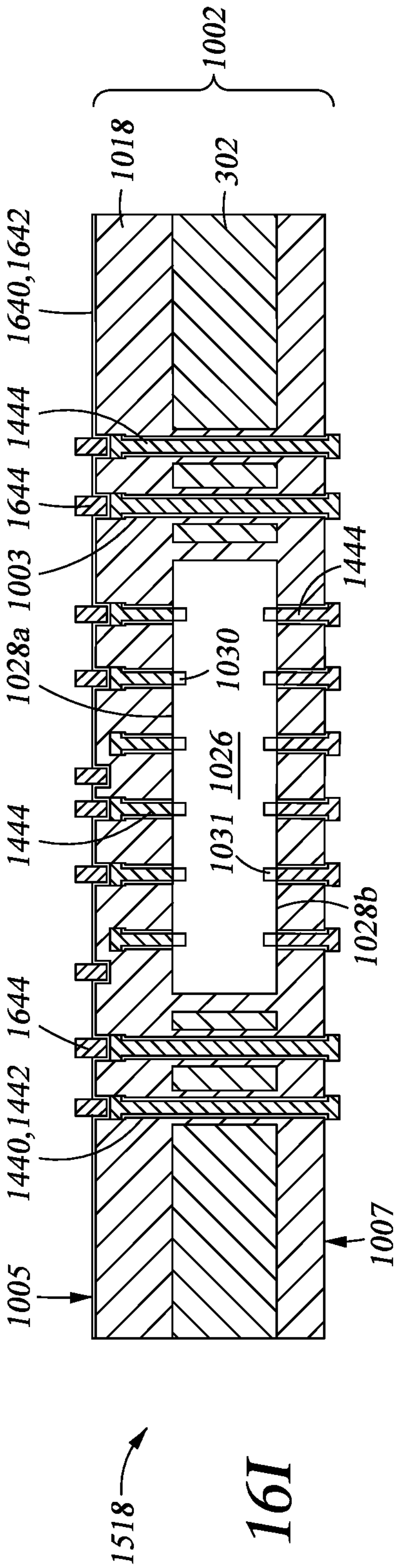

At operations 1516 and 1518, corresponding to FIGS. 16H and 16I respectively, redistribution connections 1644 are formed through the exposed redistribution vias 1603 and the resist film 1650 is thereafter removed. The redistribution connections 1644 are formed by any suitable methods including electroplating and electroless deposition. In certain embodiments, the resist film 1650 is removed via a wet process. As depicted in FIGS. 16H and 16I, the redistribution connections 1644 fill the redistribution vias 1603 and protrude from the surfaces of the embedded die assembly 1002 upon removal of the resist film 1650. In certain embodiments, the redistribution connections 1644 are formed of copper. In other embodiments, the redistribution connections 1644 may be formed of any suitable conductive material including but not limited to aluminum, gold, nickel, silver, palladium, tin, or the like.

Figure 16J:
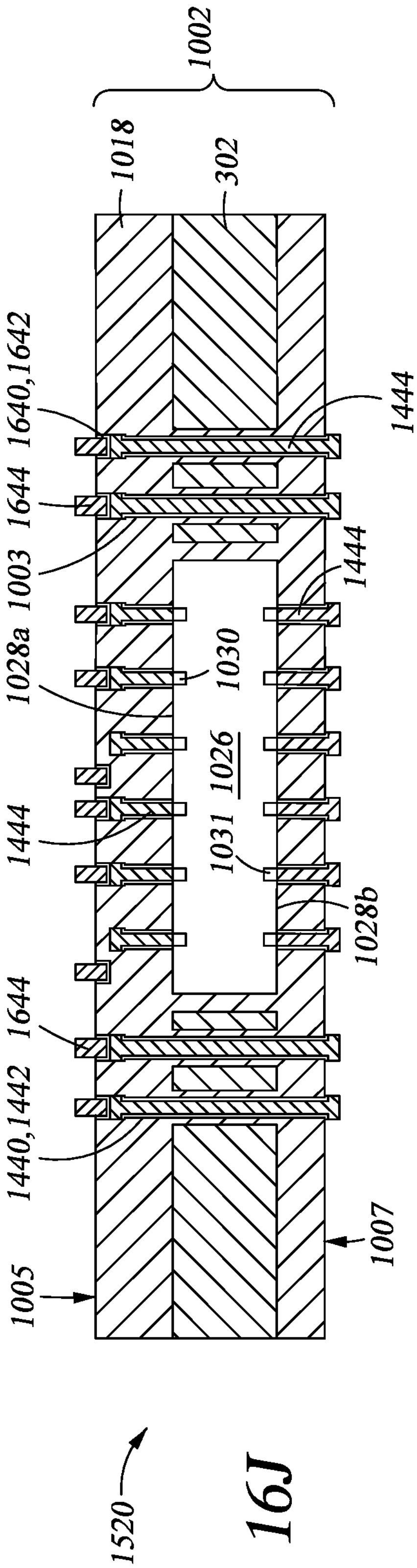

At operation 1520 and FIG. 16J, the embedded die assembly 1002 having the redistribution connections 1644 formed thereon is exposed to a seed layer etch process substantially similar to that of operation 1370. In certain embodiments, the seed layer etch is a wet etch process including a rinse and drying of the embedded die assembly 1002. In certain embodiments, the seed layer etch process is a wet etch process utilizing a buffered etch process selective for a desired material of the seed layer 1642. In other embodiments, the etch process is a wet etch process utilizing an aqueous etch process. Any suitable wet etchant or combination of wet etchants may be used for the seed layer etch process.

Figure 16K:
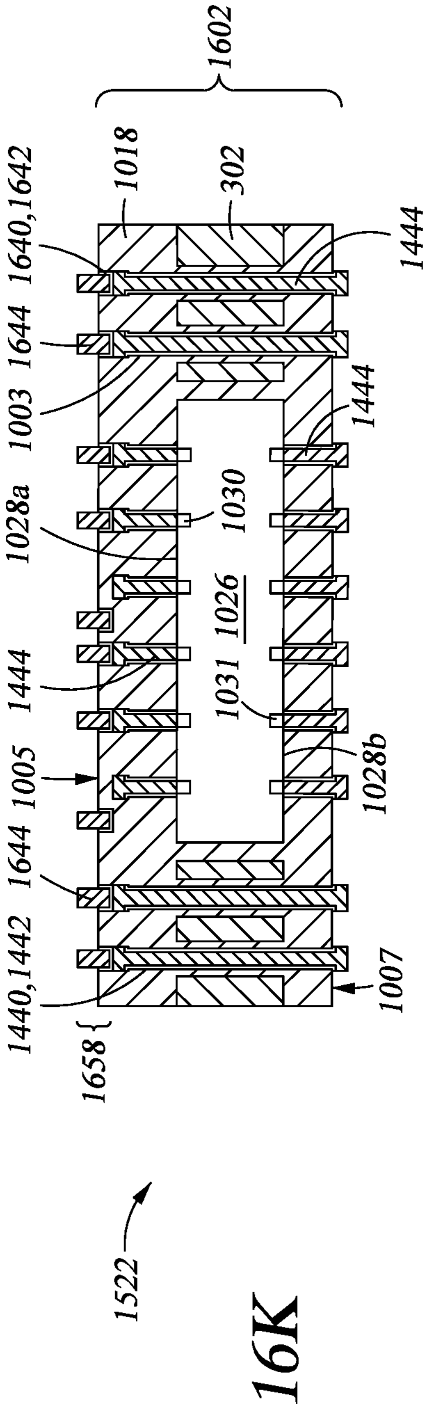
Figure 16L:
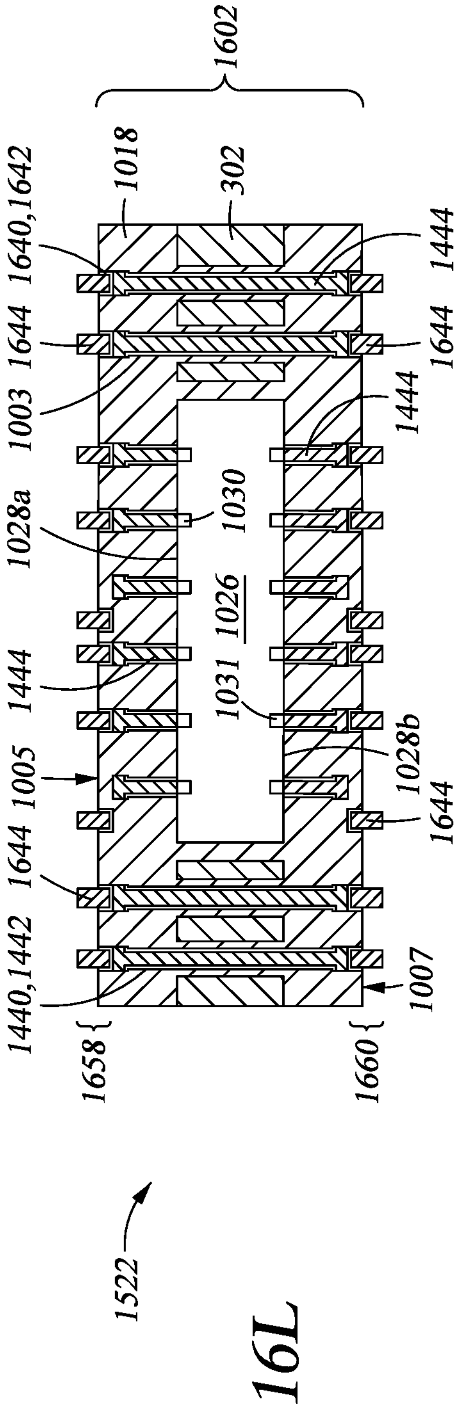

At operation 1522 and depicted in FIGS. 16K and 16L, one or more completed packages 1602 are singulated from the embedded die assembly 1002. Prior to operation 1522, however, additional redistribution layers may be formed on the embedded die assembly 1002 utilizing the sequences and processes described above, as depicted in FIG. 16L (FIG. 16K depicts the completed package 1602 having one additional redistribution layer 1658). For example, one or more additional redistribution layers 1660 may be formed on a side or surface of the embedded die assembly 1002 opposite of the first additional redistribution layer 1658, such as the major surface 1007. Alternatively, one or more additional redistribution layers 1660 may be formed on the same side or surface of the first additional redistribution layer 1658 (not shown), such as major surface 1005. The completed package 1602 may then be singulated from the embedded die assembly 1002 after all desired redistribution layers are formed.

Figure 17A:
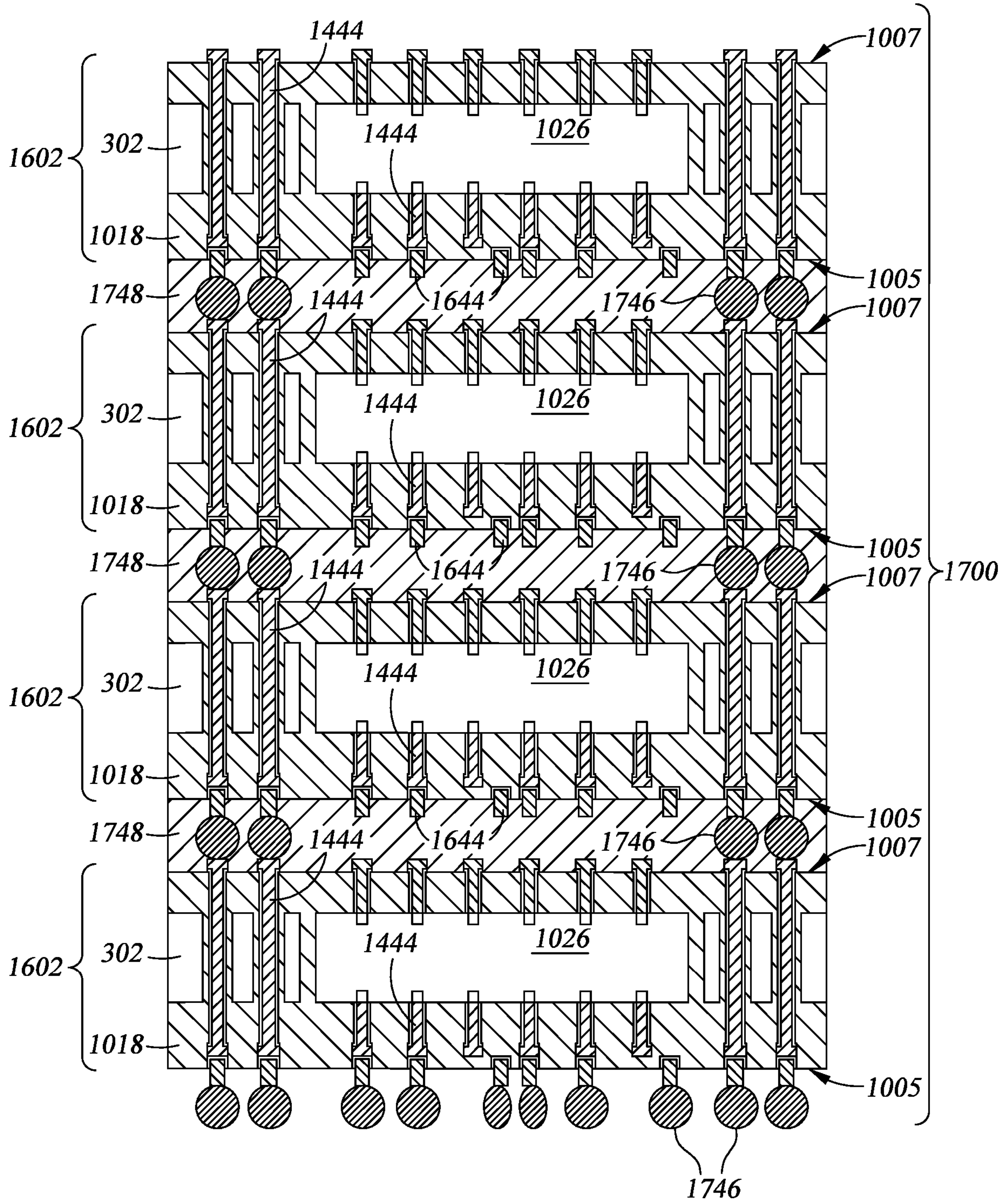
FIGS. 17A and 17B schematically illustrate cross-sectional views of exemplary stacked devices including a plurality of semiconductor device packages formed utilizing the processes depicted in FIGS. 1-16L, according to embodiments described herein.

The package structures formed by the methods described above, e.g., intermediary embedded die assembly 1002 and/or package 1602, may be utilized in any suitable packaging applications and in any suitable configurations. In one exemplary embodiment schematically illustrated in FIG. 17A, four packages 1602 are utilized to form a stacked structure 1700, e.g., a DRAM stack. Accordingly, each package 1602 includes a double-sided die 1026 (e.g., memory or similar chip) embedded within the substrate 302 and encapsulated by the insulating layer 1018 (e.g., having a portion of each side in contact with the insulating layer 1018). One or more interconnections 1444 are formed though the entire thickness of each package 1602 and are directly in contact with one or more solder bumps 1746 disposed between major surfaces 1005 and 1007 of adjacent (i.e., stacked above or below) packages 1602. For example, as depicted in the stacked structure 1700, four or more solder bumps 1746 are disposed between adjacent packages 1602 to bridge (e.g., connect, couple) the interconnections 1444 of each package 1602 with the interconnections 1444 of an adjacent package 1602.

In certain embodiments, voids between adjacent packages 1602 connected by the solder bumps 1746 are filled with an encapsulation material 1748 to enhance the reliability of the solder bumps 1746. The encapsulation material 1748 may be any suitable type of encapsulant or underfill. In one example, the encapsulation material 1748 includes a pre-assembly underfill material, such as a no-flow underfill (NUF) material, a nonconductive paste (NCP) material, and a nonconductive film (NCF) material. In one example, the encapsulation material 1748 includes a post-assembly underfill material, such as a capillary underfill (CUF) material and a molded underfill (MUF) material. In certain embodiments, the encapsulation material 1748 includes a low-expansion-filler-containing resin, such as an epoxy resin filled with (e.g., containing) $SiO_2$, AlN, $Al_2O_3$, SIC, $Si_3N_4$, $Sr_2Ce_2Ti_5O_{16}$, $ZrSiO_4$, $CaSiO_3$, BeO, $CeO_2$, BN, $CaCu_3Ti_4O_{12}$, MgO, $TiO_2$, ZnO and the like.

In certain embodiments, the solder bumps 1746 are formed of one or more intermetallic compounds, such as a combination of tin (Sn) and lead (Pb), silver (Ag), Cu, or any other suitable metals thereof. For example, the solder bumps 1746 are formed of a solder alloy such as Sn—Pb, Sn—Ag, Sn—Cu, or any other suitable materials or combinations thereof. In certain embodiments, the solder bumps 1746 include C4 (controlled collapse chip connection) bumps. In certain embodiments, the solder bumps 1746 include C2 (chip connection, such as a Cu-pillar with a solder cap) bumps. Utilization of C2 solder bumps enables a smaller pitch between contact pads and improved thermal and/or electrical properties for the stacked structure 1700. In some embodiments, the solder bumps 1746 have a diameter between about 10 μm and about 150 μm, such as a diameter between about 50 μm and about 100 μm. The solder bumps 1746 may further be formed by any suitable wafer bumping processes, including but not limited to electrochemical deposition (ECD) and electroplating.

Figure 17B:
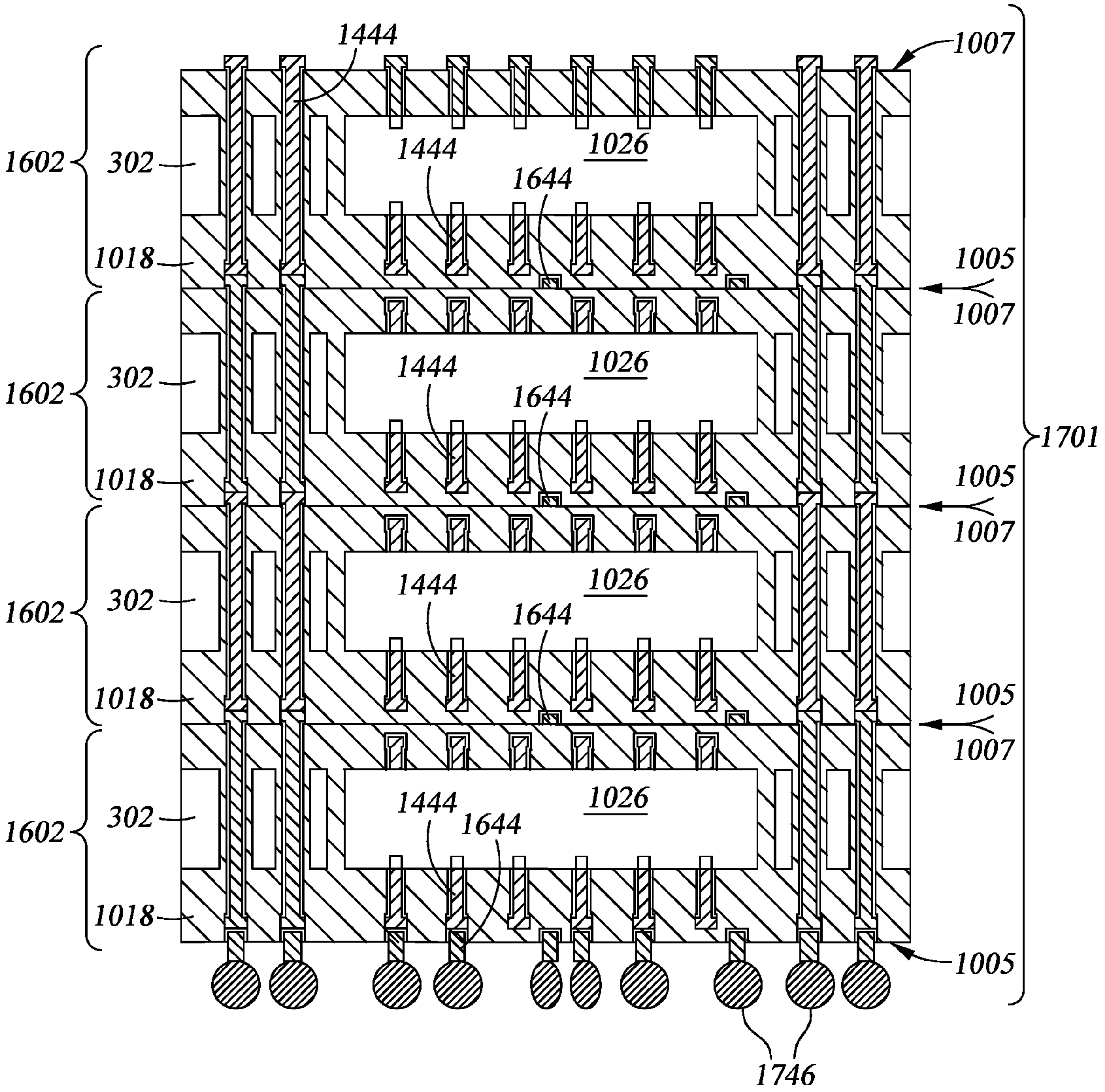

In another exemplary embodiment schematically depicted in FIG. 17B, a stacked structure 1701 is formed by stacking four packages 1602 and directly bonding one or more interconnections 1444 of each package 1602 with the interconnections 1444 of one or more adjacent packages 1602. As depicted, the packages 1602 may be bonded by hybrid bonding, wherein major surfaces 1005 and 1007 of adjacent packages are planarized and in full contact with each other. Thus, one or more interconnections 1444 of each package 1602 are formed through the entire thickness of each package 1602 and are directly in contact with one or more interconnections 1444 of at least another adjacent package 1602.

The stacked structures 1700 and 1701 provide multiple advantages over conventional stacked package structures. Such benefits include thin form factor and high die-to-package volume ratio, which enable greater I/O scaling to meet the ever-increasing bandwidth and power efficiency demands of artificial intelligence (AI) and high performance computing (HPC). The utilization of a structured silicon core frame provides optimal material stiffness and thermal conductivity for improved electrical performance, thermal management, and reliability of 3-dimensional integrated circuit (3D IC) architecture. Furthermore, the fabrication methods for through-assembly vias and via-in-via structures described herein provide high performance and flexibility for 3D integration with relatively low manufacturing costs as compared to conventional TSV technologies.

In certain aspects of the present disclosure, the devices and methods disclosed are intended to replace more conventional flip chip ball grid array (fcBGA) package structures, which are limited by the intrinsic properties of the materials typically utilized to form these various structures. In particular, conventional fcBGA package structures may present greater mechanical stresses caused by thermal expansion mismatch between components thereof, leading to high rates of substrate flexing, warpage, and/or collapse. Such stresses are further amplified as substrates for these devices are scaled for improved signal integrity and power delivery, resulting in lesser structural stability thereof. Accordingly, the devices disclosed herein may be integrated with a stiffener frame, thus providing semiconductor package devices that overcome many of the disadvantages associated with conventional fcBGA package structures described above.

Figure 18A:
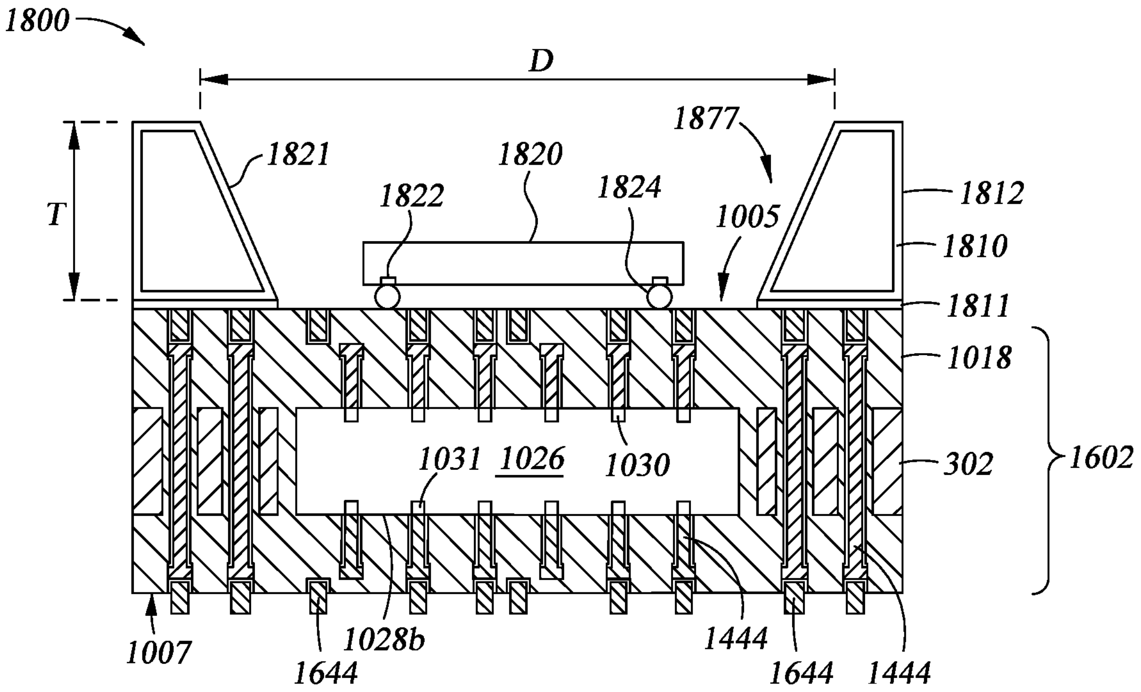
FIGS. 18A-18E schematically illustrate various views of exemplary semiconductor devices having a stiffener frame, according to embodiments described herein.
Figure 18B:
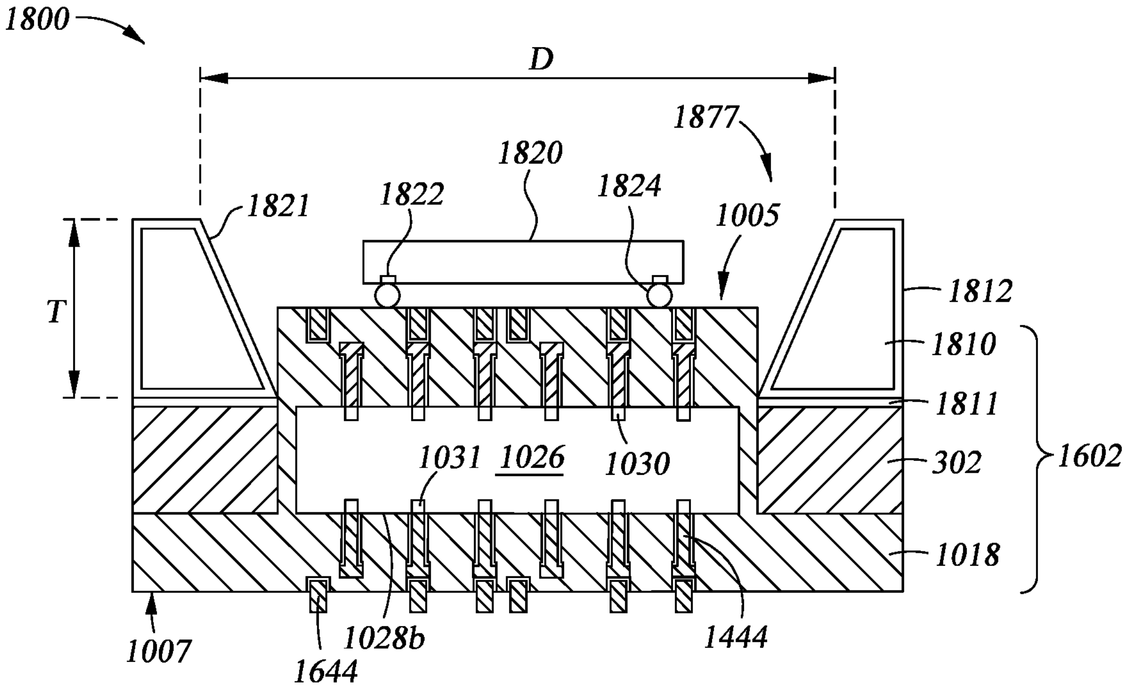

FIGS. 18A-18B schematically illustrate cross-sectional side views of different configurations of a device 1800, which includes a package 1602 integrated with a stiffener frame 1810, according to certain embodiments of the present disclosure. In certain examples, the device 1800 may be utilized for structural support and electrical interconnection of additional semiconductor packages or other devices in a stacked configuration, which may be mounted thereto utilizing any suitable technique, e.g., flip-chip or wafer bumping. In certain examples, the device 1800 may be utilized as a carrier structure for a surface-mounted device, such as a chip or graphics card, in addition to semiconductor dies 1026.

As shown in FIGS. 18A-18B, the device 1800 includes the stiffener frame 1810 formed on the first side 1007 and/or second side 1007 thereof. The stiffener frame 1810 provides additional rigidity to the overall structure of device 1800, thus reducing or eliminating the risk of warpage or collapse of, e.g., substrate 302 or package 1602 during integration of device 1800 into high-density integrated devices (e.g., stacked semiconductor packages, PCB assemblies, PCB spacer assemblies, chip carrier assemblies, intermediate carrier assemblies, memory stacks, etc.). Integrating the stiffener frame 1810 with the package 1602 thus enables the utilization of thinner substrates 302, which facilitates improved signal integrity (e.g., low insertion losses) and improved power delivery (e.g., low power loss) between components on either side of the substrates 302. In certain embodiments, the stiffener frame 1810 may also provide a shielding effect for one or more semiconductor dies or devices embedded or stacked with package 1602, such as the semiconductor dies 1026 or 1820 shown in FIGS. 18A-18B.

Generally, the stiffener frame 1810 has a polygonal or circular ring-like shape and is formed from a patterned substrate comprising any suitable substrate material. In certain embodiments, the stiffener frame 1810 may be formed from a substrate comprising a material substantially similar to that of substrate 302, thus matching the coefficient of thermal expansion (CTE) thereof and reducing or eliminating the risk of warpage during assembly. For example, the stiffener frame 1810 may be formed from a III-V compound semiconductor material, silicon (e.g., having a resistivity between about 1 and about 10 Ohm-com or conductivity of about 100 W/mK), crystalline silicon (e.g., Si<100> or Si<111>), silicon oxide, silicon germanium, doped or undoped silicon, undoped high resistivity silicon (e.g., float zone silicon having lower dissolved oxygen content and a resistivity between about 5000 and about 10000 ohm-cm), doped or undoped polysilicon, silicon nitride, silicon carbide (e.g., having a conductivity of about 500 W/mK), quartz, glass (e.g., borosilicate glass), sapphire, alumina, and/or ceramic materials. In certain embodiments, the stiffener frame 1810 includes monocrystalline p-type or n-type silicon. In certain embodiments, the stiffener frame 1810 includes polycrystalline p-type or n-type silicon.

The stiffener frame 1810 has a thickness T between about 50 μm and about 1500 μm, such as a thickness T between about 100 μm and about 1200 μm. For example, the stiffener frame 1810 has a thickness T between about 200 μm and about 1000 μm, such as a thickness T between about 400 μm and about 800 μm, such as a thickness T of about 775 μm. In another example, the stiffener frame 1810 has a thickness T between about 100 μm and about 700 μm, such as a thickness T between about 200 μm and about 500 μm. In another example, the stiffener frame 1810 has a thickness T between about 800 μm and about 1400 μm, such as a thickness T between about 1000 μm and about 1200 μm. In yet another example, the stiffener frame 1810 has a thickness T greater than about 1200 μm.

The stiffener frame 1810 may be attached to the package 1602 via any suitable methods. For example, as shown in FIGS. 18A-18B, the stiffener frame 1810 may be attached to the package 1602 via an adhesive 1811, which may include a laminated adhesive material, die attach film, adhesive film, glue, wax, or the like. In certain embodiments, adhesive 1811 is a layer of uncured dielectric material similar to that of insulating layer 1018, such as an epoxy resin material having a ceramic filler. In certain embodiments, the stiffener frame 1810 is attached directly to the insulating layer 1018 on major surfaces 1005 or 1007 (FIG. 18A). In certain other embodiments, the stiffener frame 110 is attached directly to the substrate 302, or attached to a passivating layer or metal cladding layer formed on the substrate 302 (FIG. 18B). In such embodiments, desired portions of the insulating layer 1018 may be removed via, e.g., laser ablation, to enable attachment of the stiffener frame 1810 to the substrate 302.

The stiffener frame 1810 may be patterned to form one or more openings 1877 therethrough, which may, in certain embodiments, receive one or more semiconductor dies 1820 (or other devices) therein. Accordingly, the openings 1877 enable integration (e.g., stacking) of semiconductor dies 1820 directly onto either the insulating layer 1018 or the substrate 302 of package 1602, without requiring further extension of interconnections through stiffener frame 1810. In further embodiments, the stiffener frame 1810 may also provide a mechanical and/or electrical shielding effect for the dies 1820. For example, as shown in FIGS. 18A-18B, the stiffener frame 1810 may include a metal cladding layer 1812 formed thereon and connected to ground (not shown), which may provide an electromagnetic interference (EMI) shielding effect for dies 1820 disposed within openings 1877, or the dies 1026 embedded within package 1602. In such embodiments, the metal cladding layer 1812 may comprise substantially the same materials and be formed via substantially similar processes to metal cladding layer 316 described above. For example, metal cladding layer 1812 may be formed of nickel displacement plating or other electroless or electrolytic plating processes. In certain embodiments, the stiffener frame 1810 is formed of high resistivity silicon and acts as an insulator for device 1800. In such embodiments, the stiffener frame 1810 may be attached to the package 1602 by soldering. For example, a metal or surface layer may be formed on the package 1602 (e.g., a nickel or copper layer), and the stiffener frame 1810 may thereafter be soldered onto the package 1602.

The one or more openings 1877 may generally have any suitable morphologies and dimensions for accommodating, e.g., semiconductor dies 1820 or other desired devices therein. For example, in certain embodiments, the openings 1877 may have a substantially quadrilateral or polygonal shape. In certain embodiments, the openings 1877 may have a substantially circular or irregular shape. In certain embodiments, one or more of the openings 1877 have sidewalls 1821 that are substantially tapered (i.e., angled), as shown in FIGS. 18A-18B, or substantially vertical (e.g., normal relative to, e.g., surface 1005).

In certain embodiments, one or more openings 1877 have a lateral dimension D ranging between about 0.5 mm and about 50 mm, such as a lateral dimension D ranging between about 3 mm and about 12 mm, such as a lateral dimension D ranging between about 8 mm and about 11 mm, which may depend on the size and number of semiconductor dies 1820 or other devices to be placed therein during package or system fabrication. In certain embodiments, the openings 1877 are sized to have lateral dimensions substantially similar to that of the semiconductor dies 1820 to be placed therein. For example, each opening 1877 may be formed having lateral dimensions exceeding those of the semiconductor die(s) 1820 by less than about 150 μm, such as less than about 120 μm, such as less than 100 μm.

The semiconductor dies 1820 may be any suitable type of die, chip, or semiconductor device, including a memory die, a microprocessor, a complex system-on-a-chip (SoC), a standard die, or a passive semiconductor device. In certain embodiments, the semiconductor dies 1820 are DRAM dies or NAND flash dies. In certain embodiments, the semiconductor dies 1820 include digital dies, analog dies, or mixed dies. In certain embodiments, the semiconductor dies 1820 include passive semiconductor devices such as capacitors, inductors, resistors, RF elements, and the like, which may be electrically coupled to the power contacts 1031 of semiconductor dies 1026 embedded in package 1602 to enable more stable power delivery across the device 1800. For example, the semiconductor dies 1820 may include decoupling capacitors, trench capacitors, or planar capacitors. In certain embodiments, the semiconductor dies 1820 may be formed of a material substantially similar to that of the substrate 302, the dies 1026, and/or the stiffener frame 1810, such as a silicon material. Utilizing semiconductor dies 1820 formed of the same or similar materials of the substrate 302, the dies 1026, and/or the stiffener frame 1810 may facilitate matching of CTE therebetween, fundamentally eliminating the occurrence of warpage during assembly.

As shown in FIGS. 18A-18B, each semiconductor die 1820 may be disposed adjacent to one of the major surfaces 1005, 1007 of the package 1602, and has contacts 1822 thereof electrically coupled to one or more redistribution connections 1644 via solder bumps 1824. In certain embodiments, the contacts 1822 and/or the solder bumps 1824 are formed of a substantially similar material to that of the interconnections 1444 and the redistribution connections 1644. For example, the contacts 1822 and the solder bumps 1824 may be formed of a conductive material such as copper, tungsten, aluminum, silver, gold, or any other suitable materials or combinations thereof.

In certain embodiments, the solder bumps 1824 include C4 solder bumps. In certain embodiments, the solder bumps 1824 include C2 (Cu-pillar with a solder cap) solder bumps. Utilization of C2 solder bumps may enable smaller pitch lengths and improved thermal and/or electrical properties for the device 1800. The solder bumps 1824 may be formed by any suitable wafer bumping processes, including but not limited to electrochemical deposition (ECD) and electroplating.

Figure 18E:
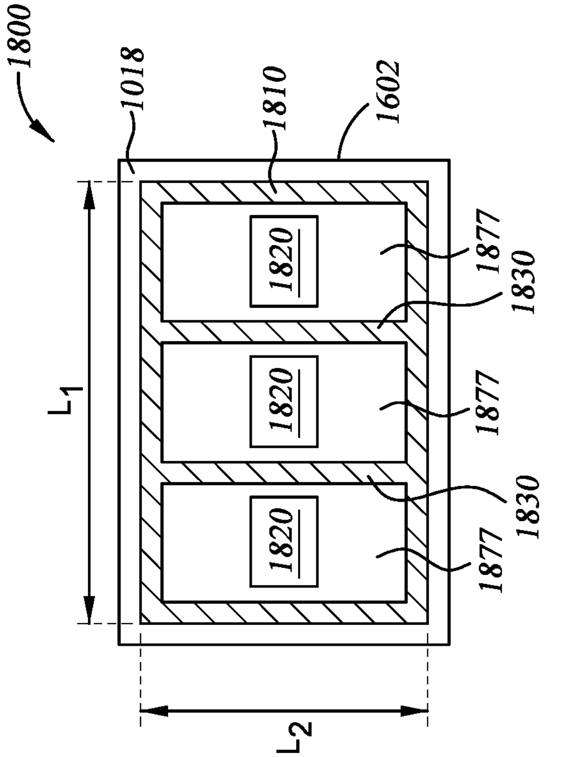
Figure 18C:
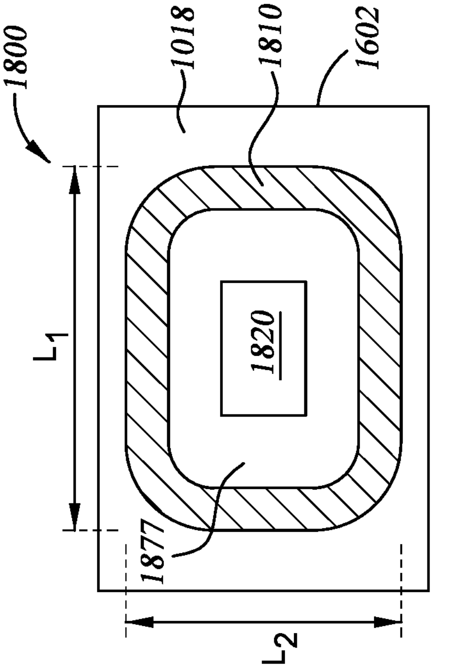
Figure 18D:
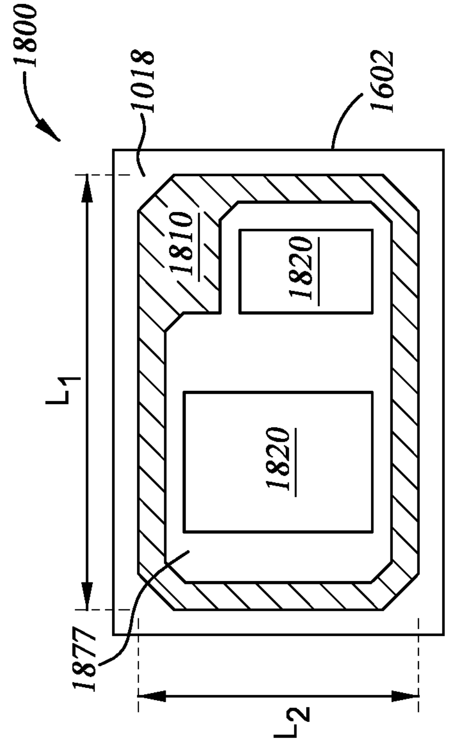

FIGS. 18C-18E illustrate top views of different configurations of the device 1800, according to certain embodiments of the present disclosure. In particular, FIGS. 18C-18E illustrate different morphologies/arrangements of the stiffener frame 1810.

In FIG. 18C, the device 1800 includes a squircular (e.g., rectangle with rounded corners) ring-shaped stiffener frame 1810 that surrounds a semiconductor die 1820 disposed within opening 1877 and substantially tracks along a lateral perimeter of the device 1800 (and thus, the package 1602 disposed below). Accordingly, outer dimensions of the stiffener frame 1810 are substantially similar to those of the package 1602. Note that although the stiffener frame 1810 in FIG. 18C is illustrated with rounded corners, chamfered or right-angle corner are further contemplated.

In FIG. 18D, the stiffener frame 1810 formed on the device 1800 has an irregular polygonal shape to accommodate multiple semiconductor dies 1820 of different sizes. A single opening 1877 is formed in the stiffener frame 1810, but within different lateral dimensions around each semiconductor die 1820.

In FIG. 18E, the stiffener frame 1810 has a rectangular ring-like shape that is partitioned by one or more transverse ribs 1830 extending across the surface of the device 1800 (and thus, the package 1602 disposed below). Accordingly, the ribs 1830 form multiple openings 1877 for accommodating multiple semiconductor dies 1820. The formation of the ribs 1830 in stiffener frame 1810 may provide additional mechanical support/rigidity to the device 1800. In certain embodiments, the ribs 1830 may be disposed in a crossed or intersecting pattern over the device 1800. Note that although the stiffener frame 1810 in FIG. 18E is illustrated as rectangular with right-angle corners, other general shapes and/or corner types are further contemplated.

As shown FIGS. 18C-18E, in certain embodiments, the stiffener frame 1810 may have lateral dimensions substantially matching, or substantially similar to, the package 1602. Accordingly, in such embodiments, the outer lateral dimensions $L_1$ and $L_2$ are within about 500 μm of the outer lateral dimensions of the package 1602, such as within about 300 μm. In certain embodiments, lateral $L_1$ and $L_2$ are substantially equal to each other.

Figure 19:
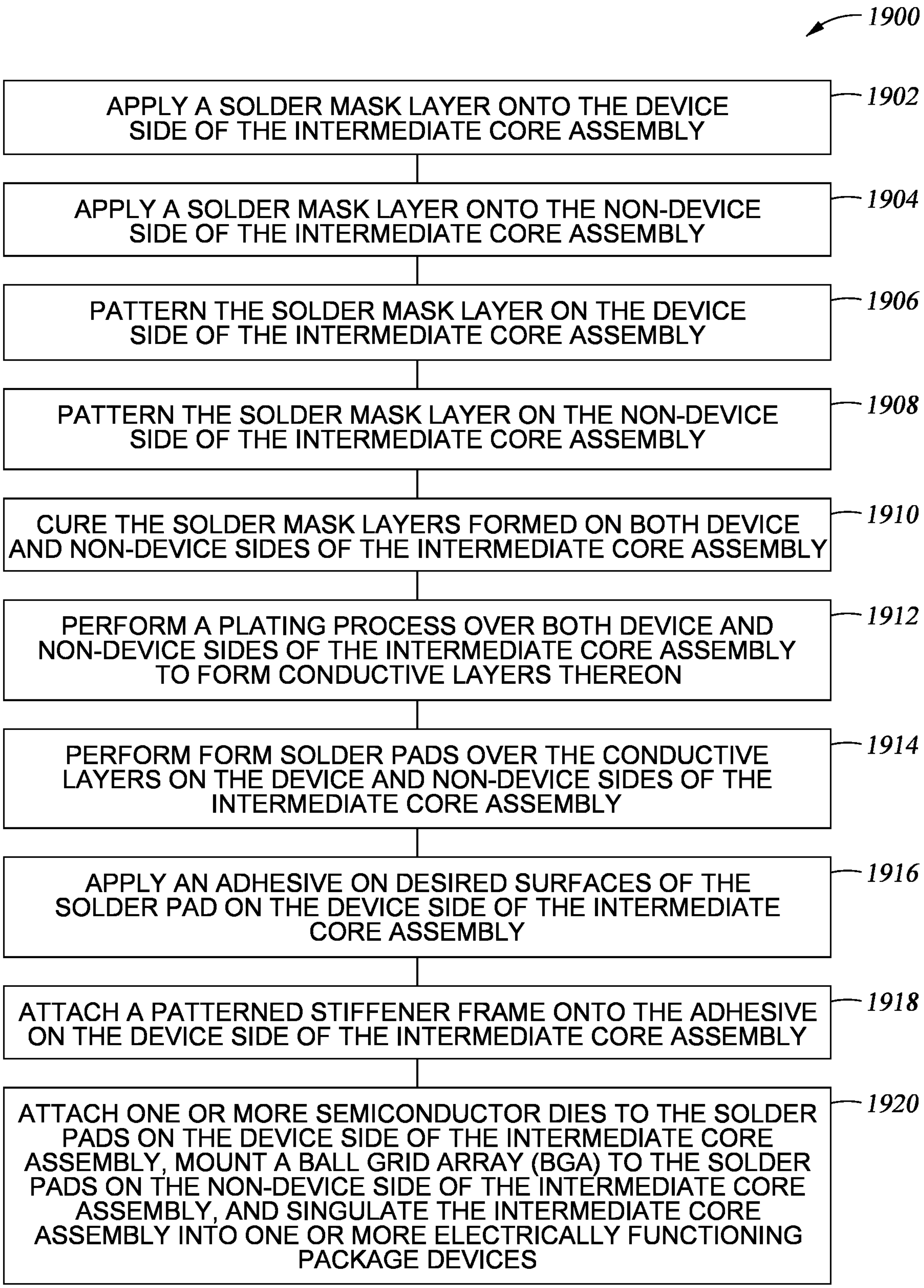
FIG. 19 illustrates a flow diagram of a process for forming a stiffener frame on an embedded die assembly, according to embodiments described herein.

FIG. 19 illustrates a flow diagram of a representative method 1900 of forming a package structure, e.g., a fcBGA-type device, having a stiffener frame 2010 utilizing, e.g., the embedded die assembly 1002 as described above, according to certain embodiments of the present disclosure. FIGS. 20A-20J schematically illustrate cross-sectional views of the embedded die assembly 1002 at different stages of the method 1900. For clarity, FIG. 19 and FIGS. 20A-20J are herein described together for clarity.

Note that although the operations of FIG. 19 and FIGS. 20A-20J are described as utilizing the embedded die assembly 1002, the methods thereof may be performed on previously singulated packages 1602 as well. Further, although FIG. 19 and FIGS. 20A-20J are described with reference to forming a stiffener frame on an fcBGA-type package structure, the operations described below may also be performed on other types of devices, such as PCB assemblies, PCB spacer assemblies, chip carrier and intermediate carrier assemblies (e.g., for graphics cards), memory stacks, and the like.

Figure 20A:
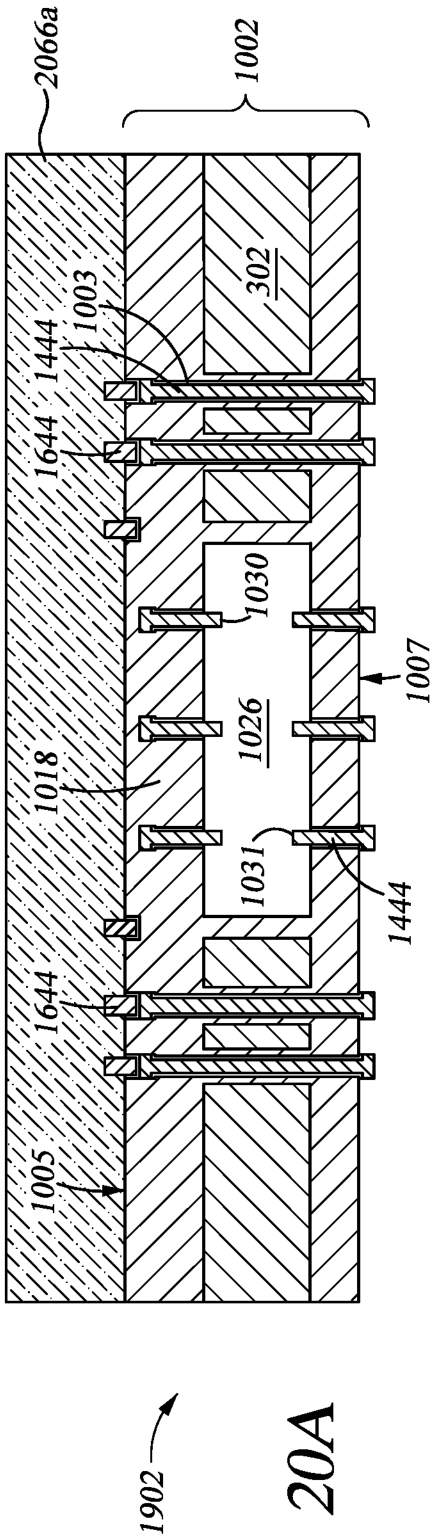
FIGS. 20A-20J schematically illustrate cross-sectional views of an embedded die assembly at different stages of forming a stiffener frame, as depicted in FIG. 19, according to embodiments described herein.

The method 1900 generally begins with operation 1902 and FIG. 20A, wherein a solder mask 2066*a* is applied to a "frontside" or "device side" surface of the intermediate core assembly 1002. For example, the solder mask 2066*a* is applied to major surface 1005 of the embedded die assembly 1002. Generally, the solder mask 2066*a* has a thickness between about 10 μm and about 100 μm, such as between about 15 μm and about 90 μm. For example, the solder mask 2066*a* has a thickness of between about 20 μm and about 80 μm.

In certain embodiments, the solder mask 2066*a* is a thermal-set epoxy liquid, which is silkscreened through a patterned woven mesh onto the insulating layer 1018 on the device side of the embedded die assembly 1002. In certain embodiments, the solder mask 2066*a* is a liquid photo-imageable solder mask (LPSM) or liquid photo-imageable ink (LPI), which is silkscreened or sprayed onto the device side of the embedded die assembly 1002. The liquid photo-imageable solder mask 2066*a* is then exposed and developed in subsequent operations to form desired patterns. In other embodiments, the solder mask 2066*a* is a dry-film photo-imageable solder mask (DFSM), which is vacuum-laminated on the device side of the embedded die assembly 1002 and then exposed and developed in subsequent operations. In such embodiments, a thermal or ultraviolet cure is performed after a pattern is defined in the solder mask 2066*a*.

Figure 20B:
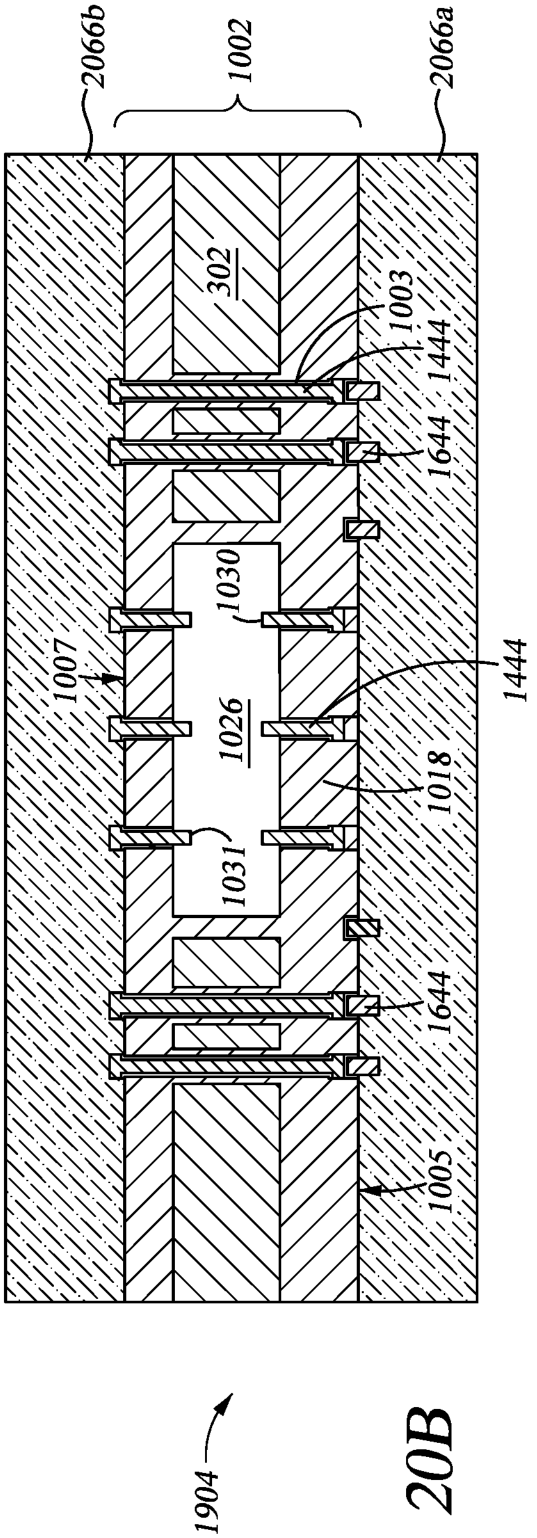

At operation 1904 and FIG. 20B, the embedded die assembly 1002 is flipped over and a second solder mask 2066*b* is applied to a "backside" or "non-device side" surface of the embedded die assembly 1002. For example, the solder mask 2066*b* is applied to major surface 1007 of the embedded die assembly 1002. Generally, the solder mask 2066*b* is substantially similar to solder mask 2066*a*, although in certain embodiments, the solder mask 2066*b* is a different type or material than solder mask 2066*a*, selected from the types/materials of solder masks described above.

Figure 20C:
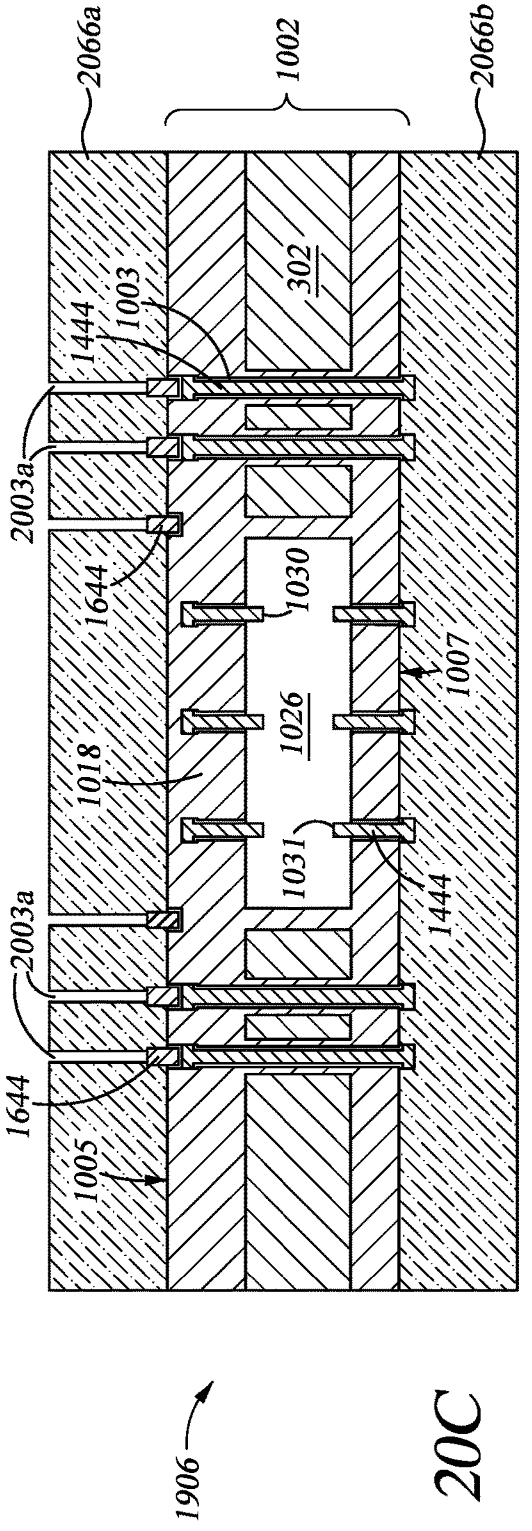

At operation 1906 and FIG. 20C, the embedded die assembly 1002 is flipped back over, and solder mask 2066*a* is patterned to form vias 2003*a* therein. The vias 2003*a* expose desired interconnections 1444 and/or redistribution connections 1644 on the device side of the embedded die assembly 1002 for designated signal routing to outer surfaces of the package being fabricated.

In certain embodiments, solder mask 2066*a* may be patterned via the methods described above. In still other embodiments, the solder mask 2066*a* is patterned by, for example, laser ablation. In such embodiments, the laser ablation patterning process may be performed utilizing a $CO_2$ laser, a UV laser, or a green laser. For example, the laser source may generate a pulsed laser beam having a frequency between about 100 kHz and about 1000 kHz. In one example, the laser source is configured to deliver a pulsed laser beam at a wavelength of between about 100 nm and about 2000 nm, at a pulse duration between about 10E-4 ns and about 10E-2 ns, and with a pulse energy of between about 10 μJ and about 300 μJ.

Figure 20D:
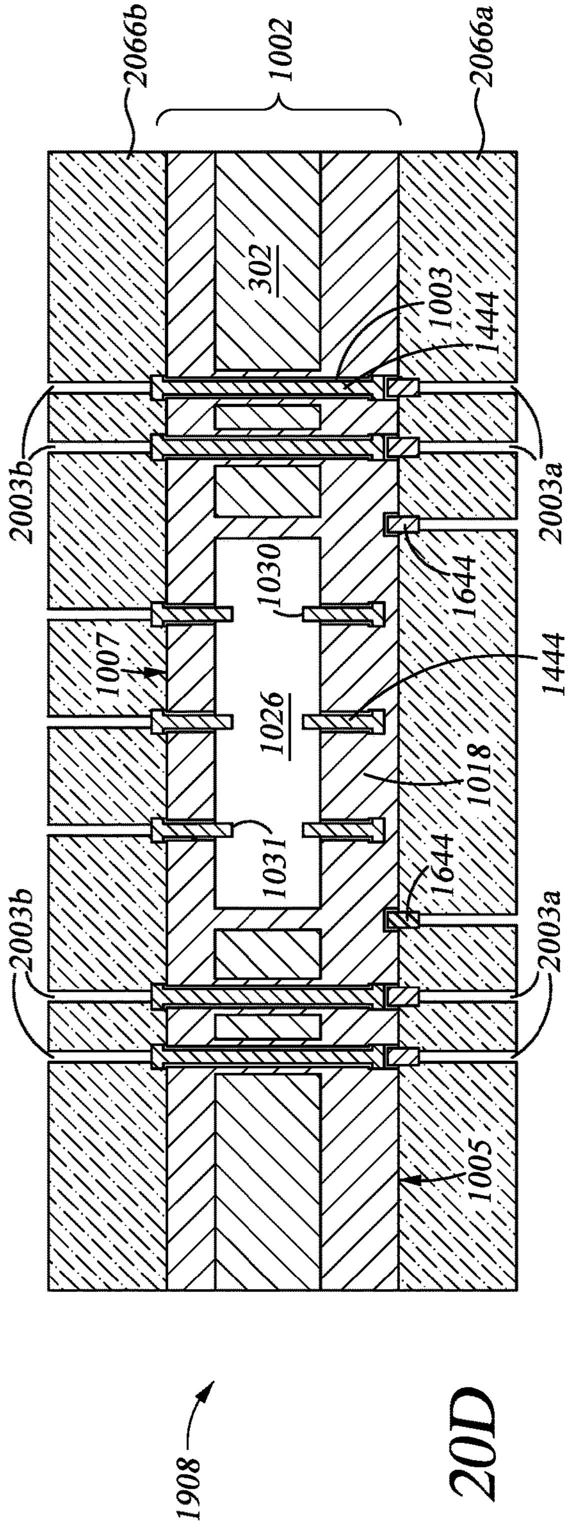

At operation 1908 and FIG. 20D, the embedded die assembly 1002 is flipped over one again, and solder mask 2066*b* patterned to form vias 2003*b* therein. Similar to vias 2003*a*, the vias 2003*b* expose desired interconnections 1444 and/or redistribution connections 1644 on the embedded die assembly 1002 for designated signal routing to outer surfaces of the package being fabricated. Generally, solder mask 2066*b* may be formed via any of the methods described above, including laser ablation.

Figure 20E:
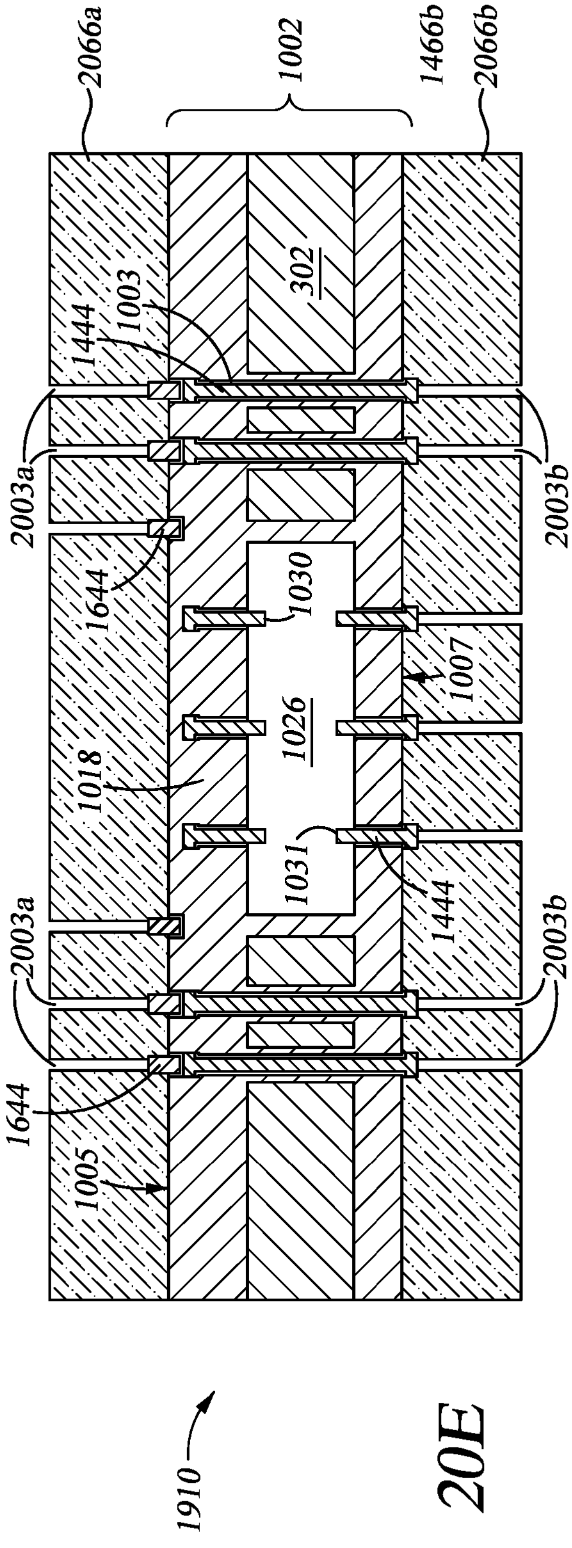

After patterning both sides of the embedded die assembly 1002, the embedded die assembly 1002 is transferred to a curing rack upon which the embedded die assembly 1002, having the solder masks 2066*a*, 2066*b* attached thereto, is fully cured at operation 1910 and FIG. 20E. In certain embodiments, the cure process is performed at a temperature of between about 80° C. and about 200° C. and for a period between about 10 minutes and about 80 minutes, such as a temperature of between about 90° C. and about 200° C. and for a period between about 20 minutes and about 70 minutes. For example, the cure process is performed at a temperature of about 180° C. for a period of about 30 minutes, or at a temperature of about 100° C. for a period of about 60 minutes. In further embodiments, the cure process at operation 1910 is performed at or near ambient (e.g., atmospheric) pressure conditions.

Figure 20F:
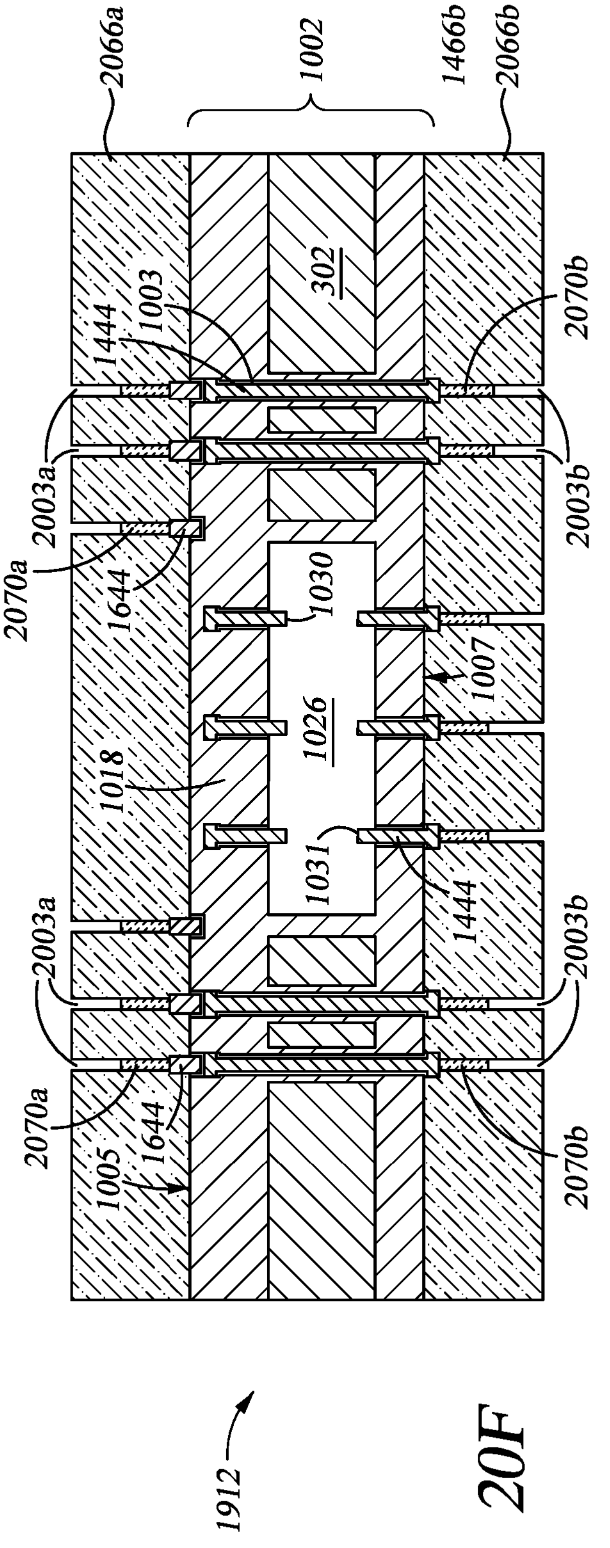

At operation 1912 and FIG. 20F, a plating process is performed over both device and non-device sides of the embedded die assembly 1002 to form conductive layers 2070*a* and 2070*b* on the device side (e.g., side including surface 1005, shown facing up) and non-device side (e.g., side including surface 1007, shown facing down) of the embedded die assembly 1002, respectively. As shown in FIG. 20F, the plated conductive layers 2070*a*, 2070*b* extend interconnections 1444 and/or redistribution connections 1644 through vias 2003*a* on the device side and vias 2003*b* on the non-device side to facilitate electrical connection thereof with other devices and/or package structures.

Each conductive layer 2070*a* and 2070*b* is formed of one or more metallic layers formed by electroless plating. For example, in certain embodiments, each conductive layer 2070*a* and 2070*b* includes an electroless nickel plating layer covered with a thin layer of gold and/or palladium formed by electroless nickel immersion gold (ENIG) or electroless nickel electroless palladium immersion gold (ENEPIG). However, other metallic materials and plating techniques are also contemplated, including soft ferromagnetic metal alloys and highly conductive pure metals. In certain embodiments, conductive layer 2070*a* and/or 2070*b* are formed of one or more layers of copper, chrome, tin, aluminum, nickel chrome, stainless steel, tungsten, silver, or the like.

In certain embodiments, each conductive layer 2070*a* and/or 2070*b* has a thickness between about 0.2 μm and about 20 μm, such as between about 1 μm and about 10 μm, on the device side or non-device side of the embedded die assembly 1002. During the plating of the conductive layer 2070*a* and 2070*b*, the exposed interconnections 1444 and/or redistribution connections 1644 are further extended outward from the embedded die assembly 1002 and through the solder masks 2066*a*, 2066*b* to facilitate further coupling with additional devices in subsequent fabrication operations.

Figure 20G:
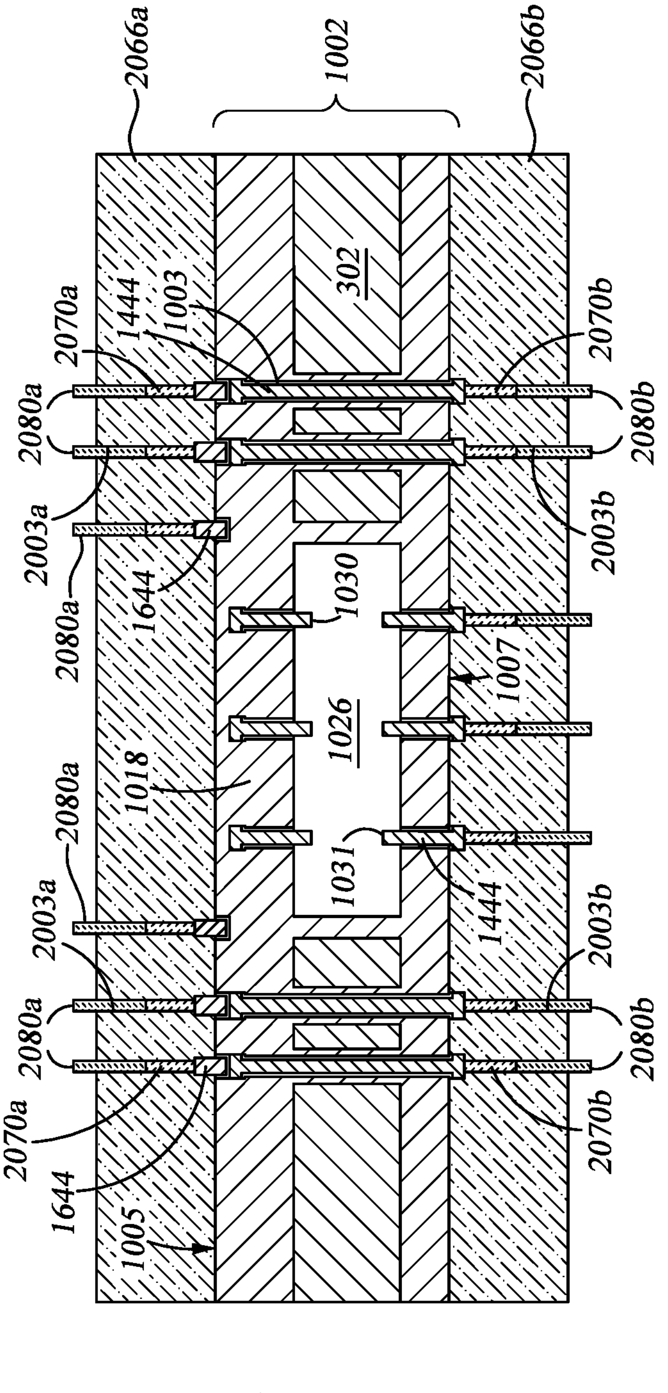

At operation 1914 and FIG. 20G, a solder-on-pad (SOP) process is performed over both device and non-device sides of the embedded die assembly 1002 to form solder pads 1280*a* and 1280*b* on the device and non-device side of the embedded die assembly 1002, respectively. For example, in certain embodiments, solder is applied to vias 2003*a*, 2003*b* and then reflowed, followed by a flattening process, such as coining, to form substantially flat surfaces for solder pads 2080*a*, 2080*b*.

Figure 20H:
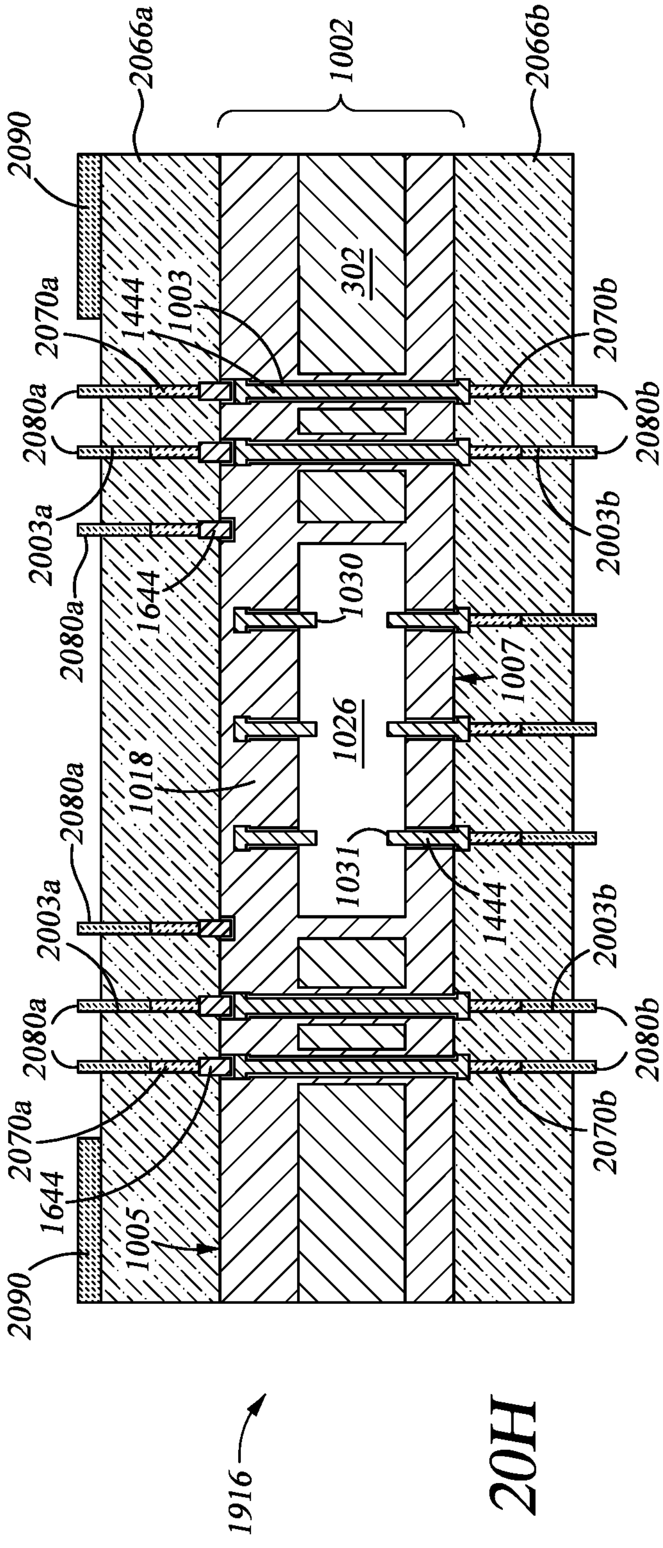

At operation 1916 and FIG. 20H, a bonding layer 2090 is applied to desired areas/surfaces of the solder mask 2066*a* (e.g., on the device side) upon which by the stiffener frame 2010 is to be attached. In certain embodiments, bonding layer 2090 includes a laminated adhesive material, die attach film, adhesive film, glue, wax, or the like. In certain embodiments, bonding layer 2090 is a layer of dielectric material similar to that of insulating layer 1018, such as an epoxy resin material having a ceramic filler. In certain embodiments, the bonding layer 2090 is a solder layer. The bonding layer 2090 may be applied to the solder mask 2066*a* by mechanical rolling, pressing, lamination, spin coating, doctor-blading, etc.

In certain embodiments, however, rather than applying the bonding layer 2090 to the solder mask 2066*a*, the bonding layer 2090 may be applied directly to the stiffener frame 2010, which may thereafter be attached to the solder mask 2066*a* of the embedded die assembly 1002. When using a die attach or adhesive film as the bonding layer 2090 in such embodiments, the film may be trimmed to the lateral dimensions of the stiffener frame 2010 as the stiffener frame 2010 is structured/patterned.

Figure 20I:
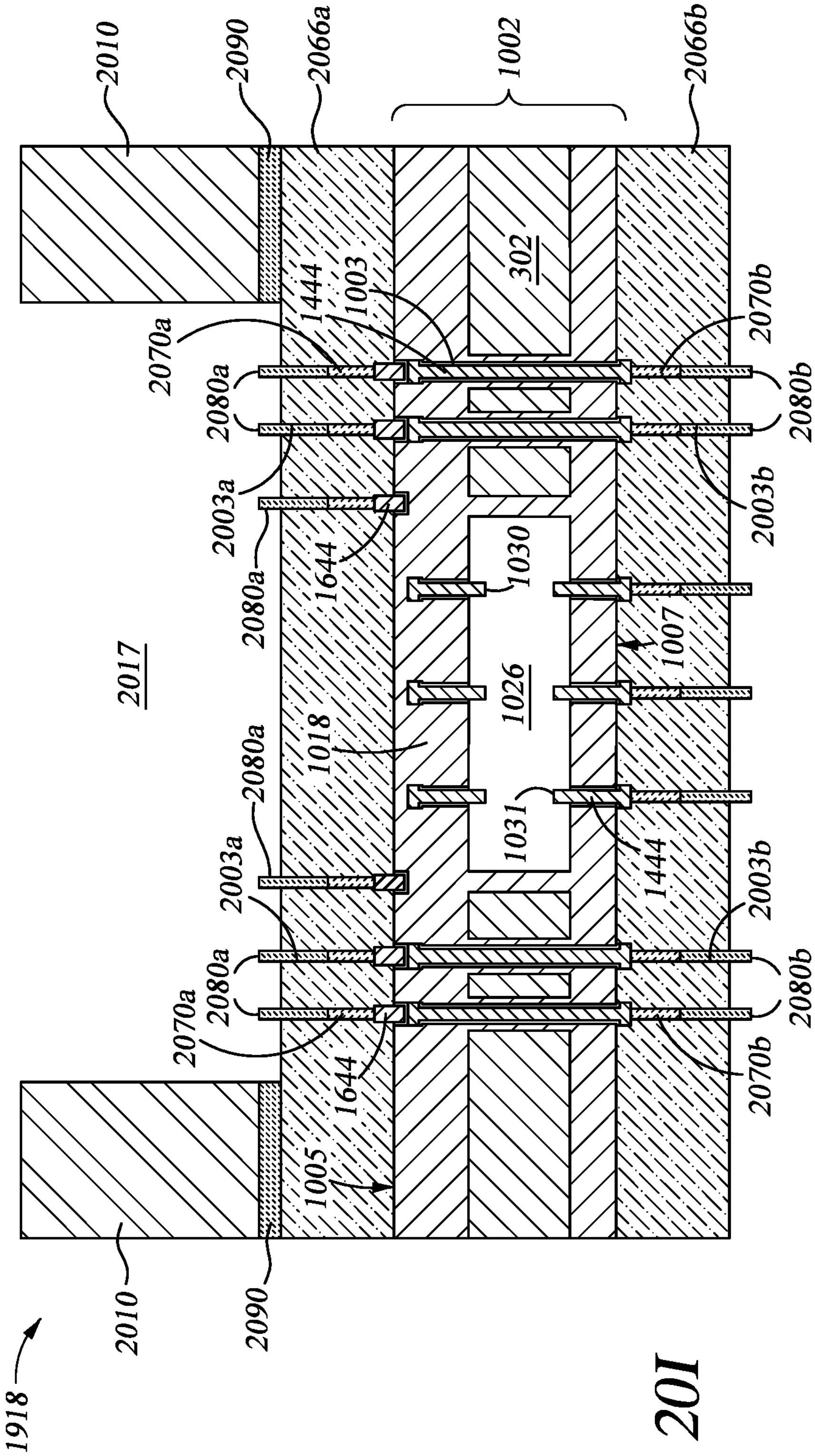

After application of the bonding layer 2090 onto the embedded die assembly 1002, the stiffener frame 2010 is attached to the bonding layer 2090 at operation 1918 and FIG. 20I. As shown, the stiffener frame 2010 includes one or more openings 2017 within which semiconductor dies may be attached in subsequent operations. To form the openings 2017, the stiffener frame 2010 may be patterned prior to operation 1916 via the methods described above with reference to FIGS. 2-7D.

Figure 20J:
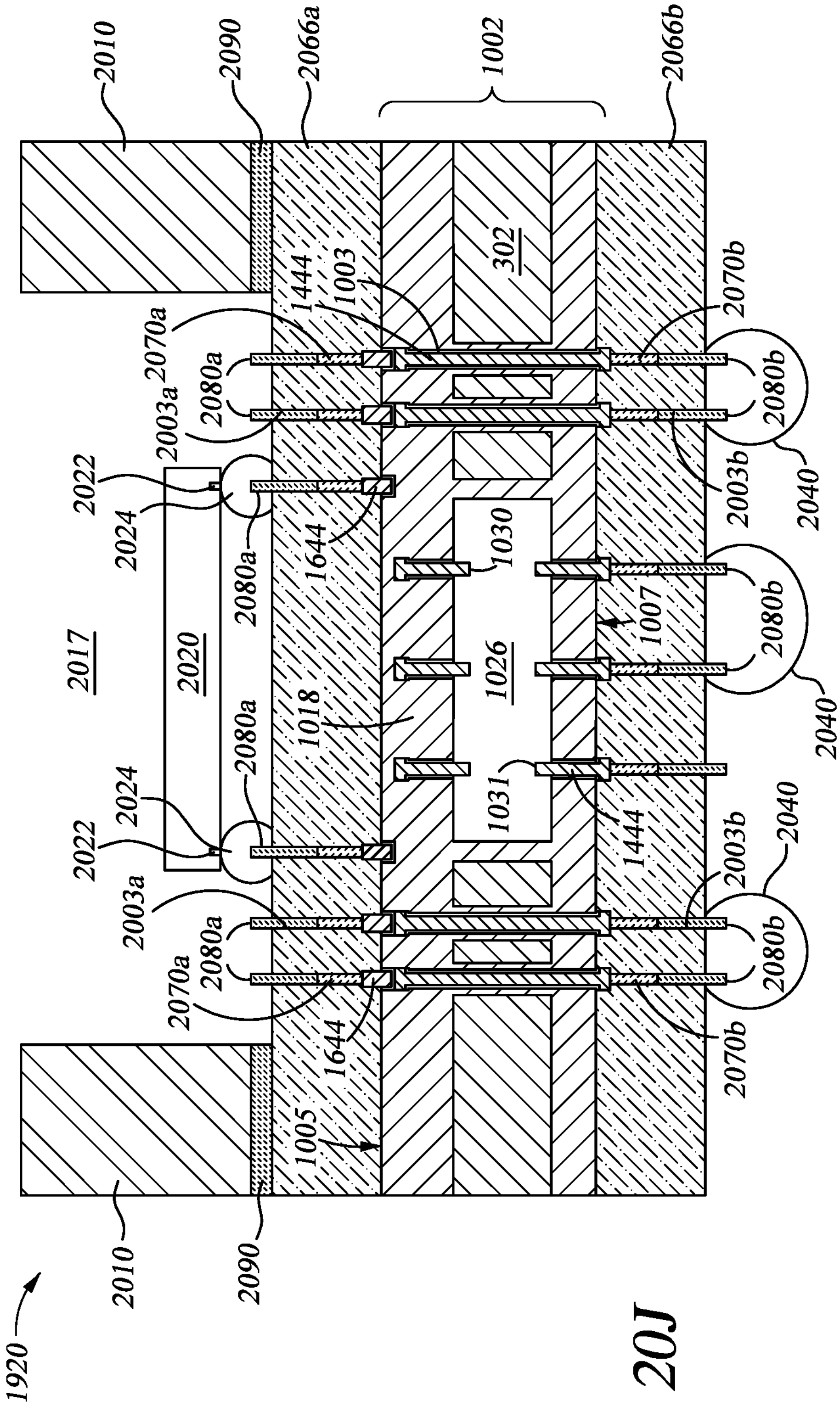

At operation 1920 and FIG. 20J, one or more semiconductor dies 2020 are electrically coupled, via solder bumps 2024, to the solder pads 2080*a* exposed through openings 2017 on the device side of embedded die assembly 1002; a ball grid array (BGA) 2040 is mounted to solder pads 2080*b* on the non-device side; and the embedded die assembly 1002 is singulated into one or more electrically functioning devices 2000 (in embodiments where the operations of FIG. 19 and FIGS. 20A-20J are performed on singulated packages 1602, no further singulation is necessary). In certain embodiments, the BGA 2040 is formed via electrochemical deposition to form C4- or C2-type bumps. In certain embodiments, the semiconductor dies 2020 are coupled to the solder pads 2080*a* via a flip chip die attach process, wherein the semiconductor die 2020 is inverted and its contacts or bond pads 2022 are connected to solder pads 2080*a*. In certain examples, connection of contacts 2022 and solder pads 2080*a* is accomplished via mass reflow or thermo-compression bonding (TCB). In such examples, a capillary underfill, non-conductive paste, or non-conductive film may be laminated between semiconductor dies 2020 and the embedded die assembly 1002. In certain embodiments, the semiconductor die 2020 and/or BGA 2040 are coupled to the embedded die assembly 1002 prior to attachment of the stiffener frame 1810, and the embedded die assembly 1002 is singulated thereafter.

After singulation, each singulated device 2000 may thereafter be integrated with other semiconductor devices and packages in various 2.5D and 3D arrangements and architectures, such as homogeneous or heterogeneous 3D stacked systems. Generally, when a stiffener frame, e.g., stiffener frame 2010, is incorporated into a device 2000 that is then integrated in a larger stacked system, the beneficial reduction in warpage of the device 2000 further extends to the overall system. That is, bolstering the structural integrity of the device 2000, in turn, reduces the likelihood of warpage or collapse of the entire integrated system.

Figure 21:
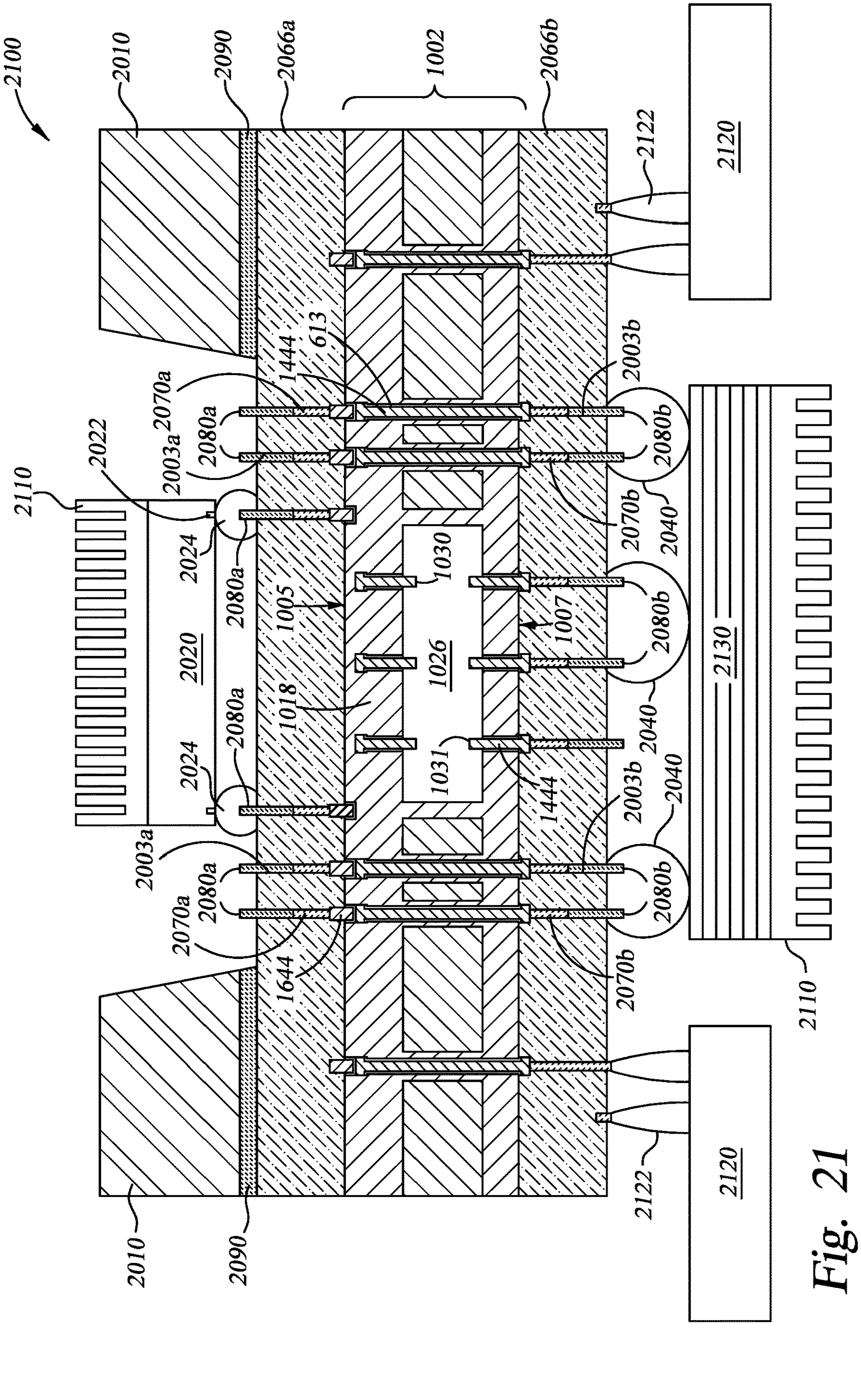
FIG. 21 schematically illustrates a cross-sectional view of an exemplary device having a stiffener frame and one or more heat exchangers, according to embodiments described herein.

FIG. 21 schematically illustrates a cross-sectional side view of an example stacked system 2100 which integrates the device 2000 having stiffener frame 1810 formed thereon, thereby improving the structural integrity of the system 2100, according to embodiments described herein. As shown, in addition to device 2000, example system 2100 further includes one or more PCBs 2120, which may be vertically stacked or disposed side-by-side, a high bandwidth memory (HBM) module 2130 having large parallel interconnect densities between memory dies and central processing unit (CPU) cores or logic dies, and one or more heat exchangers 2110. In the example of FIG. 21, semiconductor die 2020 of the device 2000 may be representative of a graphics processing unit (GPU), which is electrically coupled to HBM 2130 via interconnections 1444 disposed through the package 1602, as well as solder bumps 2024 and BGA 2040. Device 2000 may be electrically connected to PCBs 2120 via, e.g., redistribution connections 1644 formed on the non-device side thereof and pin-type connectors 2122 formed on the PCBs 2120.

The integration of the heat exchangers 2110, such as heat sinks, improves heat dissipation and thermal characteristics of the device 2000, and thus, system 2100, by transferring heat that is conducted by e.g., the semiconductor die 2020, embedded die 1026, HBM 2130, and/or silicon substrate 302. The improved heat dissipation, in turn, further reduces the likelihood of warpage. Suitable types of heat exchangers 2110 include pin heat sinks, straight heat sinks, flared heat sinks, and the like, which may be formed of any suitable materials such as aluminum or copper. In certain embodiments, the heat exchangers 2110 are formed of extruded aluminum. In certain embodiments, the heat exchangers 2110 are attached directly to one or more semiconductor dies integrated within system 2100, such as semiconductor die 2020 and one or more dies of HBM module 2130, as shown in FIG. 21. In other embodiments, the heat exchangers 2110 are attached directly, or indirectly via insulating layer 1018, to the substrate 302. Such arrangements are particular beneficial over conventional PCB's that are formed of glass-reinforced epoxy laminates having low thermal conductivity, to which the addition of a heat exchanger would be of little value.

Figure 22A:
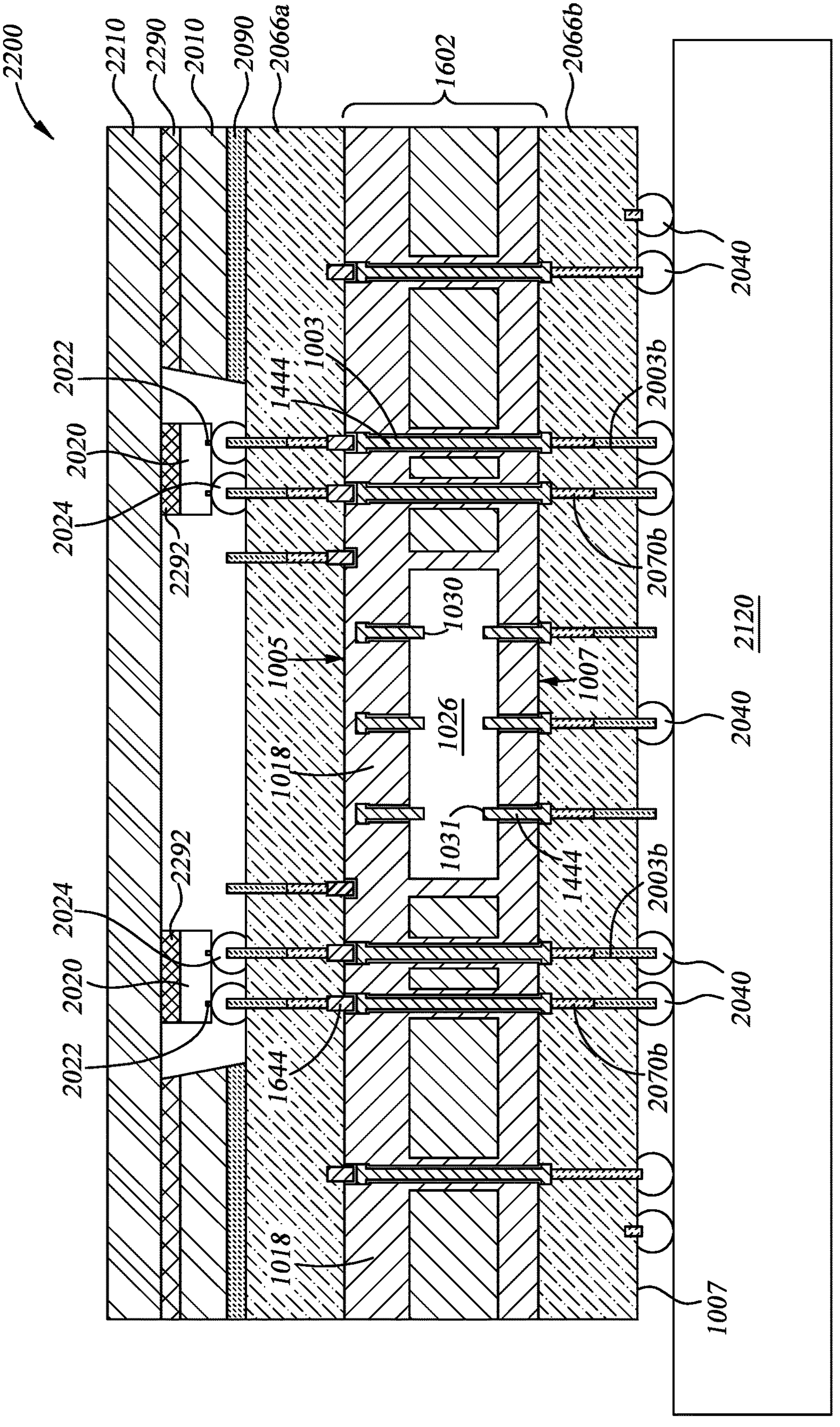
FIGS. 22A-22B schematically illustrate cross-sectional views of exemplary devices having a stiffener frame, according to embodiments described herein.
Figure 22B:
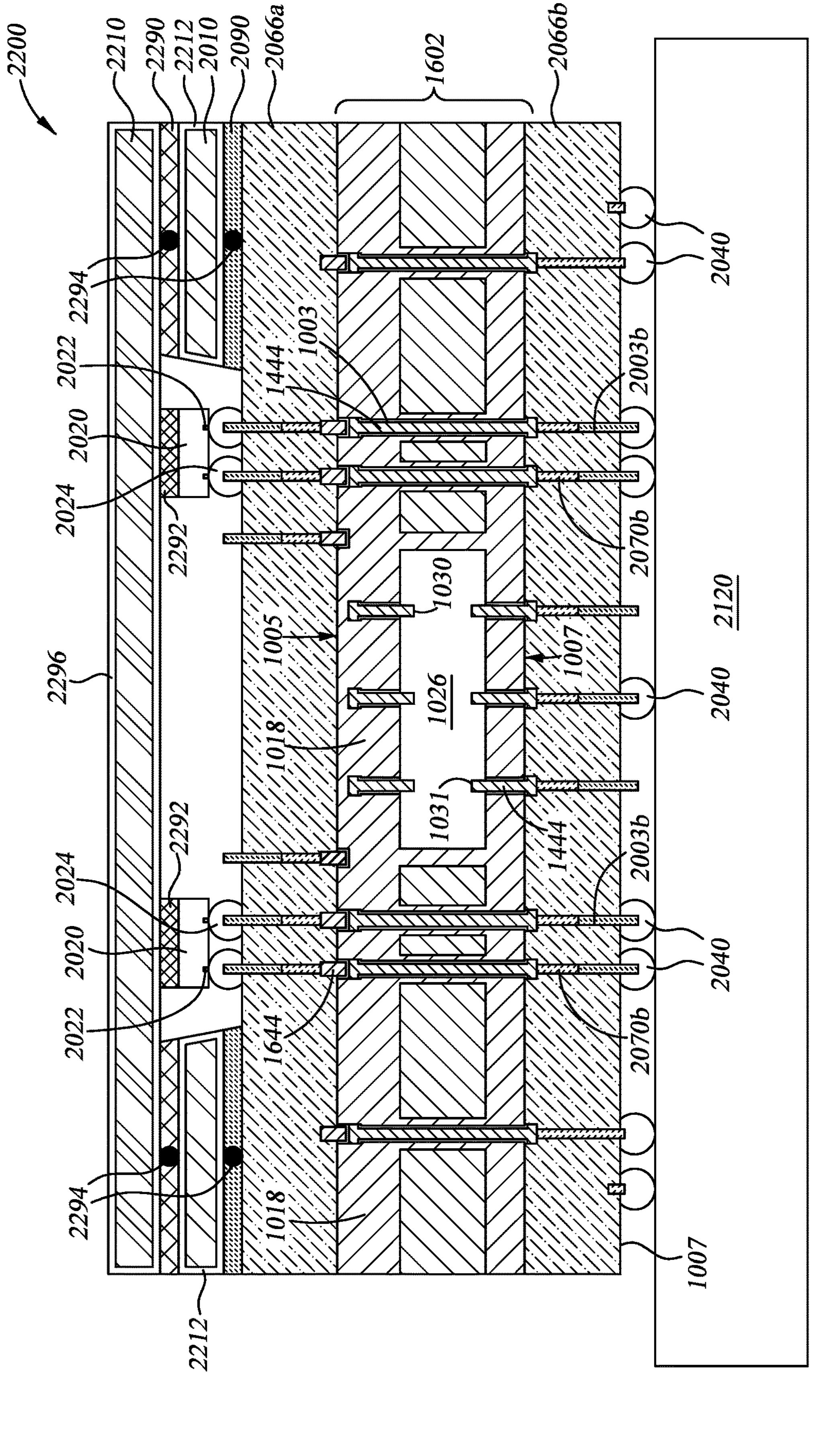

FIGS. 22A-22B schematically illustrates cross-sectional side views of additional device configurations 2200 and 2201 of the device 2000, respectively, according to embodiments described herein. As shown in FIG. 22A, a lid 2210 is attached to the stiffener frame 2010 and covers the semiconductor dies 2020 stacked on and electrically coupled to the device 2000. Some conventional integrated circuits, such as microprocessors or GPUs, generate substantial quantities of heat during operation that must be transferred away to avoid device damage or even shutdown. For such devices, the lid 2210 serves as a protective cover as well as a heat transfer pathway. Furthermore, the lid 2210 provides additional structural reinforcement for the device 2000, which already includes the stiffener frame 2010 formed thereon. Thus, the device configuration 2200 facilitates improved heat dissipation and thermal characteristics, as well as improved structural integrality, as compared to conventional package structures.

Generally, the lid 2210 has a polygonal or circular ring-like shape and is formed from a patterned substrate comprising any suitable substrate material. In certain embodiments, the lid 2210 may be formed from a substrate comprising a material substantially similar to that of the stiffener frame 2010 and substrate 302, thus matching the coefficient of thermal expansion (CTE) thereof and reducing or eliminating the risk of warpage of device configuration 2200 during assembly. For example, the lid 2210 may be formed from a III-V compound semiconductor material, silicon (e.g., having a resistivity between about 1 and about 10 Ohm-com or conductivity of about 100 W/mK), crystalline silicon (e.g., Si<100> or Si<111>), silicon oxide, silicon germanium, doped or undoped silicon, undoped high resistivity silicon (e.g., float zone silicon having lower dissolved oxygen content and a resistivity between about 5000 and about 10000 ohm-cm), doped or undoped polysilicon, silicon nitride, silicon carbide (e.g., having a conductivity of about 500 W/mK), quartz, glass (e.g., borosilicate glass), sapphire, alumina, and/or ceramic materials. In certain embodiments, the lid 2210 includes monocrystalline p-type or n-type silicon. In certain embodiments, the lid 2210 includes polycrystalline p-type or n-type silicon.

The lid 2210 has a thickness T between about 50 μm and about 1500 μm, such as a thickness T between about 100 μm and about 1200 μm. For example, the lid 2210 has a thickness T between about 200 μm and about 1000 μm, such as a thickness T between about 300 μm and about 775 μm, such as a thickness T of about 750 μm or 775 μm. In another example, the lid 2210 has a thickness T between about 100 μm and about 700 μm, such as a thickness T between about 200 μm and about 500 μm. In another example, the lid 2210 has a thickness T between about 800 μm and about 1400 μm, such as a thickness T between about 1000 μm and about 1200 μm. In yet another example, the lid 2210 has a thickness T greater than about 1200 μm.

The lid 2210 is attached to the stiffener frame 2010 via any suitable methods. For example, as shown in FIG. 22A, the lid 2210 may be attached to the stiffener frame 2010 via a bonding layer 2290, which may include a laminated adhesive material, die attach film, adhesive film, glue, wax, or the like. In certain embodiments, bonding layer 2290 is a layer of uncured dielectric material similar to that of insulating layer 1018, such as an epoxy resin material having a ceramic filler.

In addition to being attached to the stiffener frame 2010, the lid 2210 is also indirectly attached to the semiconductor dies 2020 via a thermal interface material (TIM) layer 2292 in order to provide a heat transfer pathway for the semiconductor dies 2020. Generally, the TIM layer 2292 eliminates air gaps or spaces between the semiconductor dies 2020 and the lid 2020 to eliminate air gaps or spaces, which act as thermal insulation, from the interface therebetween in order to maximize heat transfer and dissipation. In certain embodiments, the TIM layer 2292 includes a thermal paste, a thermal adhesive (e.g., a glue), a thermal tape, an underfill material, or a potting compound. In certain embodiments, the TIM layer 2292 is a thin layer of flowable dielectric material substantially similar to that of the insulating layer 1018, such as a flowable epoxy resin with an aluminum oxide or nitride filler.

FIG. 22B illustrates another device configuration 2201 integrating the lid 2210 with device 2000. In this example, the lid 2210 and the stiffener frame 2010 are both metallized. As shown, the lid 2210 includes a metal layer 2296, and the stiffener frame 2010 includes a metal layer 2212. The metal layers 2212, 2296 may be formed of any suitable metallic materials and by any suitable methods, including those described above with reference to metal cladding layer 316 described above. For example, in certain embodiments, the metal layer 2212 and/or metal layer 2296 include a conductive metal layer that includes nickel (e.g., formed by immersion plating), aluminum, gold, cobalt, silver, palladium, tin, or the like. In certain embodiments, the metal layer 2212 and/or metal layer 2296 include a metal layer that includes an alloy or pure metal that includes nickel, aluminum, gold, cobalt, silver, palladium, tin, or the like. In certain embodiments, the metal layer 2212 and metal layer 2296 are formed of the same material; in other embodiments, the metal layer 2212 and metal layer 2296 are formed of different materials.

As shown in FIG. 22B, the metal layer 2212 and metal layer 2296 may be electrically coupled to each other utilizing one or more solder balls 2294 disposed between the lid 2210 and the stiffener frame 2010. In such embodiments, the bonding layer 2290 may be formed around the solder balls 2294, thus substantially embedding the solder balls 2294 within the bonding layer 2290. In certain embodiments, the metal layer 2212 and/or metal layer 2296 are further electrically coupled to ground, e.g., via the solder balls 2294, thus providing a grounded lid 2210 and stiffener frame 2010. In certain embodiments, the metal layer 2212 and/or metal layer 2296 are further coupled to a metallized substrate 302, e.g., via the solder balls 2294 and interconnections 1444 and/or redistribution connections 1644.

Figure 23A:
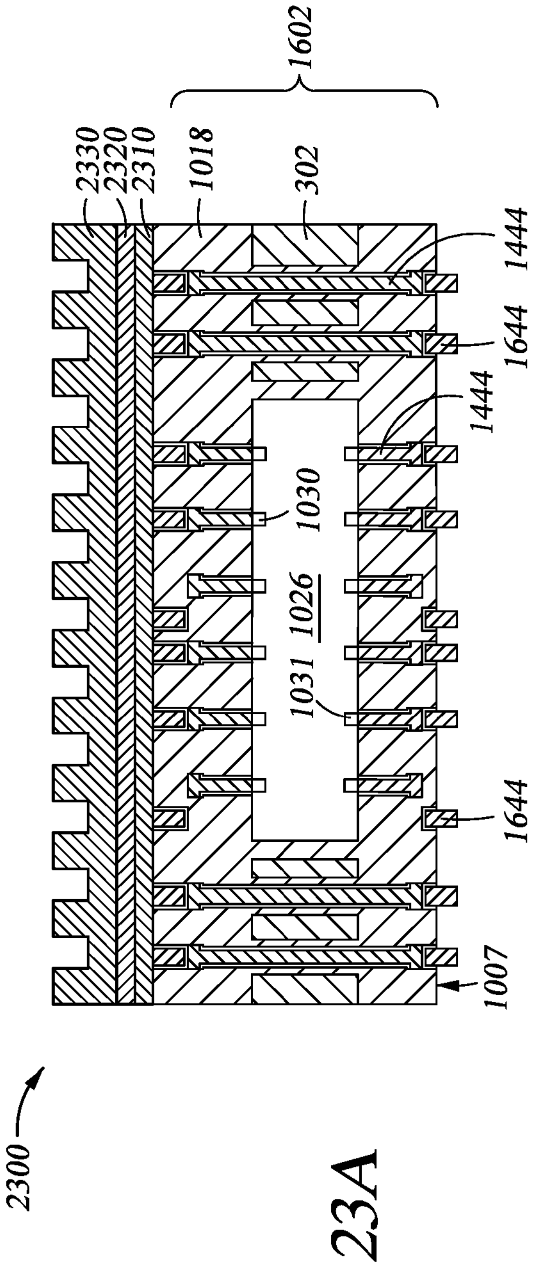
FIGS. 23A-23B schematically illustrate cross-sectional views of exemplary devices having a heat exchanger, according to embodiments described herein.
Figure 23B:
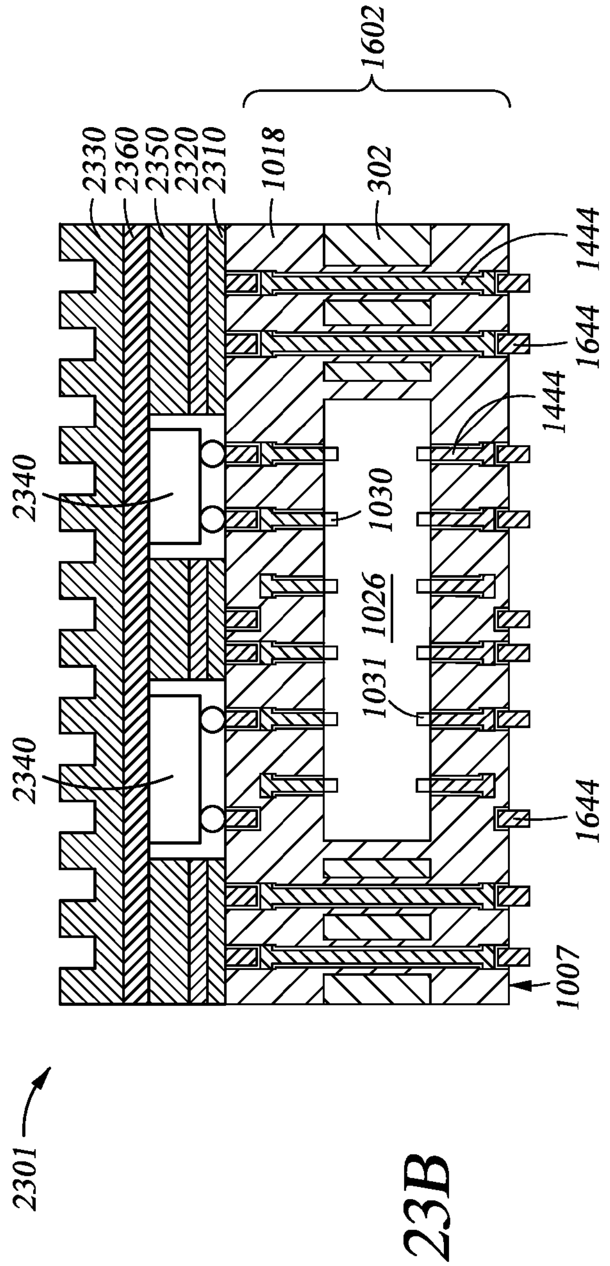

FIGS. 23A-23B schematically illustrate cross-sectional side views of exemplary devices 2300 and 2301, respectively, which incorporate packages 1602 having double-sided dies 1026 embedded therein, according to embodiments described herein. In the examples of FIGS. 23A-23B, the packages 1602 are further integrated with heat exchangers 2330. The integration of the heat exchangers 2330, such as heat sinks, improves heat dissipation and thermal characteristics of the package device 1602, and thus, devices 2300 and 2301, by transferring heat that is produced by or conducted by e.g., the semiconductor dies 1026, and/or the substrate 302. The improved heat dissipation, in turn, further reduces the likelihood of warpage, and improves performance of the devices 2300 and 2301. Such arrangements are particular beneficial over conventional PCB's that are formed of glass-reinforced epoxy laminates having low thermal conductivity, to which the addition of a heat exchanger would be of little value. Suitable types of heat exchangers 2330 for use with embodiments described herein include pin heat sinks, straight heat sinks, flared heat sinks, and the like, which may be formed of any suitable materials such as aluminum or copper. In certain embodiments, the heat exchangers 2330 are formed of extruded aluminum.

Generally, the heat exchangers 2330 may be added to one or both sides of the devices 2300 or 2301. In certain embodiments, the heat exchangers 2330 are attached directly, or indirectly via insulating layer 1018, over substrate 302. To achieve such configurations, a desired area of the insulating layer 1018 of a package 1602 (or embedded die assembly 1002) may be laser ablated to form a pocket, and a heat exchanger 2330 may thereafter be mounted upon the substrate 302. For example, an area of the insulating layer 1018 having lateral dimensions corresponding to the lateral dimensions of the heat exchanger 2330 may be removed by a $CO_2$, UV, or IR laser that is configured to only ablate the dielectric material of the insulating layer 10018 and leave the substrate 302 intact. The heat exchanger 2330 may then be placed within the opening and mounted upon the substrate 302, which may include an oxide layer or metal cladding layer, via any suitable mounting methods. In certain embodiments, an adhesive or interfacial layer may be played between the heat exchanger 2330 and the substrate 302.

In other embodiments, the heat exchangers 2330 are attached directly to one or more semiconductor dies stacked with device 2300 or 2301, such as semiconductor dies 1820 described above. In further embodiments, as shown in FIG. 23A, the heat exchangers 2330 may be placed over embedded semiconductor dies 1026 and the substrate 302, and attached to the insulating layer 1018 or another layer disposed over the insulating layer 1018. For example, device 2300 includes a metallized plane 2310, as well as an interfacial layer 2320, disposed between the package 1600 and the heat exchanger 2330. The metallized plane 2310 may include a conductive metal layer formed of any suitable metallic materials, including copper, nickel, aluminum, gold, cobalt, silver, palladium, tin, or the like, and may be connected to ground. In certain embodiments, the metallized plane 2310 includes a metal layer formed of an alloy or pure metal that includes copper, nickel, aluminum, gold, cobalt, silver, palladium, tin, or the like. In certain embodiments, the metallized plane 2310 comprises a metal mesh or grid formed of the materials above. In certain embodiments, the interfacial layer 2320 comprises a thermal interface material (TIM) material, such as a thermal adhesive or potting compound. In certain embodiments, the interfacial layer 2320 is a thin layer of flowable dielectric material substantially similar to that of the insulating layer 1018.

In another exemplary device 2301 depicted in FIG. 23B, one or more capacitors 2340, or other passive devices, are disposed between the heat exchanger 2330 and the package 1602 to enable more stable power delivery to the semiconductor dies 1026. In such embodiments, the capacitors may be embedded or positioned within one or more layers disposed over the semiconductor dies 1026, including the insulating layer 1018, and electrically connected to the semiconductor dies 1026 by interconnections 1444 and/or redistribution connections 1644. In FIG. 23B, two capacitors 2340 are shown disposed over the semiconductor die 1026 and surrounded by the metallized plane 2310, the interfacial layer 2320, as well as a heat spreader layer 2350. In certain embodiments, the heat spreader layer 2350 is formed of a suitable metallic material for conducting and spreading heat, including copper, nickel, aluminum, gold, cobalt, silver, palladium, tin, combinations or alloys thereof, or the like. In certain embodiments, an additional interfacial layer 2360, such as another TIM layer, may be formed between the heat spreader layer 2350 and the heat exchanger 2330, and may further be in contact with or formed over the capacitors 2340.

The embodiments described herein advantageously provide improved methods of substrate structuring and die assembling for fabricating advanced integrated circuit packages. By utilizing the methods described above, high aspect ratio features may be formed on glass and/or silicon substrates, thus enabling the economical formation of thinner and narrower semiconductor device packages. The thin and small-form-factor packages fabricated by utilizing the methods described above provide the benefits of not only high I/O density and improved bandwidth and power, but also greater reliability with low stress attributed to the reduced weight/inertia and package architecture allowing flexible solder ball distribution. Further merits of the methods described above include economical manufacturing with dual-sided metallization capability and high production yield by eliminating flip-chip attachment and over-molding steps, which are prone to feature damage in high-volume manufacturing of conventional and advanced packages.

While the foregoing is directed to embodiments of the present disclosure, other and further embodiments of the disclosure may be devised without departing from the basic scope thereof, and the scope thereof is determined by the claims that follow.

What is claimed is:

1. A package assembly, comprising:

a core frame having a first surface opposite a second surface, the core frame further comprising:

a frame material that comprises silicon;

at least one cavity with a semiconductor die disposed therein, the semiconductor die having electrical contacts disposed on two opposing sides thereof; and a via comprising a via surface that defines an opening extending through the core frame from the first surface to the second surface;

an insulating layer disposed over the first surface and the second surface, the insulating layer contacting at least a portion of each side of the semiconductor die; and an electrical interconnection disposed within the via, wherein the insulating layer is disposed between the via surface and the electrical interconnection;

a stiffener frame formed over the insulating layer; and a cladding layer disposed on the stiffener frame.

2. The package assembly of claim 1, wherein the at least one cavity has lateral dimensions between about 3 mm and about 50 mm.

3. The package assembly of claim 2, wherein the lateral dimensions of the at least one cavity are greater than lateral dimensions of the semiconductor die by less than about 150 μm.

4. The package assembly of claim 1, wherein the semiconductor dies comprises an integrated circuit formed on a first side and a power delivery network formed on a second side opposing the first side.

5. The package assembly of claim 1, further comprising an oxide layer formed on the core frame.

6. The package assembly of claim 1, further comprising a metal layer formed on the core frame.

7. The package assembly of claim 6, wherein the metal layer comprises nickel.

8. The package assembly of claim 1, wherein the insulating layer comprises an epoxy resin.

9. The package assembly of claim 8, wherein the epoxy resin comprises ceramic particles.

10. The package assembly of claim 9, wherein the ceramic particles comprise silica particles.

11. The package assembly of claim 1, further comprising an adhesion layer or a seed layer disposed between the electrical interconnection and the insulating layer.

12. The package assembly of claim 11, wherein the adhesion layer comprises molybdenum and the seed layer comprises copper.

13. The package assembly of claim 1, further comprising:

a capacitor disposed over the insulating layer and electrically coupled to one or more contacts of the semiconductor die.

14. The package assembly of claim 1, further comprising a capacitor disposed over the insulating layer and within the opening of the stiffener frame, the capacitor electrically coupled to one or more contacts of the semiconductor die.

15. A package assembly, comprising:

an embedded die assembly, comprising:

a core frame that comprises silicon;

an oxide layer disposed over surfaces of the core frame;

one or more semiconductor dies disposed within the core frame, the one or more semiconductor dies having an integrated circuit formed on a first side and a power delivery network formed on a second side opposing the first side; and an insulating layer formed on the oxide layer, the insulating layer comprising an epoxy resin material having ceramic particles disposed therein;

one or more metal interconnections disposed within a portion of the embedded die assembly;

a stiffener frame formed over the insulating layer, the stiffener frame comprising silicon material and having an opening formed therein; and a metal cladding layer disposed on the stiffener frame.

16. The package assembly of claim 15, wherein the core frame further comprises:

one or more cavities formed therein, the one or more cavities having the one or more semiconductor dies disposed therein; and one or more vias formed therein, wherein the one or more metal interconnections are disposed through the one or more vias.

17. The package assembly of claim 15, further comprising:

a molybdenum adhesion layer and a copper seed layer disposed between each of the one or more metal interconnections and the insulating layer.

18. A package assembly, comprising:

an embedded die assembly, comprising:

a core frame that comprises silicon;

one or more semiconductor dies disposed within the core frame, the one or more semiconductor dies having electrical contacts disposed on two opposing sides thereof;

a first insulating layer formed on the core frame, the first insulating layer comprising an epoxy resin material comprising ceramic particles; and one or more electrical interconnections disposed through the core frame or the first insulating layer; and a redistribution layer formed on the embedded die assembly, the redistribution layer comprising:

a second insulating layer formed on the first insulating layer;

one or more electrical redistribution connections disposed through the second insulating layer;

a stiffener frame formed over the insulating layer, the stiffener frame comprising silicon material and having an opening formed therein; and a metal cladding layer disposed on the stiffener frame.

19. The package assembly of claim 18, wherein the second insulating layer is formed of the same material as the first insulating layer.

* * * * *